United States Patent
Iwashita

(10) Patent No.: US 8,661,384 B2
(45) Date of Patent: Feb. 25, 2014

(54) VERIFICATION SUPPORT APPARATUS, VERIFYING APPARATUS, COMPUTER PRODUCT, VERIFICATION SUPPORT METHOD, AND VERIFYING METHOD

(75) Inventor: Hiroaki Iwashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/298,354

(22) Filed: Nov. 17, 2011

(65) Prior Publication Data

US 2012/0210282 A1    Aug. 16, 2012

(30) Foreign Application Priority Data

Feb. 10, 2011 (JP) ................................ 2011-027946

(51) Int. Cl.
*G06F 17/50* (2006.01)

(52) U.S. Cl.
USPC ........................... 716/108; 716/112; 716/114

(58) Field of Classification Search
USPC .......................................... 716/108, 112, 114
See application file for complete search history.

(56) References Cited

U.S. PATENT DOCUMENTS

| 7,888,971 B2 | 2/2011 | Iwashita | |
| 2008/0112520 A1* | 5/2008 | Gundurao et al. | 375/354 |
| 2008/0134115 A1* | 6/2008 | Ly et al. | 716/5 |
| 2010/0194436 A1* | 8/2010 | Iwashita | 326/94 |

FOREIGN PATENT DOCUMENTS

| JP | 2009-187344 A | 8/2009 |
| JP | 2010-176486 A | 8/2010 |

OTHER PUBLICATIONS

Ulrich, E. G. et al., "The Concurrent Simulation of Nearly Identical Digital Networks", Proc. 10th Design Automation Workshop, 1973, pp. 145-150.

* cited by examiner

*Primary Examiner* — Thuan Do
*Assistant Examiner* — Mohammed Alam
(74) *Attorney, Agent, or Firm* — Fujitsu Patent Center

(57) ABSTRACT

A verification support apparatus includes a detecting unit that detects an inconsistency between a simulation result at an observation point in a circuit-under-test and an expected value; a setting unit that sets a portion of output values to logic values different from those of the simulation result when the detecting unit detects the inconsistency, wherein the output values are random values output from elements that receive a signal in a second clock domain that receives the signal from a first clock domain asynchronously; a comparing unit that compares the expected value and a simulation result at the observation point after the setting by the setting unit; and an identifying unit that identifies whether the portion of the output values are a cause of the inconsistency, based on a result of comparison by the comparing unit.

20 Claims, 51 Drawing Sheets

FIG.8

```
module JitterDetector(
            input T,
            output reg E);
    parameter PERIOD = 1;
    always 51(T) begin
            E <= 1;
            #PERIOD;
            E <= 0;
    end
endmodule
```

FIG.15

| J1 | J2 | J3 | J4 | EXECUTION PATTERN |
|----|----|----|----|-------------------|
| 0 | 0 | 0 | 0 | — |
| 0 | 0 | 0 | 1 | — |
| 0 | 0 | 1 | 0 | P2: ERROR |
| 0 | 0 | 1 | 1 | — |
| 0 | 1 | 0 | 0 | P3: NORMAL OPERATION |
| 0 | 1 | 0 | 1 | — |
| 0 | 1 | 1 | 0 | P0: ERROR |
| 0 | 1 | 1 | 1 | P4: NORMAL OPERATION |
| 1 | 0 | 0 | 0 | — |
| 1 | 0 | 0 | 1 | — |
| 1 | 0 | 1 | 0 | — |
| 1 | 0 | 1 | 1 | — |
| 1 | 1 | 0 | 0 | — |
| 1 | 1 | 0 | 1 | — |
| 1 | 1 | 1 | 0 | P1: ERROR |
| 1 | 1 | 1 | 1 | — |

| J1 | J2 | J3 | J4 | EXECUTION PATTERN |
|---|---|---|---|---|
| 0 | 0 | 0 | 0 | — |
| 0 | 0 | 0 | 1 | — |
| 0 | 0 | 1 | 0 | — |
| 0 | 0 | 1 | 1 | Q1 |
| 0 | 1 | 0 | 0 | — |
| 0 | 1 | 0 | 1 | — |
| 0 | 1 | 1 | 0 | — |
| 0 | 1 | 1 | 1 | — |
| 1 | 0 | 0 | 0 | — |
| 1 | 0 | 0 | 1 | Q3 |
| 1 | 0 | 1 | 0 | Q4 |
| 1 | 0 | 1 | 1 | Q0 |
| 1 | 1 | 0 | 0 | — |
| 1 | 1 | 0 | 1 | — |
| 1 | 1 | 1 | 0 | — |
| 1 | 1 | 1 | 1 | Q2 |

FIG.28

| J1 | J2 | J3 | J4 | EXECUTION PATTERN |
|---|---|---|---|---|
| 0 | 0 | 0 | 0 | Q2' |
| 0 | 0 | 0 | 1 | — |
| 0 | 0 | 1 | 0 | — |
| 0 | 0 | 1 | 1 | Q1 |
| 0 | 1 | 0 | 0 | Q0' |
| 0 | 1 | 0 | 1 | Q4' |
| 0 | 1 | 1 | 0 | Q3' |
| 0 | 1 | 1 | 1 | — |
| 1 | 0 | 0 | 0 | — |
| 1 | 0 | 0 | 1 | Q3 |
| 1 | 0 | 1 | 0 | Q4 |
| 1 | 0 | 1 | 1 | Q0 |
| 1 | 1 | 0 | 0 | Q1' |
| 1 | 1 | 0 | 1 | — |
| 1 | 1 | 1 | 0 | — |
| 1 | 1 | 1 | 1 | Q2 |

FIG.29

(1) SELECT J1, J2, J3

| J1 | J2 | J3 | EXECUTION PATTERN |
|---|---|---|---|
| 0 | 0 | 0 | Q2' |
| 0 | 0 | 1 | Q1 |
| 0 | 1 | 0 | Q0' |
| 0 | 1 | 0 | Q4' |
| 0 | 1 | 1 | Q3' |
| 1 | 0 | 0 | Q3 |
| 1 | 0 | 1 | Q4 |
| 1 | 0 | 1 | Q0 |
| 1 | 1 | 0 | Q1' |
| 1 | 1 | 1 | Q2 |

(2) SELECT J1, J2, J4

| J1 | J2 | J4 | EXECUTION PATTERN |
|---|---|---|---|
| 0 | 0 | 0 | Q2' |
| 0 | 0 | 1 | Q1 |
| 0 | 1 | 0 | Q0' |
| 0 | 1 | 1 | Q4' |
| 0 | 1 | 0 | Q3' |
| 1 | 0 | 1 | Q3 |
| 1 | 0 | 0 | Q4 |
| 1 | 0 | 1 | Q0 |
| 1 | 1 | 0 | Q1' |
| 1 | 1 | 1 | Q2 |

(3) SELECT J1, J3, J4

| J1 | J3 | J4 | EXECUTION PATTERN |
|---|---|---|---|
| 0 | 0 | 0 | Q2' |
| 0 | 1 | 1 | Q1 |
| 0 | 0 | 0 | Q0' |
| 0 | 0 | 1 | Q4' |
| 0 | 1 | 0 | Q3' |
| 1 | 0 | 1 | Q3 |
| 1 | 1 | 0 | Q4 |
| 1 | 1 | 1 | Q0 |
| 1 | 0 | 0 | Q1' |
| 1 | 1 | 1 | Q2 |

(4) SELECT J2, J3, J4

| J2 | J3 | J4 | EXECUTION PATTERN |
|---|---|---|---|
| 0 | 0 | 0 | Q2' |
| 0 | 1 | 1 | Q1 |
| 1 | 0 | 0 | Q0' |
| 1 | 0 | 1 | Q4' |
| 1 | 1 | 0 | Q3' |
| 0 | 0 | 1 | Q3 |
| 0 | 1 | 0 | Q4 |
| 0 | 1 | 1 | Q0 |
| 1 | 0 | 0 | Q1' |
| 1 | 1 | 1 | Q2 |

FIG.43

| SITE OF OCCURRENCE 1 | SITE OF OBSERVATION 11 | NUMBER OF OBSERVATIONS 11 | SITE OF OBSERVATION 12 | NUMBER OF OBSERVATIONS 12 | ... | ... |
|---|---|---|---|---|---|---|
| SITE OF OCCURRENCE 2 | SITE OF OBSERVATION 21 | NUMBER OF OBSERVATIONS 21 | SITE OF OBSERVATION 22 | NUMBER OF OBSERVATIONS 22 | ... | ... |

4302

| SITE OF OCCURRENCE 1 | NUMBER OF OBSERVATIONS 1 |
|---|---|
| SITE OF OCCURRENCE 2 | NUMBER OF OBSERVATIONS 2 |
| SITE OF OCCURRENCE 3 | NUMBER OF OBSERVATIONS 3 |

| SITE OF OCCURRENCE 1 | NUMBER OF OCCURRENCES 1 |
|---|---|
| SITE OF OCCURRENCE 2 | NUMBER OF OCCURRENCES 2 |
| SITE OF OCCURRENCE 3 | NUMBER OF OCCURRENCES 3 |

5201

| OBSERVED SIGNAL 1 | NUMBER OF OBSERVATIONS 1 |
|---|---|
| OBSERVED SIGNAL 2 | NUMBER OF OBSERVATIONS 2 |
| OBSERVED SIGNAL 3 | NUMBER OF OBSERVATIONS 3 |

5202

VERIFICATION SUPPORT APPARATUS, VERIFYING APPARATUS, COMPUTER PRODUCT, VERIFICATION SUPPORT METHOD, AND VERIFYING METHOD

CROSS REFERENCE TO RELATED APPLICATIONS

This application is based upon and claims the benefit of priority of the prior Japanese Patent Application No. 2011-027946, filed on Feb. 10, 2011, the entire contents of which are incorporated herein by reference.

FIELD

The embodiments discussed herein are related to supporting verification of circuit data of a semiconductor integrated circuit. The embodiments are also related to verifying the circuit data of the semiconductor integrated circuit.

BACKGROUND

Conventionally, clocks of different frequencies are used in a single semiconductor integrated circuit due to increased functional complexity and/or to reduce power consumption of the semiconductor integrated circuit. Circuit blocks in a semiconductor integrated circuit are partitioned according to clock source, into groups each of which is called a "clock domain." A signal may be transmitted between the clock domains (hereinafter, "clock domain crossing (CDC)").

FIG. 47 is a diagram of an example of CDC. In FIG. 47, S1 output from a flip flop (FF) in one clock domain is input to an FF in another clock domain. The FF in one clock domain operates in synchronization with CLK1, and the FF(s) in the other clock domain operates in synchronization with CLK2. Data transmitted from the FF in one clock domain to the FF in the other clock domain are input to the FF in the other clock domain irrespective of the clock timing of the FF in the other clock domain.

A metastable state occurs if the setup time and the hold time defined for each FF are violated. The metastable state is a state in which the output is unstable and whether 0 or 1 is output is unclear. If S1 output from the FF in one clock domain changes around the rise of CLK2, the setup time or the hold time of the FF in the other clock domain may be violated as depicted in the chart, thereby bringing S2 output from the FF in the other clock domain into the metastable state.

The effect of the metastable state may be propagated to subsequent FFs and/or combination circuits as a difference in logic value, thereby causing a malfunction of the semiconductor integrated circuit. Thus, the semiconductor integrated circuit needs to be verified not to malfunction even when the metastable state occurs. However, the effect of the metastable state is not considered in a logic verification using a normal FF model.

FIG. 48 is a diagram of an example of a result of simulation using a normal FF model. In verification using the normal FF model, the value of S1 at the rise of CLK2 is output to S2 even when S1 changes around the rise of CLK2, and the effect of violation cannot be verified even when the setup time and/or the hold time are violated. Thus, the model of the FF that receives data transmitted from one clock domain to the receiving clock domain is changed to a model that simulates the effect of the metastable state (hereinafter, "CDC model") to perform a verification.

FIG. 49 is a diagram of an example of a result of simulation using the CDC model. In verification using the CDC model, a random value (0 or 1) is output as S2 at the rise of CLK2 for one clock cycle if S1 changes around the rise of CLK2. Here, a random value output for one clock cycle is called "CDC jitter".

FIG. 50 is a diagram of an example of the CDC model depicted in FIG. 49. The CDC model depicted in FIG. 50 describes an operation of detecting a change in an input signal and outputting the random value during the period of a clock event if the clock event occurs within a given time period from the detection of the change. The CDC model includes a jitter detector, a first FF, a second FF, and a selection circuit. The selection circuit outputs a signal output from the first FF if a signal output from the second FF is 0, and outputs $random if the signal output from the second FF is 1. $random indicates a random value is generated. The jitter detector detects the change in the value of the input signal, and outputs 1 for a given time period from the detection of the change. A detailed example of the jitter detector is described later.

FIG. 51 is a flowchart of CDC verification. A computer capable of a logic simulation executes a CDC simulation (step S5101), and determines whether a logic failure (hereinafter, "error") is detected (step S5102). Coverage data are generated in the CDC simulation, of which details are described later.

If the computer determines an error is detected (step S5102: YES), after a manual debugging by a verifier (step S5103), the computer executes a CDC simulation (step S5101) using circuit data after the debugging. The debugging includes an analysis on the cause of the logic failure (hereinafter, "cause of error") and/or a correction of logic.

If the computer determines no error is detected (step S5102: NO), the verifier determines whether the coverage is insufficient using the coverage data (step S5104). If the verifier determines the coverage is insufficient (step S5104: YES), the verifier changes conditions for execution (step S5105), and the process returns to step S5101. Here, the change of the conditions for execution includes changing a random sequence and/or an input pattern. If the verifier determines the coverage is sufficient (step S5104: NO), the CDC verification ends.

The cause of failure (the cause of error) is difficult to analyze in the simulation using the CDC model (the CDC simulation) since the simulation result includes the effect of the metastable state. Thus, the verifier performs a normal logic simulation before the change to the CDC model to confirm normal functions include no problem, and then performs a CDC simulation using the same input pattern used in the normal logic simulation to check whether there is any problem due to the effect of the metastable state.

As a standard for coverage determination in CDC, a technology is known that determines, using a result of an execution of normal CDC simulation, whether the coverage is insufficient based on whether the effect of CDC jitter appears at an output terminal. As a standard, a technology is also known that determines whether the coverage is insufficient by identifying whether the effect appears at a point several stages downstream of the CDC model (here, one stage is from the output of an FF to a next FF).

FIG. 52 is a diagram of an example of conventional coverage data. Coverage data 5201 are data concerning the site of occurrence and the number of occurrences. If the site of occurrence is an output terminal, the name of the output terminal is described in the coverage data 5201 as the site of occurrence. If a value different from an expected value is output from the output terminal for 4 times, 4 is described in the coverage data 5201 as the number of occurrences. Coverage data 5202 are data concerning the observed signal and the number of observations. The observed signal is a change in the output of a given CDC model, and the number of observations is the number of times that the effect of the change is observed at an observation point (see, for example, Japanese Laid-Open Patent Publication Nos. 2009-187344 and 2010-176486).

The cause of error in the CDC simulation is a CDC point where data are transmitted from an FF of a first clock domain to an FF of a second clock domain. The source of an error and the point at which the error is determined are distant from each other due to FFs and combination circuits therebetween, and time is required for output. For example, $2^{\wedge}(N)$ (N=the number of occurrences of CDC jitter and "^" indicates an exponent) simulations are required to cover all combinations of CDC jitter, thereby requiring time for the simulations. Further, if not all combinations of CDC jitter are simulated, only combinations arbitrarily selected by the verifier during manual debugging are simulated, thereby requiring time for an analysis on the cause of error.

Conventionally, it is determined whether the effect of CDC jitter appears at an output terminal and/or an observation point downstream of the CDC model. However, it cannot be determined which CDC point is under test since there are many CDC points upstream of the observation point.

SUMMARY

According to an aspect of an embodiment, a verification support apparatus includes a detecting unit that detects an inconsistency between a simulation result at an observation point in a circuit-under-test and an expected value, wherein the simulation result is a result of a simulation in which a given input pattern is provided to circuit data of the circuit-under-test that includes a first clock domain and a second clock domain that receives a signal from the first clock domain asynchronously; a setting unit that sets a portion of output values to logic values different from those of the simulation result when the detecting unit detects the inconsistency, wherein the output values are random values output from elements that receive the signal in the second clock domain; a comparing unit that compares the expected value and a simulation result at the observation point after the setting by the setting unit; and an identifying unit that identifies whether the portion of the output values are a cause of the inconsistency, based on a result of comparison by the comparing unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a diagram of an example of a jitter detector.
FIG. 15 is a diagram of examples of 5 execution patterns.
FIG. 26 is a diagram of Q0 to Q4.
FIG. 28 is a diagram of Q0 to Q4 and Q0' to Q4'.
FIG. 29 is a diagram of examples in which 3 CDC jitters are selected.
FIG. 43 is a diagram of an example of coverage data.

FIG. 52 is a diagram of an example of conventional coverage data.

DESCRIPTION OF EMBODIMENTS

Preferred embodiments (a first to a third embodiment) of the verification support apparatus, the verification support program, and the verification support method according to the present invention will be described in detail with reference to the accompanying drawings. An example of automatic analysis of the cause of error is described in the first to the third embodiments. Further, a preferred embodiment (a fourth embodiment) of the verifying apparatus, the verifying program, and the verifying method according to the present invention will be described in detail. A simulator that facilitates the simulation according to the first to the third embodiments is described in the fourth embodiment.

In the first embodiment, an example is described in which in a CDC simulation that uses a given input pattern, CDC jitter that causes an error is identified using combinations of logic values of CDC jitter that do not coincide with expected values.

In the second embodiment, the value output from CDC jitter is set to a logic value different from the logic value of the CDC jitter indicated by a result of CDC simulation using a given input pattern, and it is identified for each CDC jitter whether an adverse effect thereof is propagated to an observation point for the given input pattern, based on the simulation result and the simulation result after the setting.

In the third embodiment, an example is described in which combinations of the logic values of any 3 CDC jitters, selected from among N CDC jitters are covered by 2N+2 simulations.

In the fourth embodiment, an example of a simulation is described in which results of simulations using execution patterns having only one different bit described in the first to the third embodiments can be obtained without simulating common portions again.

Figure 1:
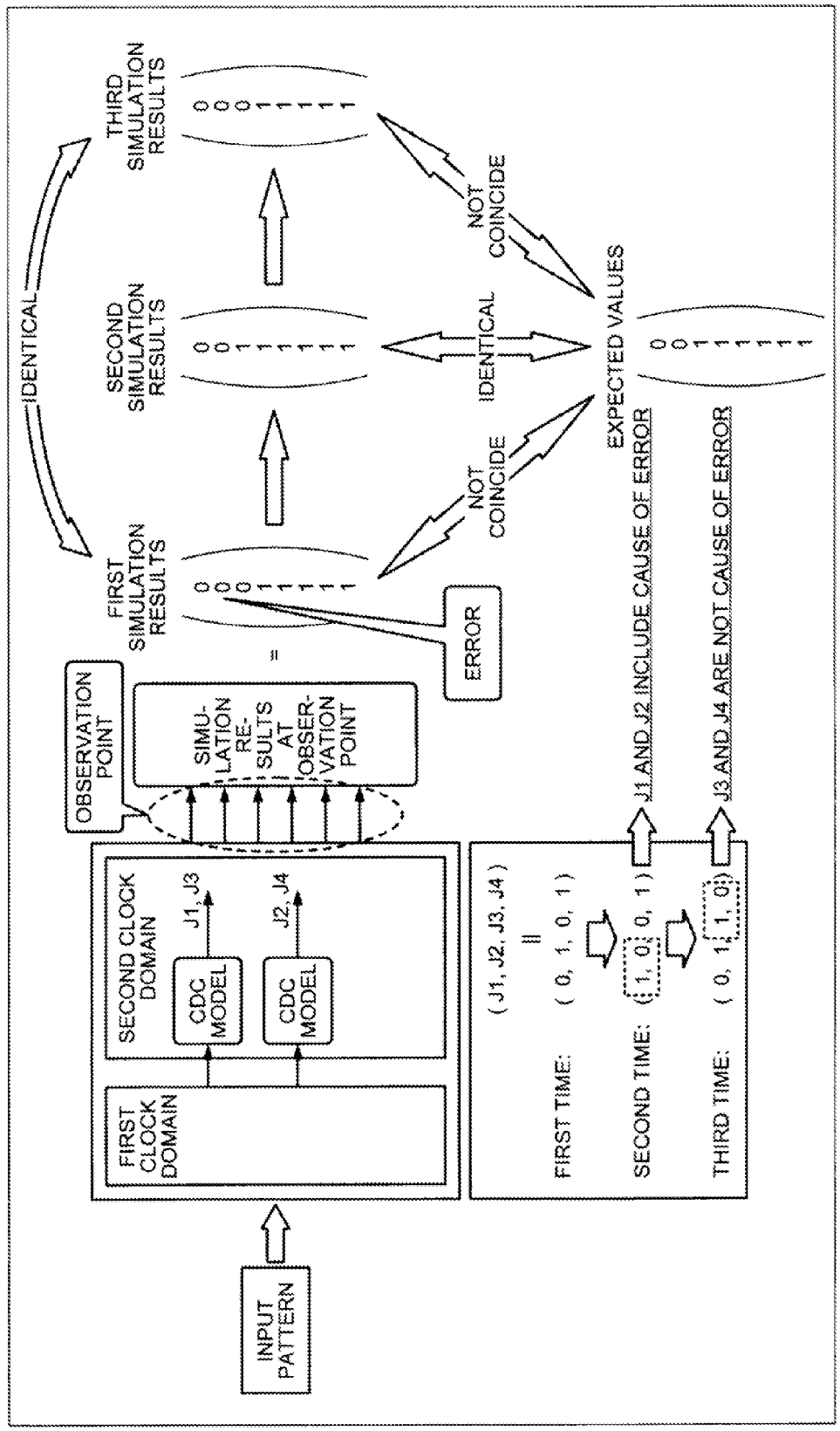
FIG. 1 is a diagram of an example of a first embodiment.

FIG. 1 is a diagram of an example of the first embodiment. Circuit data of a circuit to be verified (hereinafter, "circuit-under-test") depicted in FIG. 1 include a first clock domain and a second clock domain that receives a signal from the first clock domain asynchronously. A verification support apparatus detects an inconsistency between simulation results at an observation point and expected values of the first simulation in which a given input pattern is provided to the circuit data.

In the second clock domain, an FF that receives the signal asynchronously and has been replaced with a CDC model outputs CDC jitter at a timing according to the input pattern. In FIG. 1, J1 to J4 are CDC jitters.

The verification support apparatus sets a portion of the CDC jitters (J1 to J4) to logic values different from those indicated by the results of the first simulation. In the first simulation, (J1, J2, J3, J4) are (0, 1, 0, 1). In the second simulation, the verification support apparatus sets J1 and J2 to logic values different from those indicated by the results of the first simulation, that is, sets (J1, J2, J3, J4) to (1, 0, 0, 1).

The verification support apparatus compares the expected values and simulation results (second simulation results) at the observation point, obtained after setting (J1, J2, J3, J4) to (1, 0, 0, 1). The second simulation results are identical to the expected values. That is, simulation results change according to the change of J1 and J2. Thus, the verification support apparatus identifies that either or both of the CDC jitters J1 and J2 is the cause of error.

In the third simulation, the verification support apparatus sets J3 and J4 to logic values different from those indicated by the results of the first simulation, that is, sets (J1, J2, J3, J4) to (0, 1, 1, 0).

The verification support apparatus compares the expected values and simulation results (third simulation results) at the observation point, obtained after setting (J1, J2, J3, J4) to (0, 1, 1, 0). The third simulation results do not coincide with the expected values. The verification support apparatus compares the third simulation results and the first simulation results. The third simulation results coincide with the first simulation results. That is, simulation results do not change according to the change of J3 and J4. Thus, the verification support apparatus identifies that neither of the CDC jitters J3 and J4 is the cause of error.

Figure 2:
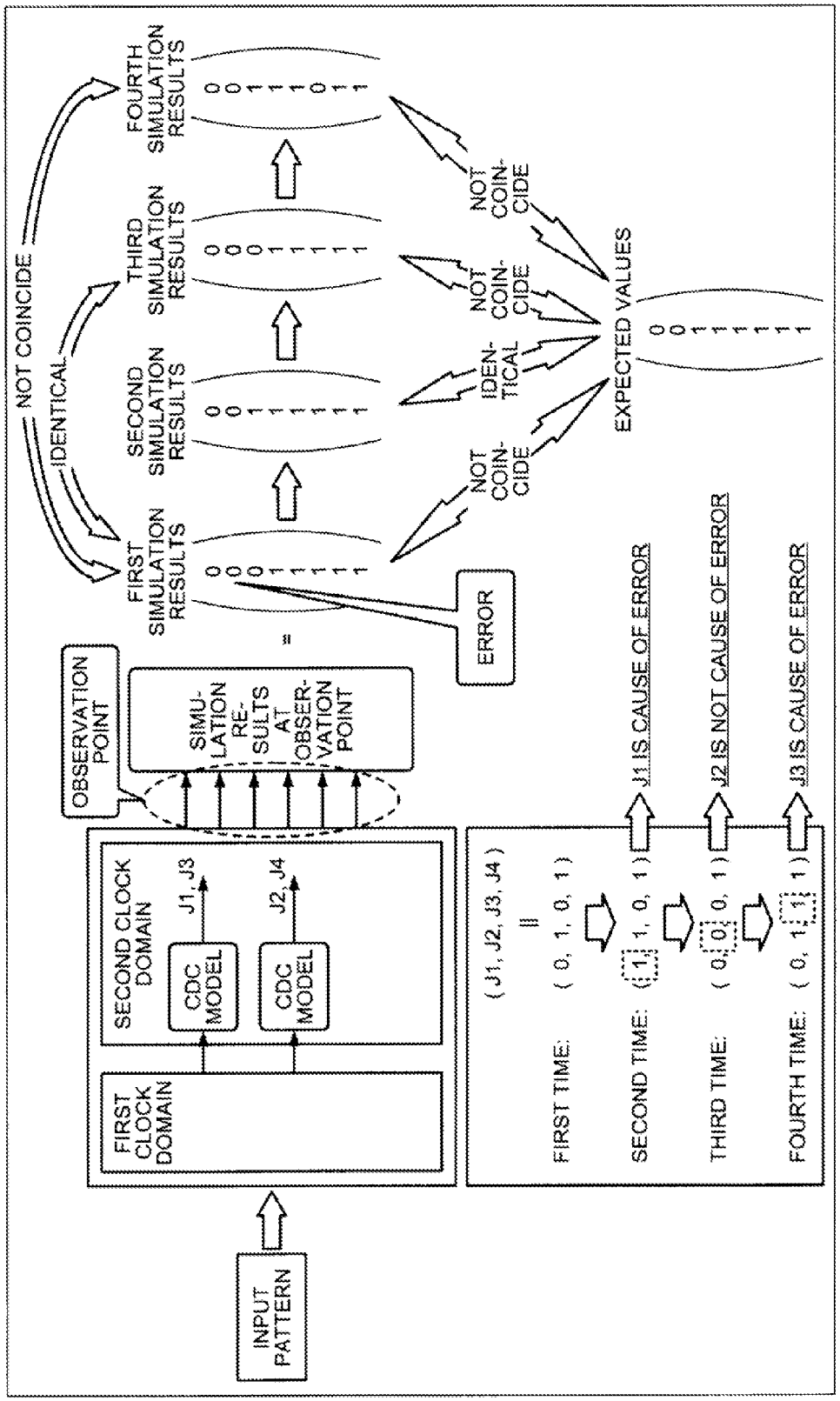
FIG. 2 is a diagram of another example of the first embodiment.

FIG. 2 is a diagram of another example of the first embodiment. Circuit data of the circuit-under-test depicted in FIG. 2 include the first clock domain and the second clock domain that receives the signal from the first clock domain asynchronously. The verification support apparatus detects an inconsistency between simulation results at the observation point and the expected values of the first simulation in which the given input pattern is provided to the circuit data.

In the second clock domain, the FF that receives the signal asynchronously and has been replaced with the CDC model outputs the CDC jitter at the timing according to the input pattern. In the figure, J1 to J4 are CDC jitters.

The verification support apparatus arbitrarily sets one of the CDC jitters (J1 to J4) to a logic value different from that resulting at the first simulation. In the first simulation, (J1, J2, J3, J4) are (0, 1, 0, 1). In the second simulation, the verification support apparatus sets J1 to a logic value different from that resulting at the first simulation, that is, sets (J1, J2, J3, J4) to (1, 1, 0, 1).

The verification support apparatus compares the expected values and simulation results (second simulation results) at the observation point, obtained after setting (J1, J2, J3, J4) to (1, 1, 0, 1). The second simulation results are identical to the expected values, and thus different from the first simulation results. That is, simulation results change according to the change of J1. Thus, the verification support apparatus identifies that J1 is the cause of error.

In the third simulation, the verification support apparatus sets J2 to a logic value different from that resulting at the first simulation, that is, sets (J1, J2, J3, J4) to (0, 0, 0, 1).

The verification support apparatus compares the expected values and simulation results (third simulation results) at the observation point, obtained after setting (J1, J2, J3, J4) to (0, 0, 0, 1). The third simulation results do not coincide with the expected values. The verification support apparatus compares the third simulation results and the first simulation results. The third simulation results coincide with the first simulation results. That is, an identical error occurs in the first simulation and the third simulation, and simulation results do not change according to the change of J2. Thus, the verification support apparatus identifies that J2 is not the cause of error.

In the fourth simulation, the verification support apparatus sets J3 to a logic value different from that resulting at the first simulation, that is, sets (J1, J2, J3, J4) to (0, 1, 1, 1).

The verification support apparatus compares the expected values and simulation results (fourth simulation results) at the observation point, obtained after setting (J1, J2, J3, J4) to (0, 1, 1, 1). The fourth simulation results do not coincide with the expected values. The verification support apparatus compares the fourth simulation results and the first simulation results. The fourth simulation results do not coincide with the first simulation results. That is, different errors occur in the first simulation and the fourth simulation, and simulation results change according to the change of J3. Thus, the verification support apparatus identifies that J3 is the cause of error.

Figure 3:
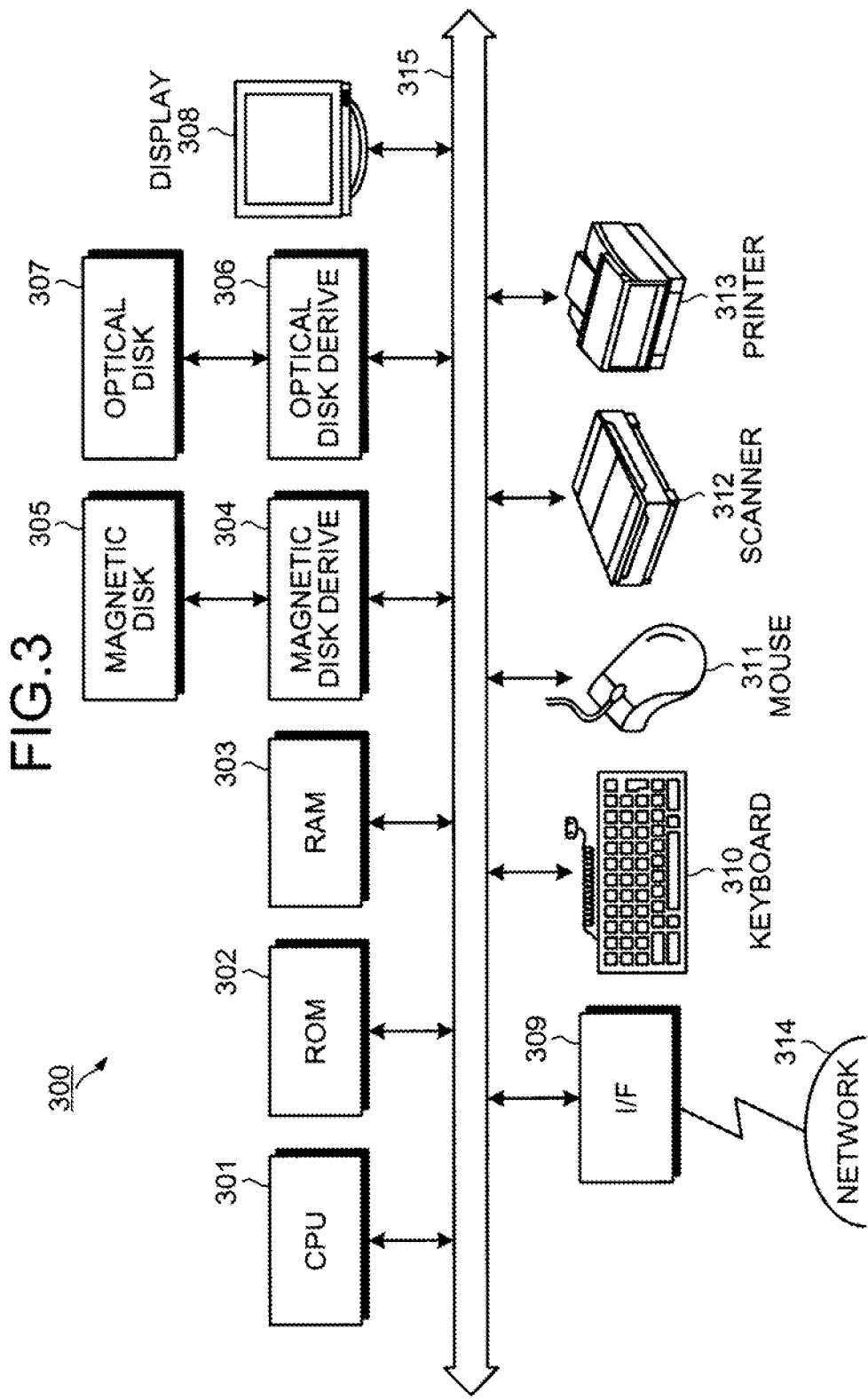
FIG. 3 is a block diagram of a hardware configuration of a verification support apparatus according to the first embodiment.

FIG. 3 is a block diagram of a hardware configuration of the verification support apparatus according to the first embodiment. As depicted in FIG. 3, a verification support apparatus 300 includes a central processing unit (CPU) 301, a read-only memory (ROM) 302, a random access memory (RAM) 303, a magnetic disk drive 304, a magnetic disk 305, an optical disk drive 306, an optical disk 307, a display 308, an interface (I/F) 309, a keyboard 310, a mouse 311, a scanner 312, and a printer 313, respectively connected by a bus 315.

The CPU 301 governs overall control of the verification support apparatus 300. The ROM 302 stores therein programs such as a boot program. The RAM 303 is used as a work area of the CPU 301. The magnetic disk drive 304, under the control of the CPU 301, controls the reading and writing of data with respect to the magnetic disk 305. The magnetic disk 305 stores therein data written under control of the magnetic disk drive 304.

The optical disk drive 306, under the control of the CPU 301, controls the reading and writing of data with respect to the optical disk 307. The optical disk 307 stores therein data written under control of the optical disk drive 306, the data being read by a computer.

The display 308 displays data such as text, images, functional information, etc., in addition to a cursor, icons, and/or tool boxes. A cathode ray tube (CRT), a thin-film-transistor (TFT) liquid crystal display, a plasma display, etc., may be employed as the display 308.

The I/F 309 is connected to a network 314 such as the local area network (LAN), the wide area network (WAN), and the Internet via a communication line, and to other apparatuses through the network 314. The I/F 309 administers an internal interface with the network 314 and controls the input/output of data from/to external apparatuses. For example, a modem or a LAN adaptor may be employed as the I/F 309.

The keyboard 310 includes keys for inputting letters, numerals, and various instructions and performs the input of data. Alternatively, a touch-panel-type input pad or numeric keypad, etc. may be adopted. The mouse 311 is used to move the cursor, select a region, or move and change the size of windows. A track ball or a joy stick may be adopted provided each respectively has a function similar to a pointing device.

The scanner 312 optically reads an image and takes in the image data into the verification support apparatus 300. The scanner 312 may have an optical character reader (OCR) function as well. The printer 313 prints image data and text data. The printer 313 may be, for example, a laser printer or an ink jet printer.

Figure 4:
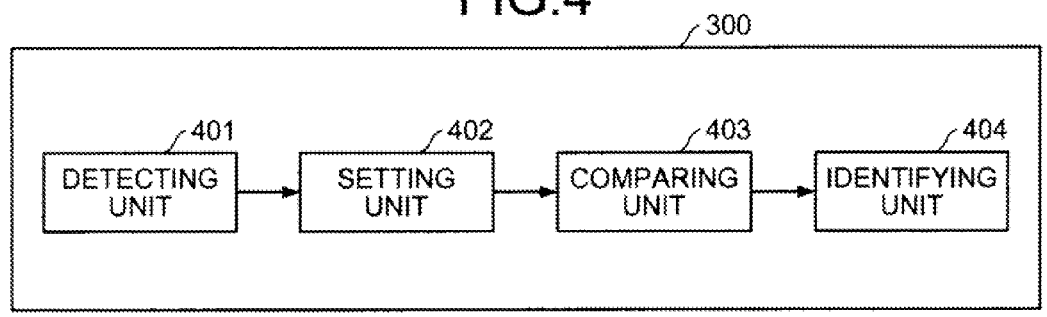
FIG. 4 is a functional block diagram of the verification support apparatus.

FIG. 4 is a functional block diagram of the verification support apparatus 300. The verification support apparatus 300 includes a detecting unit 401, a setting unit 402, a comparing unit 403, and an identifying unit 404. It is assumed that the detecting unit 401 to the identifying unit 404 are coded in a test bench 500 described later.

The detecting unit 401 detects an inconsistency between the first simulation results and the expected values of the first simulation in which the given input pattern is provided to the circuit data that include the first clock domain and the second clock domain that receives the signal (the CDC signal) from the first clock domain asynchronously.

The setting unit 402 sets, if an inconsistency is detected by the detecting unit 401, a portion of CDC jitters output from the FF(s) that receives the CDC signal in the second clock domain, to logic values different from those indicated by the results of the first simulation. The comparing unit 403 compares the expected values and the second simulation results, obtained after the setting by the setting unit 402.

The identifying unit 404 identifies whether the portion of the CDC jitters is the cause of inconsistency, based on the result of comparison by the comparing unit 403. For example, the identifying unit 404 identifies that the portion of the CDC jitters is not the cause of inconsistency, if the result of comparison of the second simulation results and the expected values by the comparing unit 403 are identical to that of the first simulation results and the expected values. The identifying unit 404 identifies that the portion of the CDC jitters includes the cause of inconsistency if the comparing unit 403 determines that the second simulation results are identical to the expected values.

Alternatively, the setting unit 402 arbitrarily sets one of the CDC jitters to a logic value different from that resulting at the first simulation. The comparing unit 403 compares the expected values and the second simulation results, obtained after the setting by the setting unit 402. The identifying unit 404 identifies that the arbitrarily set CDC jitter is the cause of inconsistency, if the comparing unit 403 determines that the second simulation results coincide with the expected values.

Figure 5:
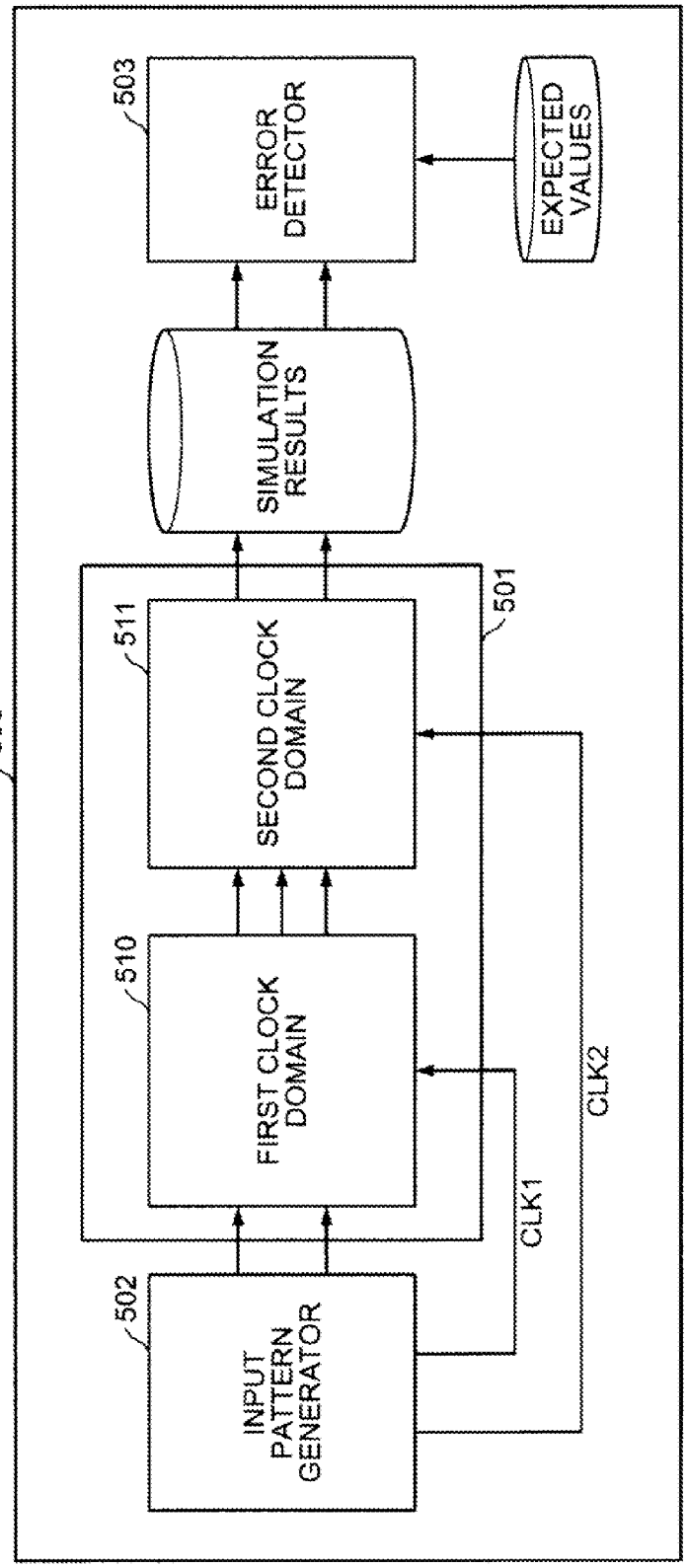
FIG. 5 is a diagram of an example of a test bench.

FIG. 5 is a diagram of an example of the test bench 500. The test bench 500 includes circuit data 501 of the circuit-under-test, an input pattern generator 502, and an error detector 503. The circuit data 501 include a first clock domain 510 and a second clock domain 511 that receives a signal from the first clock domain 510 asynchronously. The test bench 500 is simulated by a logic simulator. When the logic simulator starts a simulation of the test bench 500, the input pattern generator 502 generates an input pattern, and the circuit data 501 are simulated according to the input pattern provided to the circuit data 501. According to the circuit data 501, signals necessary for verification are output as the simulation results. The error detector 503 detects an error by comparing the simulation results and the expected values.

Each unit of the test bench 500 is described in, for example, a hardware description language. The test bench 500 is stored in storage such as the RAM 303, the magnetic disk 305, and the optical disk 307. In the first embodiment, it is assumed that the detecting unit 401 to the identifying unit 404 of the verification support apparatus 300 are coded in the input pattern generator 502 and the error detector 503 of the test bench 500. The CPU 301 reads the test bench 500 from the storage and executes the logic simulator to simulate the test bench 500, thereby executing processes of the detecting unit 401 to the identifying unit 404 coded in the input pattern generator 502 and the error detector 503.

Figure 6:
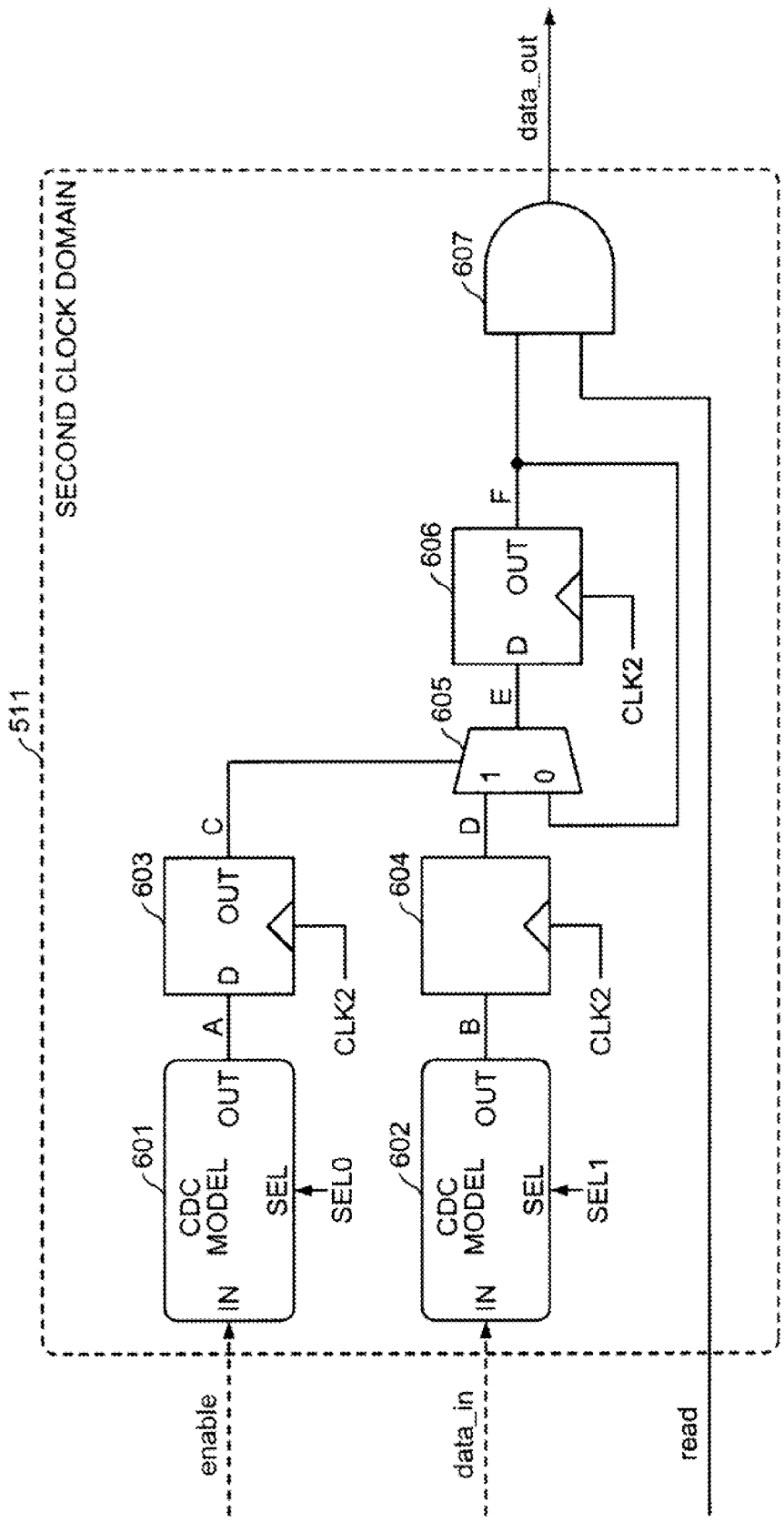
FIG. 6 is a diagram of an example of a second clock domain in circuit data.

FIG. 6 is a diagram of an example of the second clock domain 511 in the circuit data 501. The second clock domain 511 holds the value of data_in when the value of enable becomes 1, and outputs the value of data_in as the value of data_out when the value of read becomes 1. Among enable, data_in, and read, enable and data_in are signals transmitted from the first clock domain 510 to the second clock domain 511 asynchronously.

The second clock domain 511 includes a CDC model 601, a CDC model 602, an FF 603, an FF 604, a selection circuit 605, an FF 606, and an AND circuit 607. The output of the CDC model 601 is A. The CDC model 601 outputs CDC jitter according to the input timing of enable and the input value of SEL0. The output of the CDC model 602 is B. The CDC model 602 outputs CDC jitter according to the input timing of data_in and the input value of SEL1.

The input and the output of the FF 603 are A and C, respectively. The FF 603 takes in the value of A at the rise of CLK2. The input and the output of the FF 604 are B and D, respectively. The FF 604 takes in the value of B at the rise of CLK2. The inputs of the selection circuit 605 are D, F, and C, and the output of the selection circuit 605 is E. The selection circuit 605 outputs the value of D or F according to the value of C. For example, the selection circuit 605 outputs the value of D when the value of C is 1, and the value of F when the value of C is 0.

The input and the output of the FF 606 are E and F, respectively. The FF 606 takes in the value of E at the rise of CLK2. The output of the AND circuit 607 is data_out. The AND circuit 607 outputs 0 or 1 according to the values of F and read. Data_out is an output terminal.

In the first embodiment, the values of enable, data_in, read, A to F, and data_out are held as the simulation results.

Figure 7:
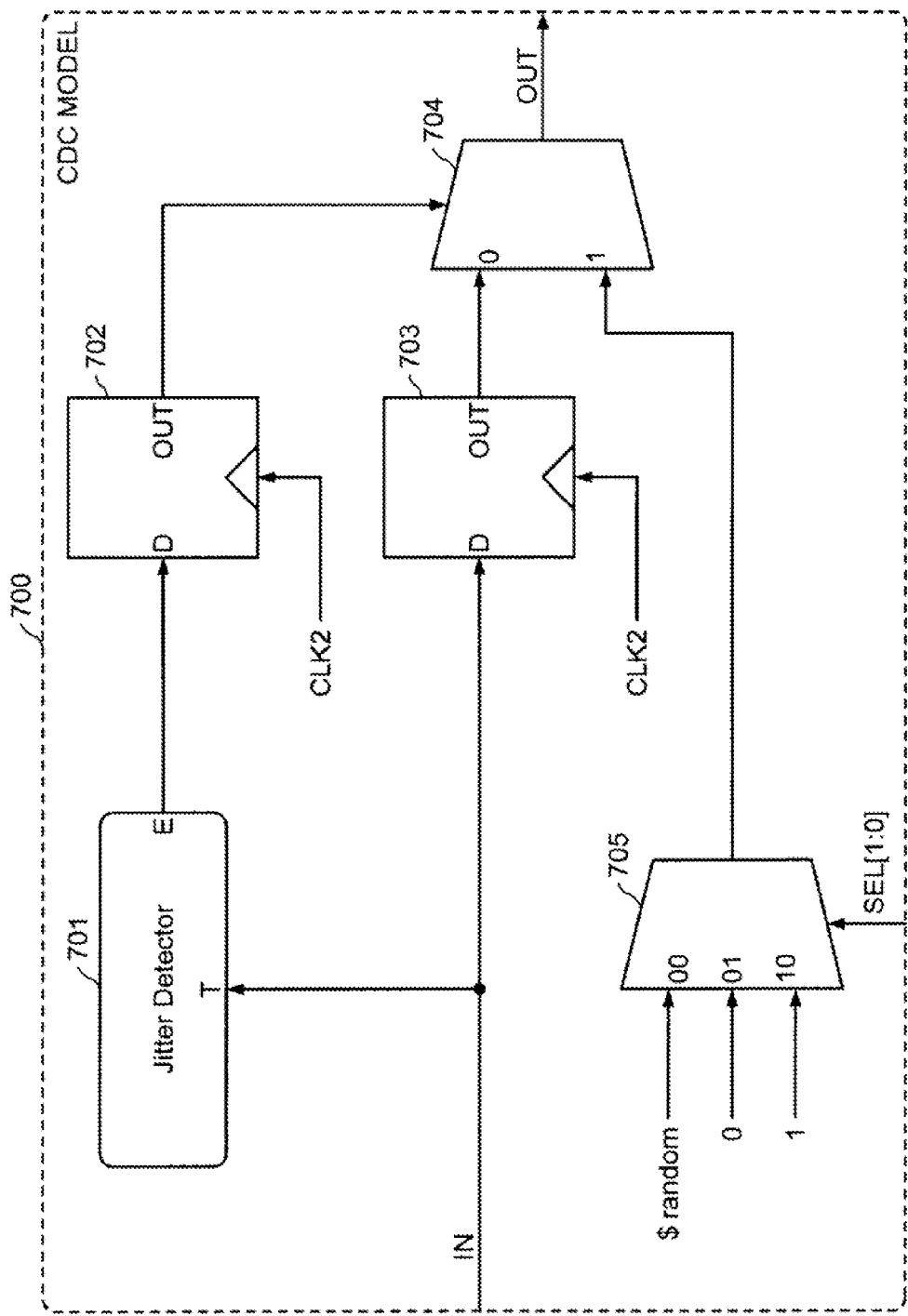
FIG. 7 is a diagram of an example of a CDC model used in the first embodiment.

FIG. 7 is a diagram of an example of the CDC model used in the first embodiment. A CDC model 700 simulates the metastable state by outputting a random logic value (the CDC jitter) for one cycle according to an input signal. The CDC model 700 includes a jitter detector 701, an FF 702, an FF 703, a selection circuit 704, and a selection circuit 705.

The jitter detector 701 detects a change in the value of an input signal (IN) to the CDC model 700, and outputs 1 for a given time period from the detection of the change. The FF 702 holds the value output from the jitter detector 701 at the rise of CLK2, and outputs the value to the selection circuit 704. For example, the FF 702 outputs 1 to the selection circuit 704, if the jitter detector 701 outputs 1 at the rise of CLK2. The selection circuit 704 outputs the value output from the FF 703, if the jitter detector 701 outputs 0 at the rise of CLK2.

The FF 703 holds the value of IN at the rise of CLK2, and outputs the value to the selection circuit 704. The selection circuit 704 outputs the value output from the FF 703 if the value output from the FF 702 is 0, and outputs the value output from the selection circuit 705, if the value output from the FF 702 is 1. The selection circuit 705 outputs $random (random value) if the input value of SEL[1:0] is 00 (binary), 0 if the input value is 01 (binary), and 1 if the input value is 10 (binary).

In the first embodiment, the logic value of CDC jitter can be set by the input pattern generator 502 that controls the input value of SEL according to the timing at which the CDC jitter is output from each CDC model 700.

For example, the CDC model 700 depicted in FIG. 7 is stored as a library in the storage such as the RAM 303, the magnetic disk 305, and the optical disk 307. The circuit data 501 specify the CDC model 700 stored in the library. The logic simulator reads the CDC model 700 from the library, and executes processes described in the CDC model 700.

FIG. 8 is a diagram of an example of the jitter detector. When the input T of a jitter detector 800 changes from 0 to 1 or from 1 to 0, the output E becomes 1 until the time PERIOD elapses.

For example, the jitter detector 800 is stored as a library in the storage such as the RAM 303, the magnetic disk 305, and the optical disk 307. The circuit data 501 specify the jitter detector 800 stored in the library. The logic simulator reads the jitter detector 800 from the library, and executes processes described in the jitter detector 800.

Figure 9:
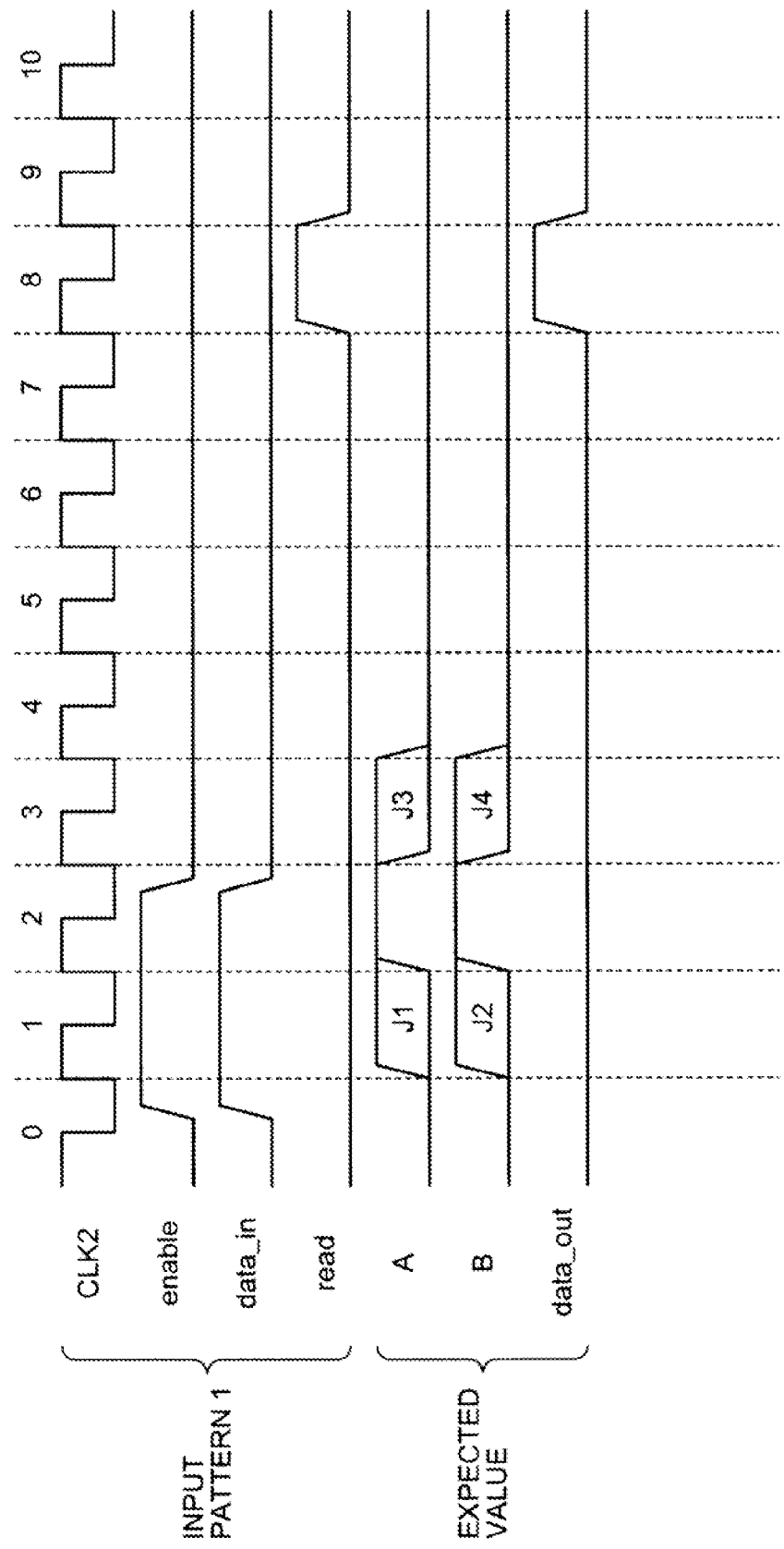
FIG. 9 is a diagram of an input pattern 1.

FIG. 9 is a diagram of an input pattern 1. In FIG. 9, the number of cycles (0 to 10) is depicted above CLK2, where one cycle starts from the rise of CLK2 and ends immediately before the next rise of CLK2. The rise of the first clock indicates the rise of CLK2 between the number 0 and the number 1 in the figure. enable and data_in violate the data setup at the rise of the first clock and the rise of the third clock with respect to CLK2.

For the input pattern 1, the outputs A and B become CDC jitter during the periods of the first clock and the third clock. For the input pattern 1, the CDC jitter of A at the first clock is J1, the CDC jitter of B at the first clock is J2, the CDC jitter of A at the third clock is J3, and the CDC jitter of B at the third clock is J4. When read becomes 1 at the eighth clock, data_out outputs 1. $2^{(4)}$ ("^" indicates an exponent) execution patterns can be obtained according to combinations of J1 to J4 by providing the input pattern to the test bench 500. The combination of the execution patterns is represented by P=(J1, J2, J3, J4).

Here, it is assumed that the CDC jitters become random values and P0 becomes (0, 1, 1, 0) in a simulation of the test bench 500 by the logic simulator. In a detailed example described below, the verification support apparatus 300 selects each of the CDC jitters J1 to J4 sequentially, and sets the logic value of the selected CDC jitter to a logic value different from P0.

Figure 10:
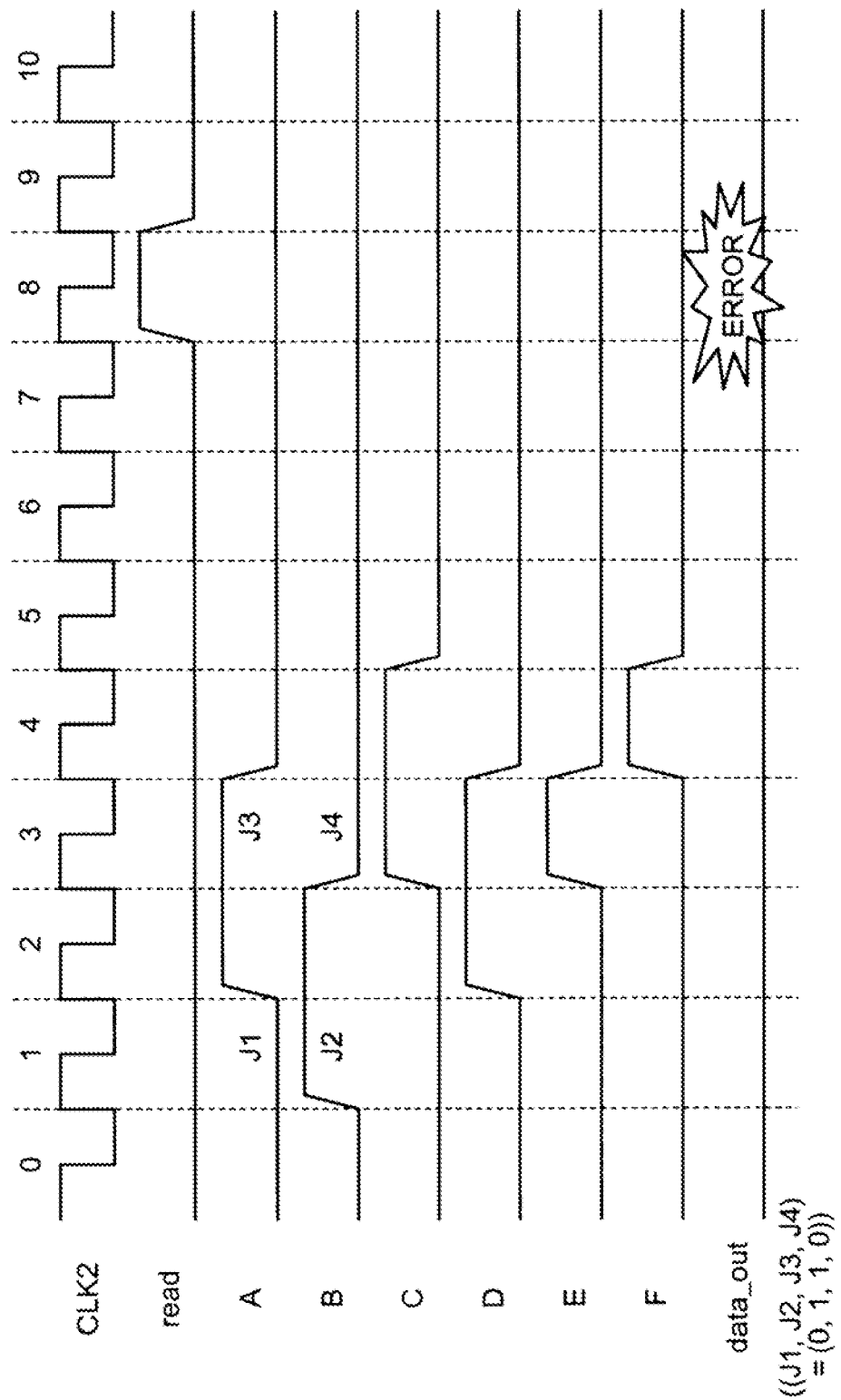
FIG. 10 is a diagram of an example of a simulation result for P0.

FIG. 10 is a diagram of an example of a simulation result for P0. The detecting unit 401 of the verification support apparatus 300 compares the expected value at data_out and the simulation result at data_out for P0=(0, 1, 1, 0). Since data_out is not 1 at the eighth clock, the detecting unit 401 of the verification support apparatus 300 detects that the simulation result for P0 does not coincide with the expected value.

The verification support apparatus 300 selects each of the CDC jitters J1 to J4 sequentially. It is assumed that J1 is selected first. The setting unit 402 of the verification support apparatus 300 sets the logic value of J1 of a new execution pattern to a logic value different from that of P0. The new execution pattern after the setting is P1=(1, 1, 1, 0).

The input pattern generator 502 provides 10 (binary) to SEL0 at the first clock such that the value of A at the first clock becomes 1; provides 10 (binary) to SEL1 at the first clock such that the value of B at the first clock becomes 1; provides 10 (binary) to SEL0 at the third clock such that the value of A at the third clock becomes 1; and provides 01 (binary) to SEL1 at the third clock such that the value of B at the third clock becomes 0.

Figure 11:
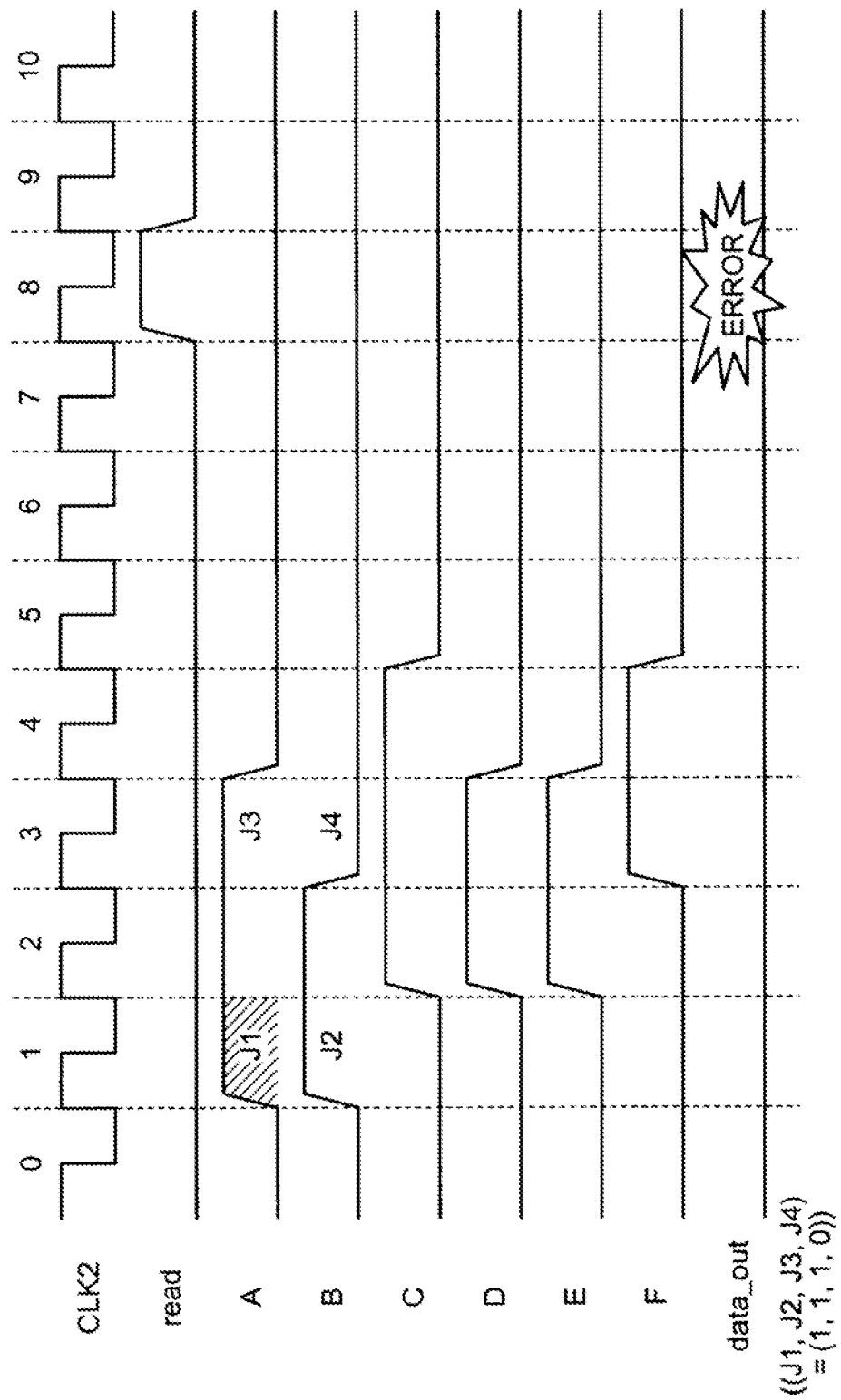
FIG. 11 is a diagram of an example of a simulation result for P1.

FIG. 11 is a diagram of an example of a simulation result for P1. The comparing unit 403 of the verification support apparatus 300 compares the expected value at data_out and the simulation result at data_out for P1. Since data_out does not output 1 at the eighth clock, the verification support apparatus 300 determines that an error occurs for P1 as well as P0. The identifying unit 404 of the verification support apparatus 300 identifies that J1 is not the cause of error since the simulation result does not change according to the change of the logic value of J1.

The verification support apparatus 300 selects J2 from among J2 to J4. The setting unit 402 of the verification support apparatus 300 sets the logic value of J2 of a new execution pattern to a logic value different from that of P0. The new execution pattern after the setting is P2=(0, 0, 1, 0).

The input pattern generator 502 provides 01 (binary) to SEL0 at the first clock such that the value of A at the first clock becomes 0; provides 01 (binary) to SEL1 at the first clock such that the value of B at the first clock becomes 0; provides 10 (binary) to SEL0 at the third clock such that the value of A at the third clock becomes 1; and provides 01 (binary) to SEL1 at the third clock such that the value of B at the third clock becomes 0.

Figure 12:
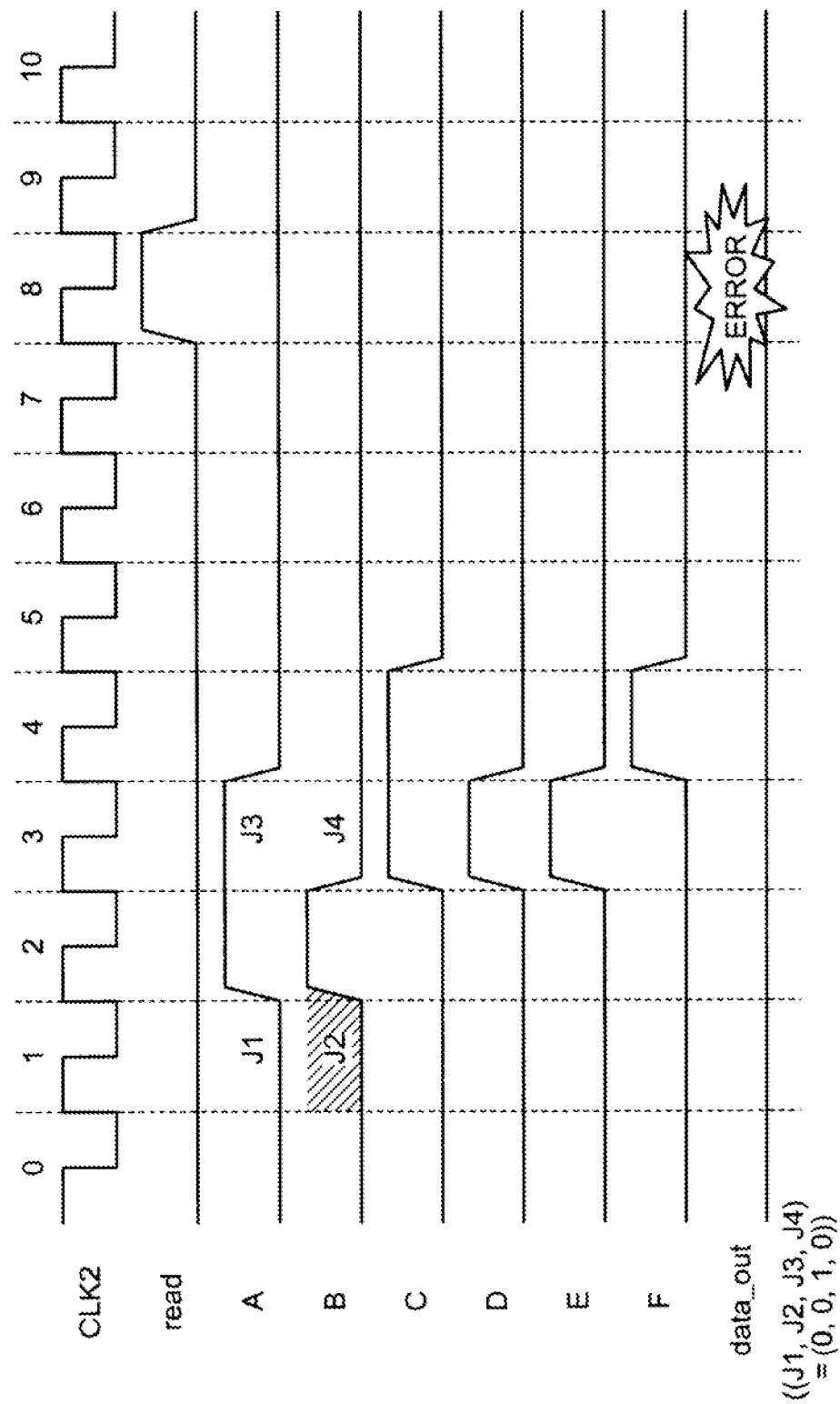
FIG. 12 is a diagram of an example of a simulation result for P2.

FIG. 12 is a diagram of an example of a simulation result for P2. The comparing unit 403 of the verification support apparatus 300 compares the expected value at data_out and the simulation result at data_out for P2. Since data_out does not output 1 at the eighth clock, the verification support apparatus 300 determines that an error occurs for P2 as well as P0. The identifying unit 404 of the verification support apparatus 300 identifies that J2 is not the cause of error since the simulation result does not change according to the change of the logic value of J2.

The verification support apparatus 300 selects J3 from among J3 to J4. The setting unit 402 of the verification support apparatus 300 sets the logic value of J3 of a new execution pattern to a logic value different from that of P0. The new execution pattern after the setting is P3=(0, 1, 0, 0).

The input pattern generator 502 provides 01 (binary) to SEL0 at the first clock such that the value of A at the first clock becomes 0; provides 10 (binary) to SEL1 at the first clock such that the value of B at the first clock becomes 1; provides 01 (binary) to SEL0 at the third clock such that the value of A at the third clock becomes 0; and provides 01 (binary) to SEL1 at the third clock such that the value of B at the third clock becomes 0.

Figure 13:
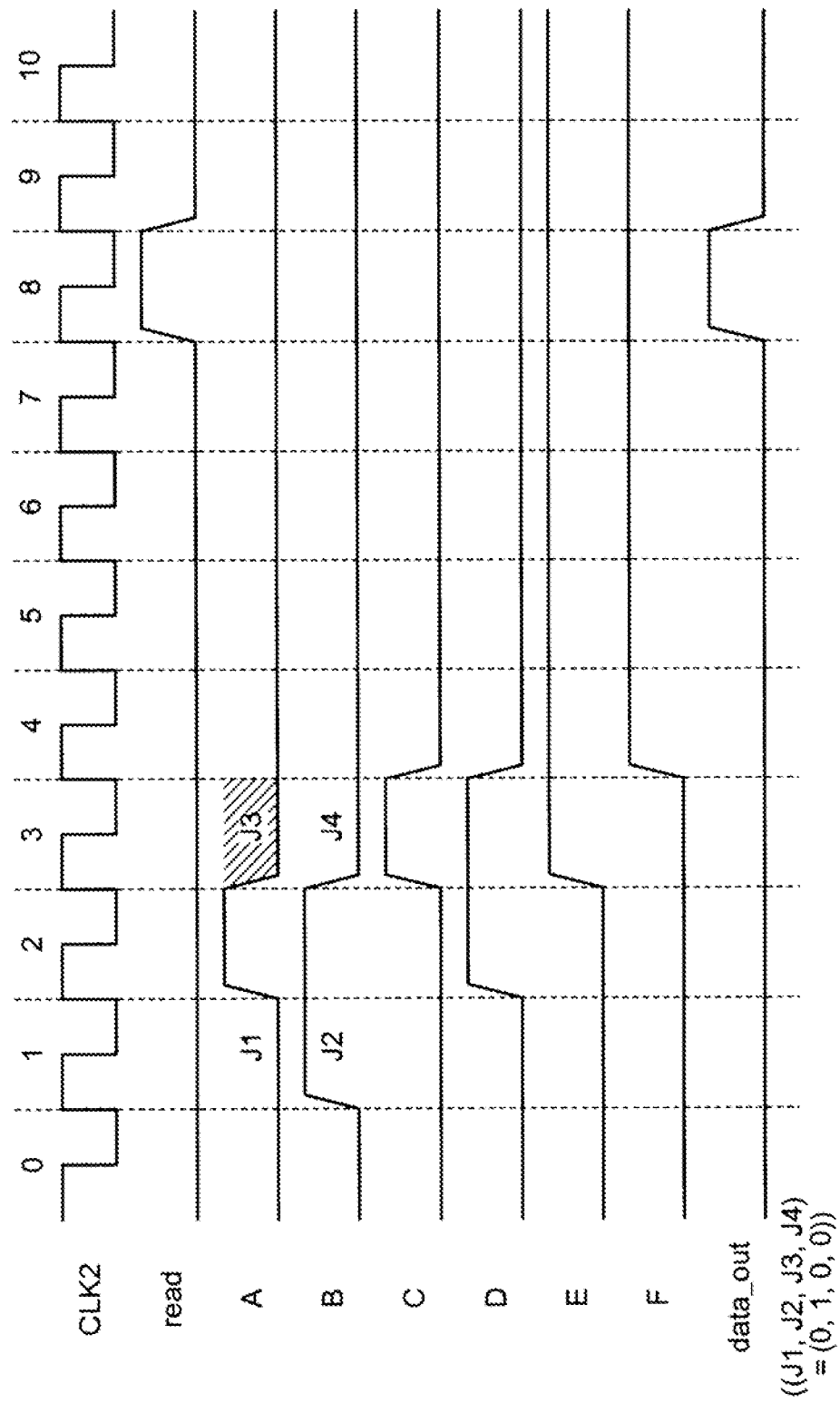
FIG. 13 is a diagram of an example of a simulation result for P3.

FIG. 13 is a diagram of an example of a simulation result for P3. The comparing unit 403 of the verification support apparatus 300 compares the expected value at data_out and the simulation result at data_out for P3. Since data_out outputs 1 at the eighth clock, the verification support apparatus 300 determines that the simulation result for P3 coincides with the expected value. The identifying unit 404 of the verification support apparatus 300 identifies that J3 is the cause of error since the simulation result changes according to the change of the logic value of J3.

The verification support apparatus 300 selects J4. The setting unit 402 of the verification support apparatus 300 sets the logic value of J4 of a new execution pattern to a logic value different from that of P0. The new execution pattern after the setting is P4=(0, 1, 1, 1).

The input pattern generator 502 provides 01 (binary) to SEL0 at the first clock such that the value of A at the first clock becomes 0; provides 10 (binary) to SEL1 at the first clock such that the value of B at the first clock becomes 1; provides 10 (binary) to SEL0 at the third clock such that the value of A at the third clock becomes 1; and provides 10 (binary) to SEL1 at the third clock such that the value of B at the third clock becomes 1.

Figure 14:
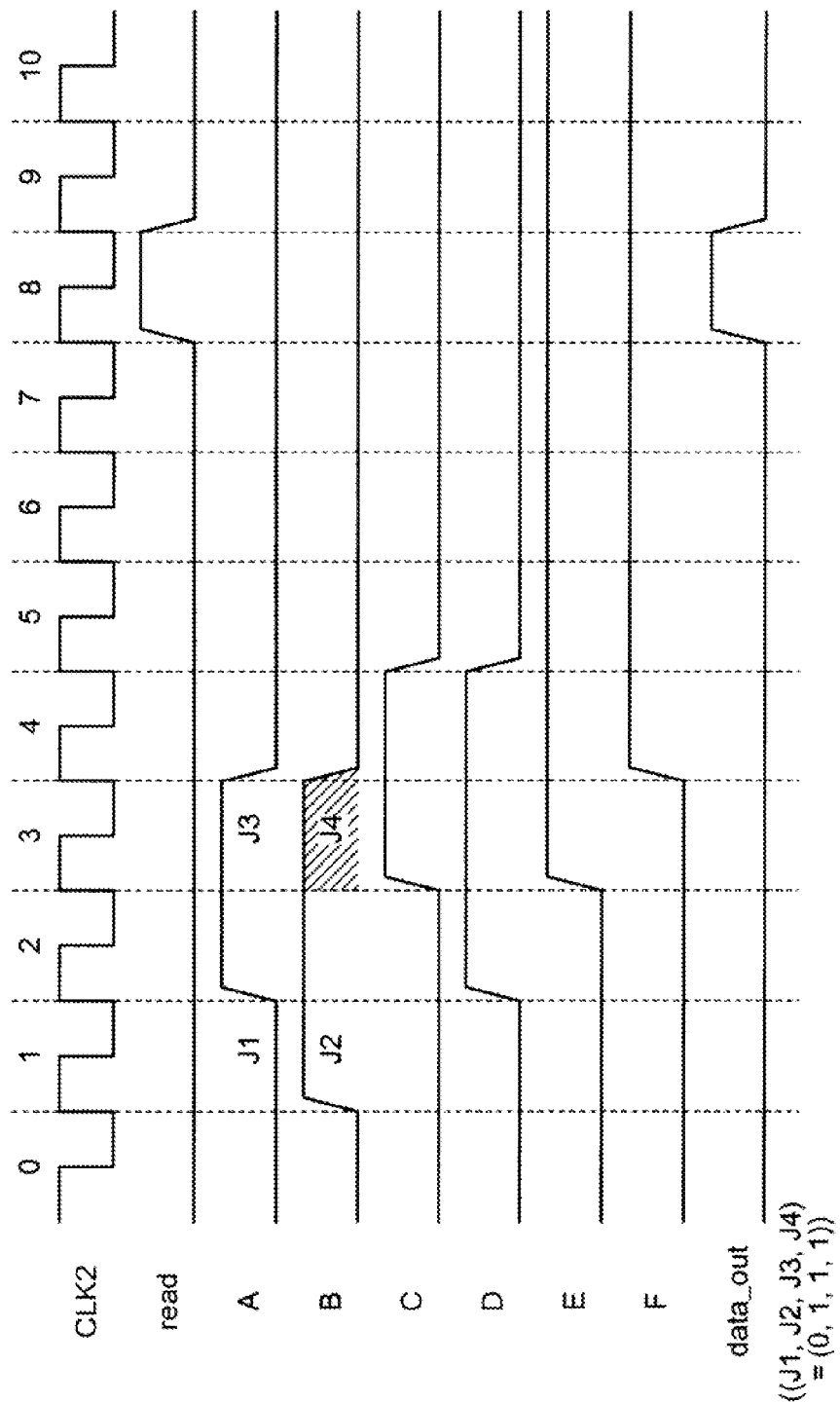
FIG. 14 is a diagram of an example of a simulation result for P4.

FIG. 14 is a diagram of an example of a simulation result for P4. The comparing unit 403 of the verification support apparatus 300 compares the expected value at data_out and the simulation result at data_out for P4. Since data_out outputs 1 at the eighth clock, the verification support apparatus 300 determines that the simulation result for P4 coincides with the expected value. The identifying unit 404 of the verification support apparatus 300 identifies that J4 is the cause of error since the simulation result changes according to the change of the logic value of J4.

FIG. 15 is a diagram of examples of 5 execution patterns. In a table 1500, 16 combinations of J1 to J4 and the execution patterns are associated with each other.

P0=(0, 1, 1, 0): error
P1=(1, 1, 1, 0): error
P2=(0, 0, 1, 0): error
P3=(0, 1, 0, 0): coincide with the expected value
P4=(0, 1, 1, 1): coincide with the expected value Thus, J3 and J4 can be automatically identified as the cause of error among the CDC jitters.

Figure 16:
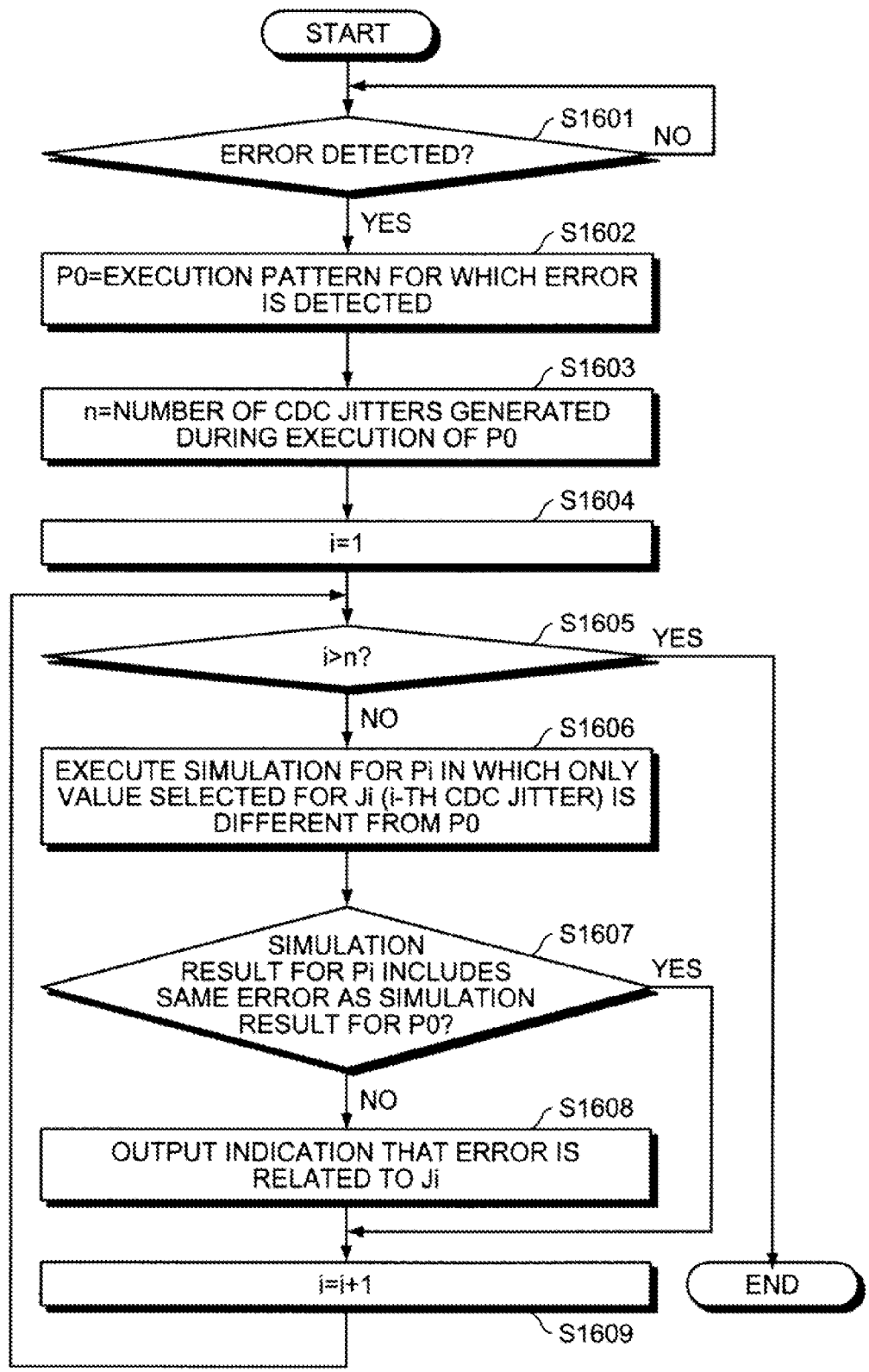
FIG. 16 is a flowchart of a verification support process performed by the verification support apparatus.

FIG. 16 is a flowchart of a verification support process performed by the verification support apparatus 300. The verification support apparatus 300 determines whether there is any execution pattern for which an error is detected (step S1601). If not (step S1601: NO), the process returns to step S1601.

If the verification support apparatus 300 determines that there is an execution pattern for which an error is detected (step S1601: YES), the verification support apparatus 300 sets P0 to the execution pattern for which the error is detected (step S1602), sets n to the number of CDC jitters generated during the execution of P0 (step S1603), and sets i to 1 (step S1604). The verification support apparatus 300 determines whether i exceeds n (step S1605), and if not (step S1605: NO), the verification support apparatus 300 executes a simulation for Pi in which only the value selected for Ji (the i-th CDC jitter) is different from P0 (step S1606).

The verification support apparatus 300 determines whether the simulation result for Pi includes the same error as the simulation result for P0 (step S1607). If not (step S1607: NO), the verification support apparatus 300 outputs the fact that the error is related to Ji (step S1608).

The verification support apparatus 300 increments (step S1609), and the process returns to step S1605. If the verification support apparatus 300 determines that the simulation result for Pi includes the same error as the simulation result for P0 (step S1607: YES), the process proceeds to step S1609. If the verification support apparatus 300 determines i exceeds n (step S1605: YES), the sequence of processes ends.

In the second embodiment, an example of verifying whether the effect of each CDC jitter is propagated to the observation point is described.

Figure 17:
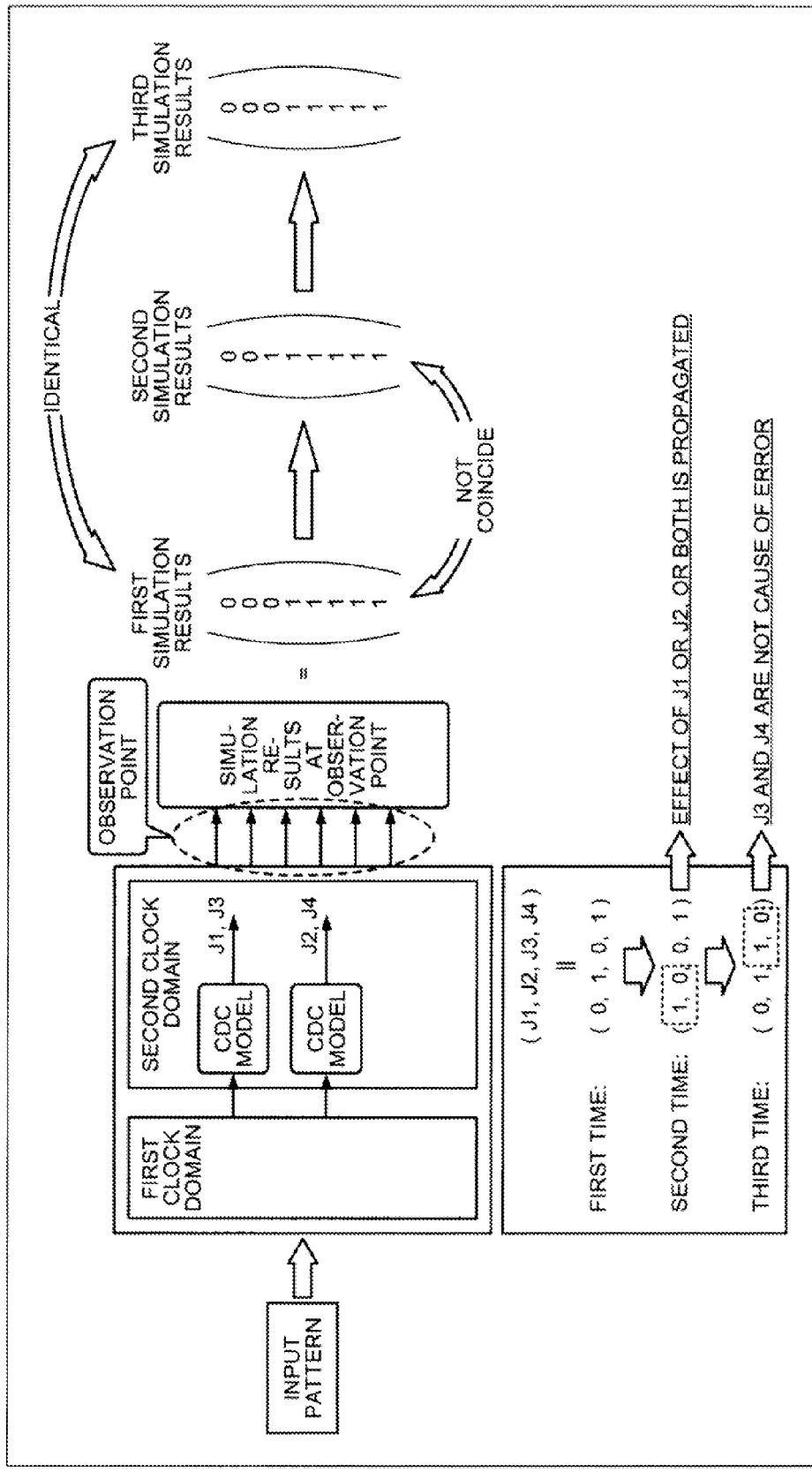
FIG. 17 is a diagram of an example of a second embodiment.

FIG. 17 is a diagram of an example of the second embodiment. Circuit data of the circuit-under-test depicted in FIG. 17 include the first clock domain and the second clock domain that receives a signal from the first clock domain asynchronously.

In the second clock domain, the FF that receives the signal asynchronously and has been replaced with the CDC model outputs the CDC jitter at the timing according to the input pattern. In the figure, J1 to J4 are CDC jitters.

(J1, J2, J3, J4) are (0, 1, 0, 1) in the first simulation of the observation point in which the input pattern is provided to the circuit data. The verification support apparatus sets a portion of the CDC jitters (J1 to J4) to logic values different from those indicated by the results of the first simulation. For example, in the second simulation, the verification support apparatus sets J1 and J2 to logic values different from those indicated by the results of the first simulation, that is, sets (J1, J2, J3, J4) to (1, 0, 0, 1).

The verification support apparatus compares the first simulation results and simulation results (second simulation results) at the observation point, obtained after setting (J1, J2, J3, J4) to (1, 0, 0, 1). The second simulation results do not coincide with the first simulation results. That is, simulation results change according to the change in the logic values J1 and J2. Thus, the verification support apparatus identifies that the effect of the CDC jitter J1 or J2, or both is propagated to the observation point.

In the third simulation, the verification support apparatus sets J3 and J4 to logic values different from those indicated by the results of the first simulation, that is, sets (J1, J2, J3, J4) to (0, 1, 1, 0).

The verification support apparatus compares the first simulation results and simulation results (third simulation results) at the observation point, obtained after setting (J1, J2, J3, J4) to (0, 1, 1, 0). The third simulation results are identical to the first simulation results. That is, simulation results do not change according to the change in logic values of J3 and J4. Thus, the verification support apparatus identifies that the effect of the CDC jitters J3 and J4 is not propagated to the observation point.

Figure 18:
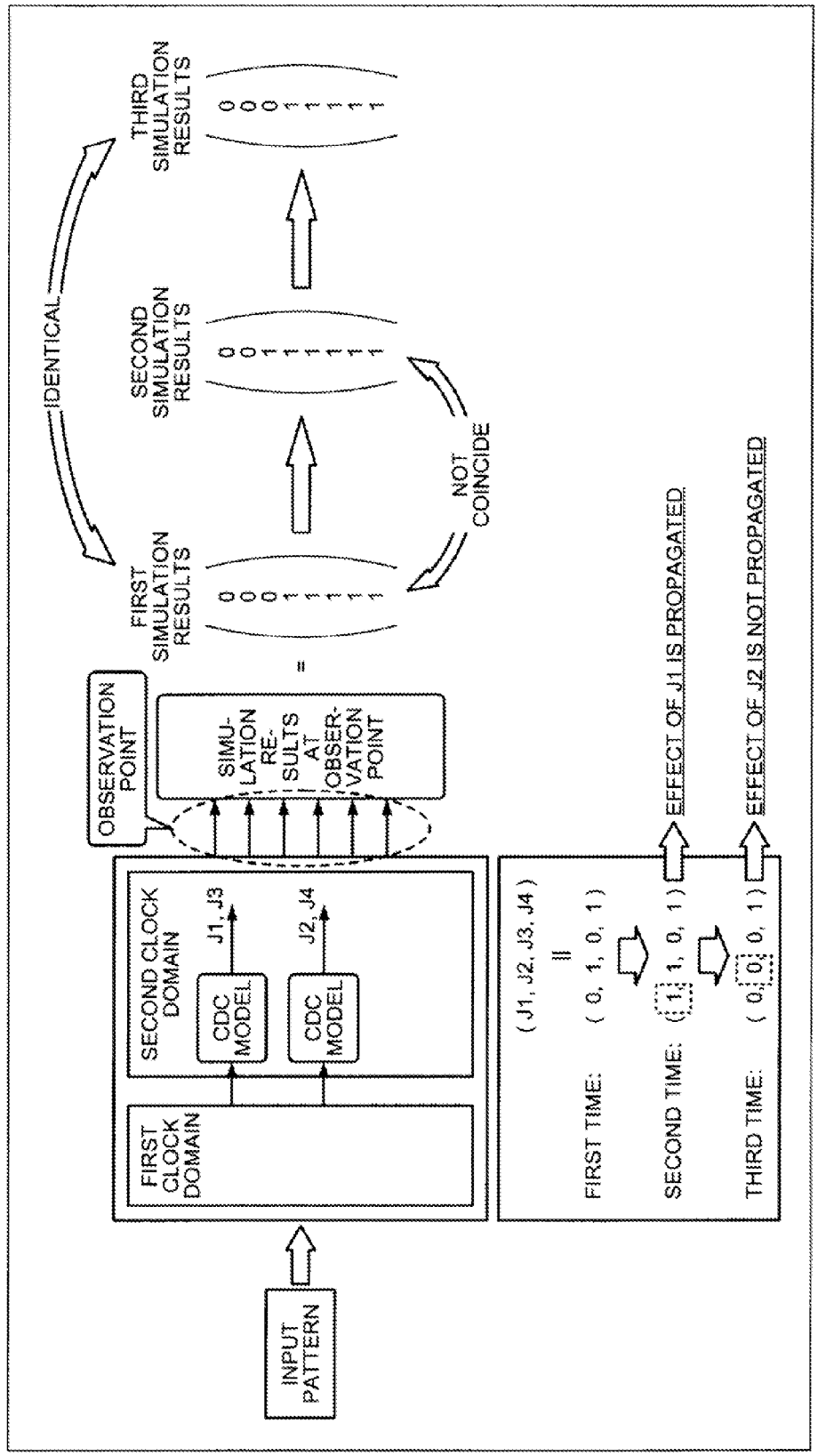
FIG. 18 is a diagram of another example of the second embodiment.

FIG. 18 is a diagram of another example of the second embodiment. Circuit data of the circuit-under-test depicted in FIG. 18 include the first clock domain and the second clock domain that receives the signal from the first clock domain asynchronously. In the second clock domain, the FF that receives the signal asynchronously and has been replaced with the CDC model outputs the CDC jitter at the timing according to the input pattern. In FIG. 18, J1 to J4 are CDC jitters.

(J1, J2, J3, J4) is (0, 1, 0, 1) in the first simulation of the observation point in which the input pattern is provided to the circuit data. The verification support apparatus arbitrarily sets one of the CDC jitters (J1 to J4) to a logic value different from that resulting at the first simulation. In the first simulation, (J1, J2, J3, J4) is (0, 1, 0, 1). In the second simulation, the verification support apparatus sets J1 to a logic value different from that resulting at the first simulation, that is, sets (J1, J2, J3, J4) to (1, 1, 0, 1).

The verification support apparatus compares the first simulation results at the observation point and simulation results (second simulation results) at the observation point, obtained after setting (J1, J2, J3, J4) to (1, 1, 0, 1). The second simulation results do not coincide with the first simulation results, and different from the first simulation results. That is, simulation results change according to the change of J1. Thus, the verification support apparatus identifies that the effect of J1 is propagated.

In the third simulation, the verification support apparatus sets J2 to a logic value different from that resulting at the first simulation, that is, sets (J1, J2, J3, J4) to (0, 0, 0, 1).

The verification support apparatus compares the first simulation results at the observation point and simulation results (third simulation results) at the observation point, obtained after setting (J1, J2, J3, J4) to (0, 0, 0, 1). The third simulation results are identical to the first simulation results. That is, simulation results do not change according to the change in the logic value of J2. Thus, the verification support apparatus identifies that the effect of J2 is not propagated.

Figure 19:
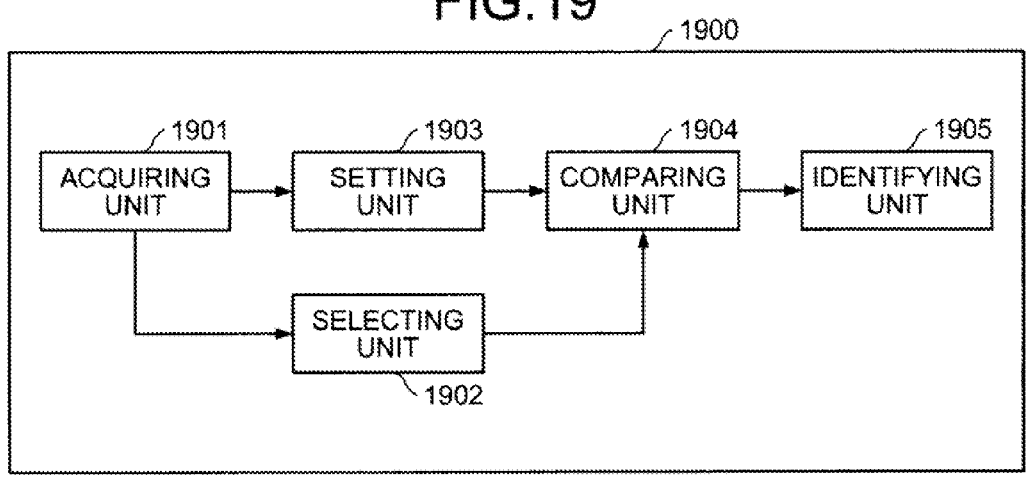
FIG. 19 is a functional block diagram of a verification support apparatus according to the second embodiment.

FIG. 19 is a functional block diagram of the verification support apparatus according to the second embodiment. A verification support apparatus 1900 includes an acquiring unit 1901, a selecting unit 1902, a setting unit 1903, a comparing unit 1904, and an identifying unit 1905.

The acquiring unit 1901 acquires results of the first simulation in which the given input pattern is provided to the circuit data of the circuit-under-test that includes the first clock domain and the second clock domain that receives the signal from the first clock domain asynchronously.

The setting unit 1903 sets a portion of the CDC jitters output from the FF(s) that receives the signal in the second clock domain to logic values different from those indicated by the results of the first simulation acquired by the acquiring unit 1901.

The comparing unit 1904 compares the first simulation results at the observation point and the second simulation results at the observation point in the circuit-under-test, obtained after the setting by the setting unit 1903.

The identifying unit 1905 identifies whether the effect of the portion of the CDC jitters is propagated to the observation point, based on the result of comparison by the comparing unit 1904. The identifying unit 1905 identifies that the effect of the portion of the output values is not propagated, if the comparing unit 1904 determines that the second simulation results after the setting coincide with the first simulation results.

The identifying unit 1905 identifies, if the comparing unit 1904 determines that the second simulation results after the setting do not coincide with the first simulation results, that the portion of the CDC jitters includes an output value whose effect is propagated to the observation point.

Alternatively, the setting unit 1903 arbitrarily sets one of the CDC jitters to a logic value different to that of the first simulation results. The comparing unit 1904 compares the first simulation results at the observation point and the second simulation results at the observation point, obtained after the setting by the setting unit 1903. The identifying unit 1905 identifies that the effect of the arbitrarily set CDC jitter is propagated to the observation point if the comparing unit 1904 determines that the second simulation results at the observation point do not coincide with the first simulation results at the observation point.

The selecting unit 1902 selects each of the CDC jitters successively. Each time the selecting unit 1902 selects a CDC jitter, the setting unit 1903 sets the selected CDC jitter to a logic value different from that resulting at the first simulation. The comparing unit 1904 compares, for each selected logic values, the first simulation results at the observation point and the second simulation results at the observation point, obtained after the setting by the setting unit 1903. The identifying unit 1905 identifies that the effect of the selected CDC jitter is propagated to the observation point if the comparing unit 1904 determines that the second simulation results at the observation point after the setting do not coincide with the first simulation results at the observation point.

With consideration of the above, a detailed example is described. In the second embodiment, same components as those of the first embodiment are assigned the same signs, and description is omitted.

In the second embodiment, it is assumed that the acquiring unit 1901 to the identifying unit 1905 of the verification support apparatus 1900 are coded in the input pattern generator 502 and the error detector 503 of the test bench 500 described above. The CPU 301 reads the test bench 500 from the storage and executes the logic simulator to simulate the test bench 500, thereby executing processes of the acquiring unit 1901 to the identifying unit 1905 coded in the input pattern generator 502 and the error detector 503.

Figure 20:
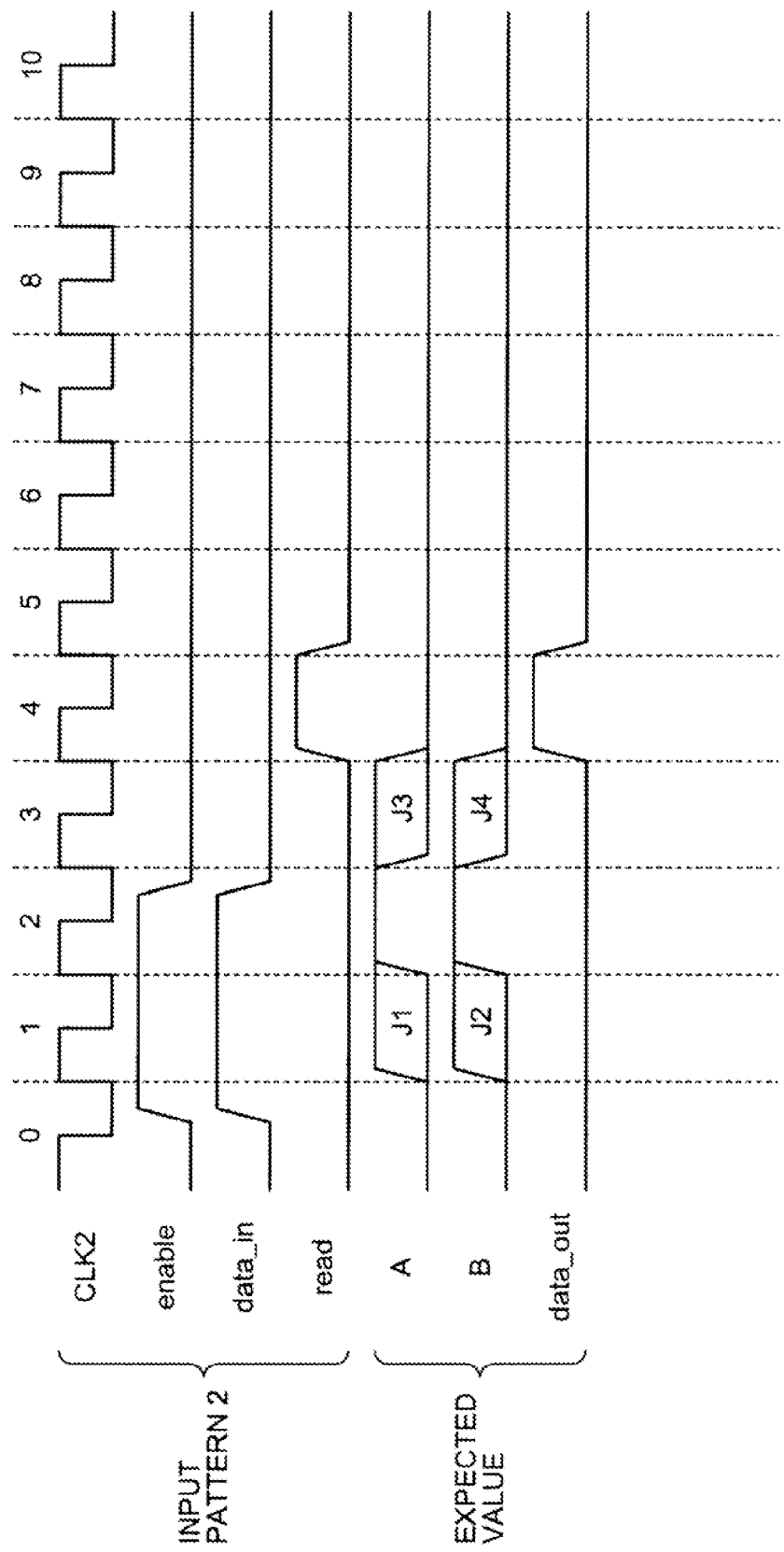
FIG. 20 is a diagram of an input pattern 2.

FIG. 20 is a diagram of an input pattern 2. In FIG. 20, the number of cycles (0 to 10) is depicted above CLK2, where one cycle starts from the rise of CLK2 and ends immediately before the next rise of CLK2. The rise of the first clock indicates the rise of CLK2 between the number 0 and the number 1 in the figure. enable and data_in violate the data setup at the rise of the first clock and the rise of the third clock with respect to CLK2.

Thus, A and B become CDC jitters during the periods of the first clock and the third clock. Here, the CDC jitter of A at the first clock is J1, the CDC jitter of B at the first clock is J2, the CDC jitter of A at the third clock is J3, and the CDC jitter of B at the third clock is J4. When read becomes 1 at the fourth clock, data_out outputs 1. $2^{(4)}$ ("^" indicates an exponent) execution patterns can be obtained according to combinations of J1 to J4 by providing the input pattern to the test bench 500. The combination of the execution patterns is represented by Q=(J1, J2, J3, J4).

Figure 21:
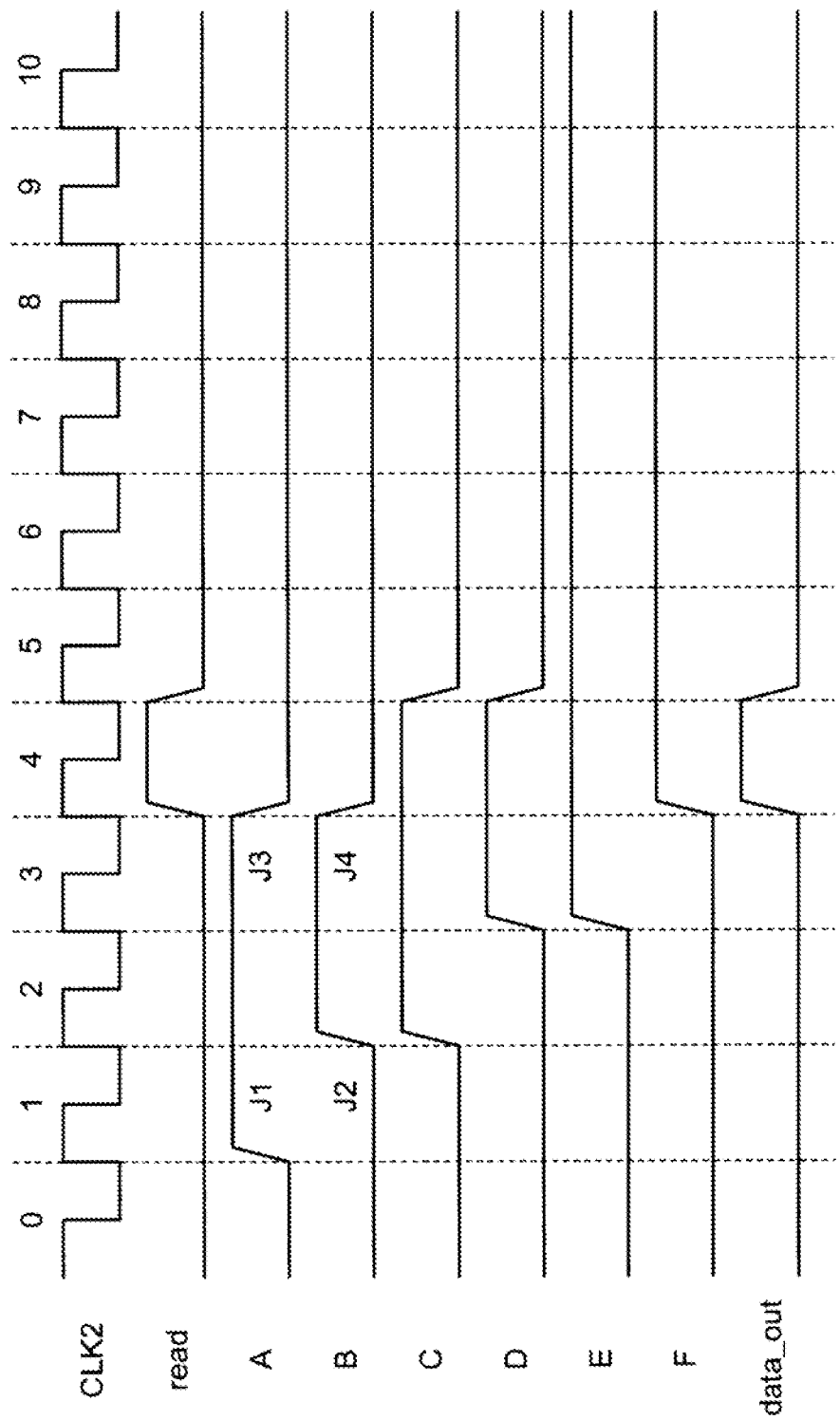
FIG. 21 is a diagram of a simulation result for Q0.

FIG. 21 is a diagram of a simulation result for Q0. The CPU selects an arbitral execution pattern Q0=(1, 0, 1, 1). The acquiring unit 1901 of the verification support apparatus 1900 acquires a simulation result for Q0. For example, the verification support apparatus 1900 causes the logic simulator to execute a simulation for Q0, and acquires the simulation result obtained by the logic simulator.

Similar to data_out depicted in FIG. 20, data_out becomes 1 at the fourth clock in the simulation result for Q0. The selecting unit 1902 of the verification support apparatus 1900 selects each of the CDC jitters (J1 to J4) sequentially. Here, it is assumed that J1 is selected first. The setting unit 1903 of the verification support apparatus 1900 sets J1 to a logic value different from that of Q0.

The changing of the logic value of a given CDC jitter in the second embodiment is the same as the first embodiment, and thus description is omitted. The execution pattern after the setting is Q1=(0, 0, 1, 1). The verification support apparatus 1900 executes, using the logic simulator, the simulation such that the logic values of CDC jitters become Q1.

Figure 22:
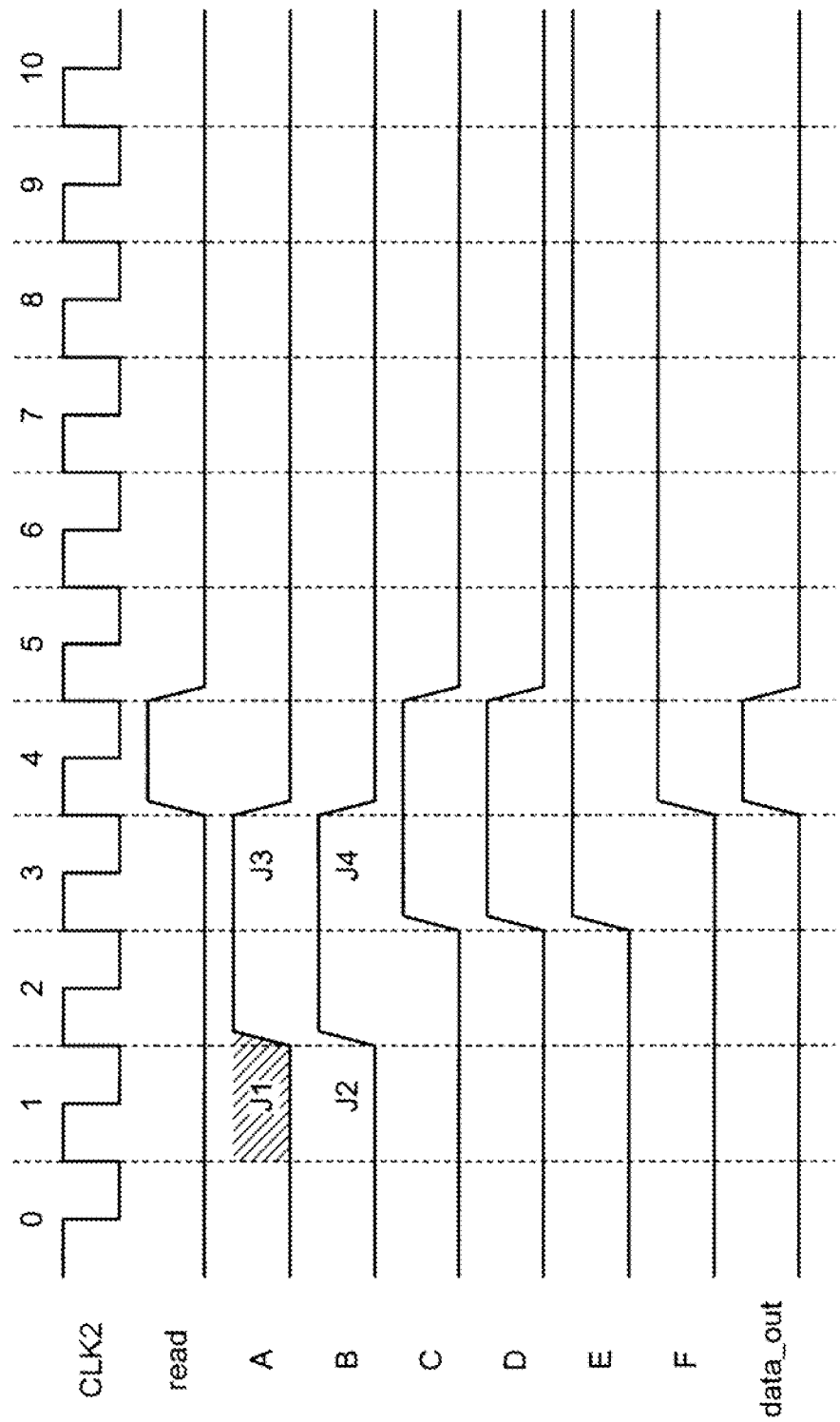
FIG. 22 is a diagram of a simulation result for Q1.

FIG. 22 is a diagram of a simulation result for Q1. The comparing unit 1904 of the verification support apparatus 1900 compares the simulation result for Q1 and the simulation result for Q0, and determines that the simulation results are identical since data_out becomes 1 at the fourth clock in both simulation results. The identifying unit 1905 of the verification support apparatus 1900 identifies that the effect due to J1 is not propagated to data_out since the simulation result has changed according to the change in the logic value of J1.

The selecting unit 1902 of the verification support apparatus 1900 selects J2 from the CDC jitters (J1 to J4). The setting unit 1903 of the verification support apparatus 1900 sets the logic value of the selected J2 to a logic value different from that of Q0. The execution pattern after the setting is Q2=(1, 1, 1, 1). The verification support apparatus 1900 executes a simulation such that the logic values of CDC jitters become Q2.

Figure 23:
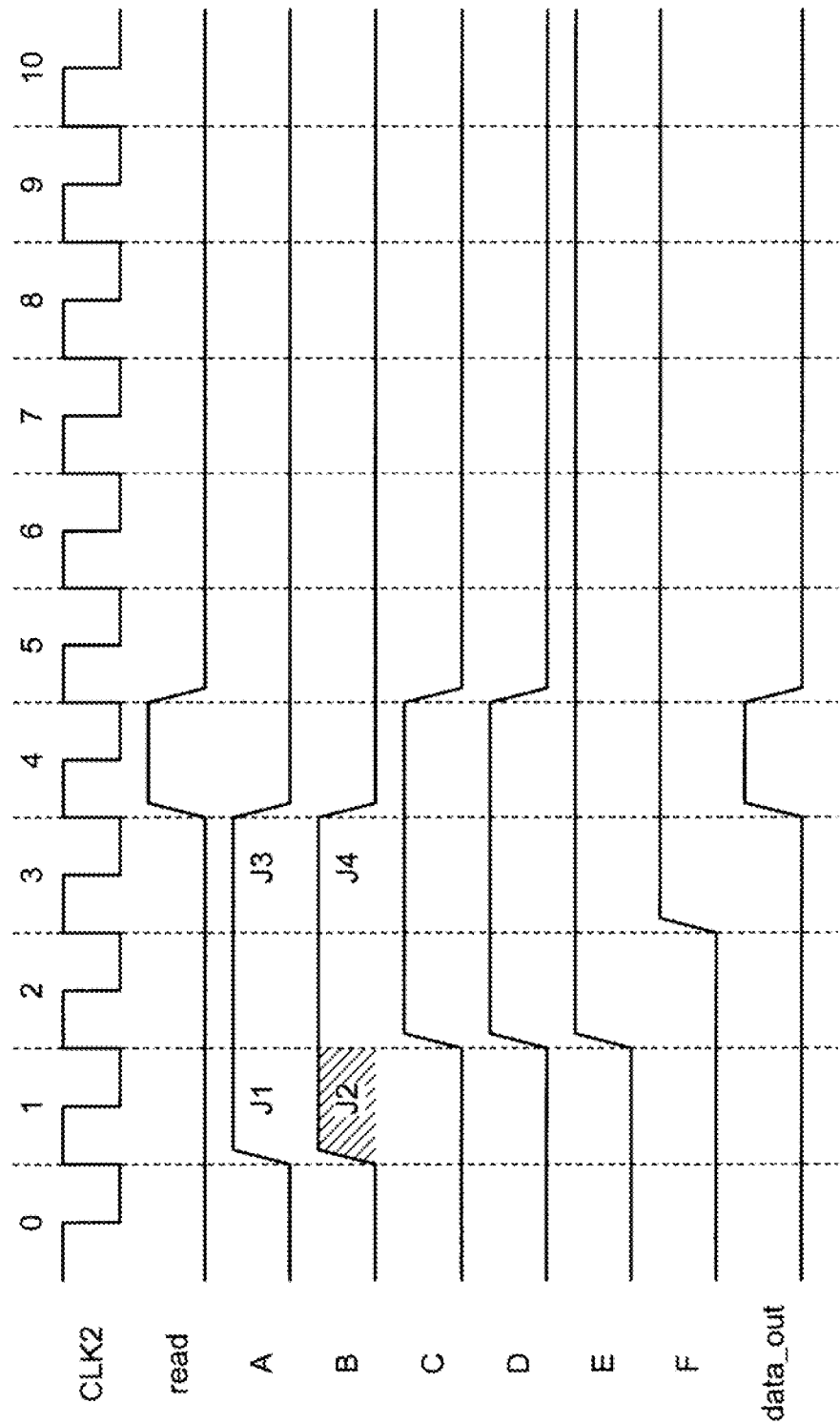
FIG. 23 is a diagram of a simulation result for Q2.

FIG. 23 is a diagram of a simulation result for Q2. The comparing unit 1904 of the verification support apparatus 1900 compares the simulation result for Q2 and the simulation result for Q0, and determines that the simulation results are identical since data_out becomes 1 at the fourth clock in both simulation results. The identifying unit 1905 of the verification support apparatus 1900 identifies that the effect due to J2 is not propagated to data_out since the simulation result has changed according to the change in the logic value of J2.

The selecting unit 1902 of the verification support apparatus 1900 selects J3 from the CDC jitters (J1 to J4). The setting unit 1903 of the verification support apparatus 1900 sets the logic value of the selected J3 to a logic value different from that of Q0. The execution pattern after the setting is Q3=(1, 0, 0, 1). The verification support apparatus 1900 executes a simulation such that the logic values of CDC jitters become Q3.

Figure 24:
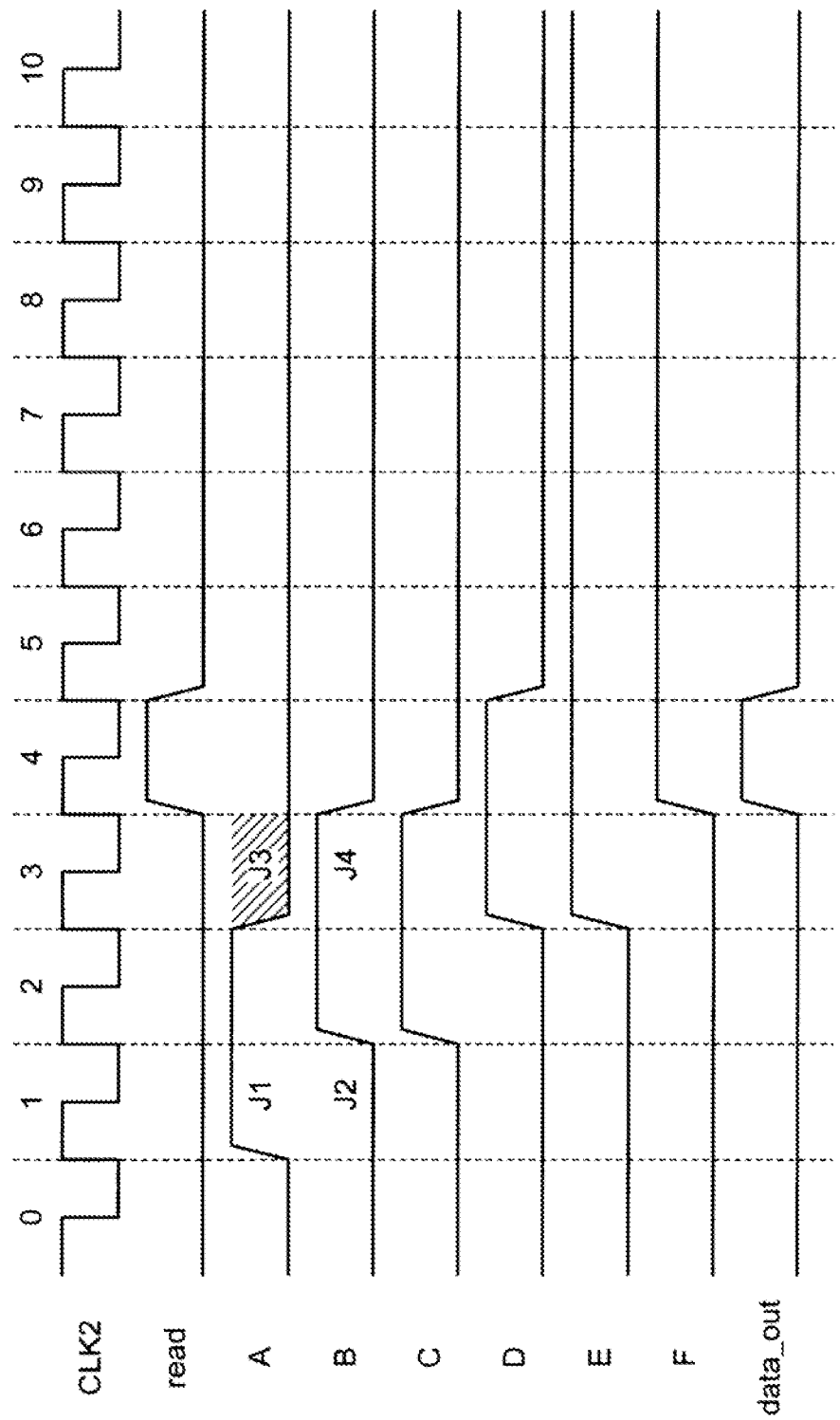
FIG. 24 is a diagram of a simulation result for Q3.

FIG. 24 is a diagram of a simulation result for Q3. The comparing unit 1904 of the verification support apparatus 1900 compares the simulation result for Q3 and the simulation result for Q0, and determines that the simulation results are identical since data_out becomes 1 at the fourth clock in both simulation results. The identifying unit 1905 of the verification support apparatus 1900 identifies that the effect due to J3 is not propagated to data_out since the simulation result has changed according to the change in the logic value of J3.

The verification support apparatus 1900 selects J4 from the CDC jitters (J1 to J4), and sets the logic value of the selected J4 to a logic value different from that of Q0. The execution pattern after the setting is Q4=(1, 0, 1, 0). The verification support apparatus 1900 executes a simulation such that the logic values of CDC jitters become Q4.

Figure 25:
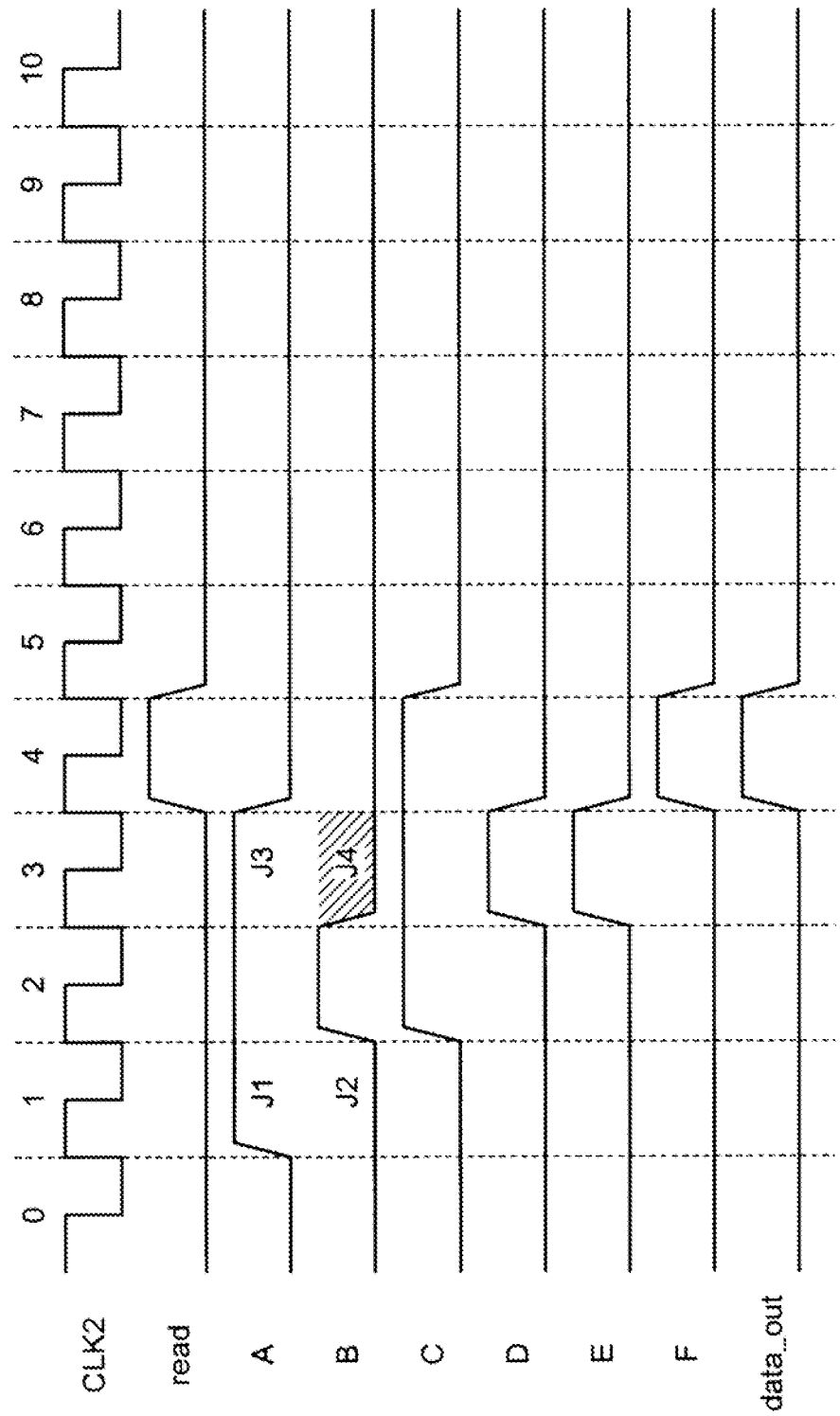
FIG. 25 is a diagram of a simulation result for Q4.

FIG. 25 is a diagram of a simulation result for Q4. The verification support apparatus 1900 compares the simulation result for Q4 and the simulation result for Q0, and determines that the simulation results are identical since data_out becomes 1 at the fourth clock in both simulation results. The identifying unit 1905 of the verification support apparatus 1900 identifies that the effect due to J4 is not propagated to data_out since the simulation result has changed according to the change in the logic value of J4.

FIG. 26 is a diagram of Q0 to Q4. All combinations of the logic values of J1 to J4 are listed in a table 2600. According to the second embodiment, even though there are 2^(the number of CDC jitters combinations), it can easily identified with a reduced number of simulations whether the effect of each CDC jitter is propagated to the observation point for an input pattern.

Figure 27:
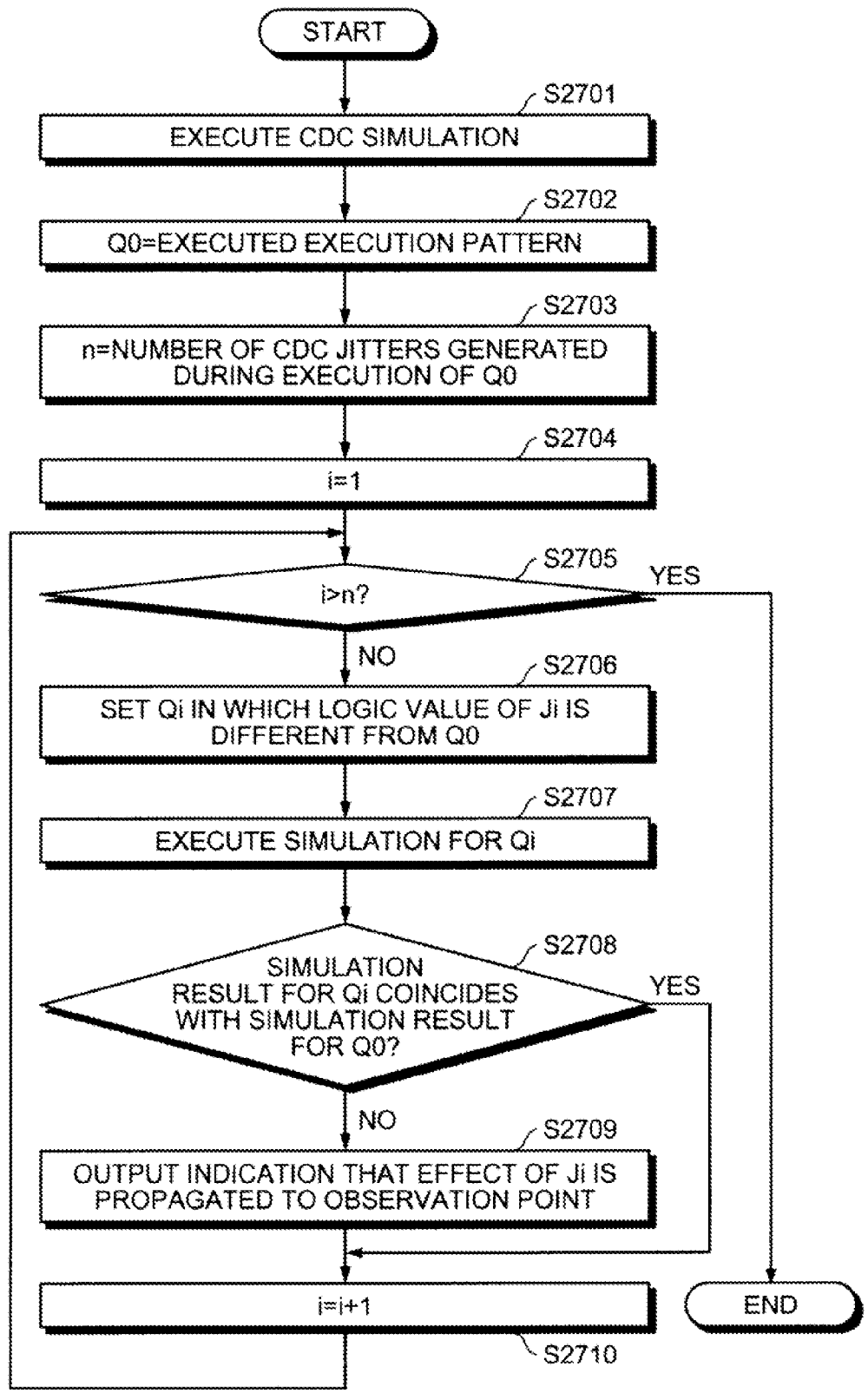
FIG. 27 is a flowchart of an example of a verification support process performed by the verification support apparatus according to the second embodiment.

FIG. 27 is a flowchart of an example of a verification support process performed by the verification support apparatus 1900 according to the second embodiment. The verification support apparatus 1900 executes a CDC simulation (step S2701), and sets Q0 to the executed execution pattern (step S2702). The verification support apparatus 1900 sets n to the number of CDC jitters generated during the execution of Q0 (step S2703), and sets i to 1 (step S2704).

The verification support apparatus 1900 determines whether i exceeds n (step S2705), and if not (step S2705: NO), sets Qi in which the logic value of Ji is different from Q0 (step S2706), and executes a simulation for Qi (step S2707). The verification support apparatus 1900 determines whether the simulation result for Qi coincides with the simulation result for Q0 (step S2708).

If the verification support apparatus 1900 determines that the simulation result for Qi does not coincide with the simulation result for Q0 (step S2708: NO), the verification support apparatus 1900 outputs the fact that the effect of Ji is propagated to the observation point (step S2709). The form of output includes, for example, display on the display 308, printout at the printer 313, and/or transmission to an external device via the I/F 309. Alternatively, the fact may be stored to storage such as the RAM 303, the magnetic disk 305, and the optical disk 307.

The verification support apparatus 1900 increments i (step S2710), and the process returns to step S2705. If the verification support apparatus 1900 determines that the simulation result for Qi does not coincide with the simulation result for Q0 (step S2708: YES), or if the verification support apparatus 1900 determines i exceeds n (step S2705: YES), the sequence of processes ends.

In the third embodiment, an example of a simulation is described in which, for any 3 CDC jitters selected from the CDC jitters, combinations of the logic values of the selected 3 CDC jitters are covered. Since there are thousands or 10 thousands of CDC jitters, verification requires time to cover the combinations of logic values of thousands or 10 thousands of CDC jitters. For example, there are 2^(1000) ("^" indicates an exponent) combinations of logic values of CDC jitters if there are 1000 CDC jitters.

The number of CDC jitters that cause an error in a CDC simulation using a given input pattern is about 2 to 3. However, it is not clear which CDC jitter causes the error among thousands or 10 thousands of CDC jitters. In the third embodiment, only combinations of the logic values of any 3 CDC jitters selected by a verifier are verified, thereby reducing the time required for verification.

In the third embodiment, components similar to those of the first and the second embodiments are assigned the same reference numerals used in the first and the second embodiments, and description is omitted. It is assumed that the verification support apparatus according to the third embodiment is identical to the verification support apparatus 1900 described in the second embodiment. Here, only operations of the setting unit 1903 to the identifying unit 1905 different from those of the second embodiment are described.

For each selection by the selecting unit 1902, the setting unit 1903 sets, to a different logic value, only an output value selected by the selecting unit from among a group of CDC jitter logic values that are each different from those of the first simulation result.

The comparing unit 1904 compares a simulation result for the group of CDC jitter logic values that are each are different from those of the first simulation result and a simulation result obtained after the setting by the setting unit 1903.

The identifying unit 1905 identifies that the effect of the selected CDC jitter is propagated to the observation point, if the comparing unit 1904 determines that the simulation result after the setting does not coincide with the simulation result. With consideration of the above, details are described below.

FIG. 28 is a diagram of Q0 to Q4 and Q0' to Q4'. Values of J1 to J4 for each of Q0 to Q4 and Q0' to Q4' are depicted in a table 2800. Q0 to Q4 are described in the second embodiment, and thus description is omitted. The setting unit 1903 of the verification support apparatus sets an execution pattern in which logic values of all of J1 to J4 are different from Q0. The execution pattern after the setting is Q0'=(0, 1, 0, 0). The verification support apparatus executes a simulation for Q0', and outputs the result of execution.

The verification support apparatus selects each of the CDC jitters J1 to J4 sequentially. Each time the verification support apparatus selects a logic value, the verification support apparatus sets the selected logic value, in the new execution pattern, to a logic value different from that selected in Q0'. New execution patterns are Q1' to Q4'.

The comparing unit 1904 of the verification support apparatus compares a simulation result for each of the new execution patterns and the simulation result for Q0', and the identifying unit 1905 identifies whether the effect of each CDC jitter logic value is propagated. Simulations of 10 execution patterns Q0 to Q4 and Q0' to Q4' enable coverage all of $2^{(3)}$ execution patterns for any combinations of 3 CDC jitters arbitrarily selected from among J1 to J4.

FIG. 29 is a diagram of examples in which 3 CDC jitters are selected. In the example (1) in which J1, J2, and J3 are selected from among J1 to J4, all patterns from (J1, J2, J3)=(0, 0, 0) to (1, 1, 1) are covered. In the example (2) in which J1, J2, and J4 are selected, all patterns (J1, J2, J4)=(0, 0, 0) to (1, 1, 1) are covered.

In the example (3) in which J1, J3, and J4 are selected, all patterns from (J1, J3, J4)=(0, 0, 0) to (1, 1, 1) are covered. In the example (4) in which J2, J3, and J4 are selected, all patterns (J2, J3, J4)=(0, 0, 0) to (1, 1, 1) are covered.

Figure 30:
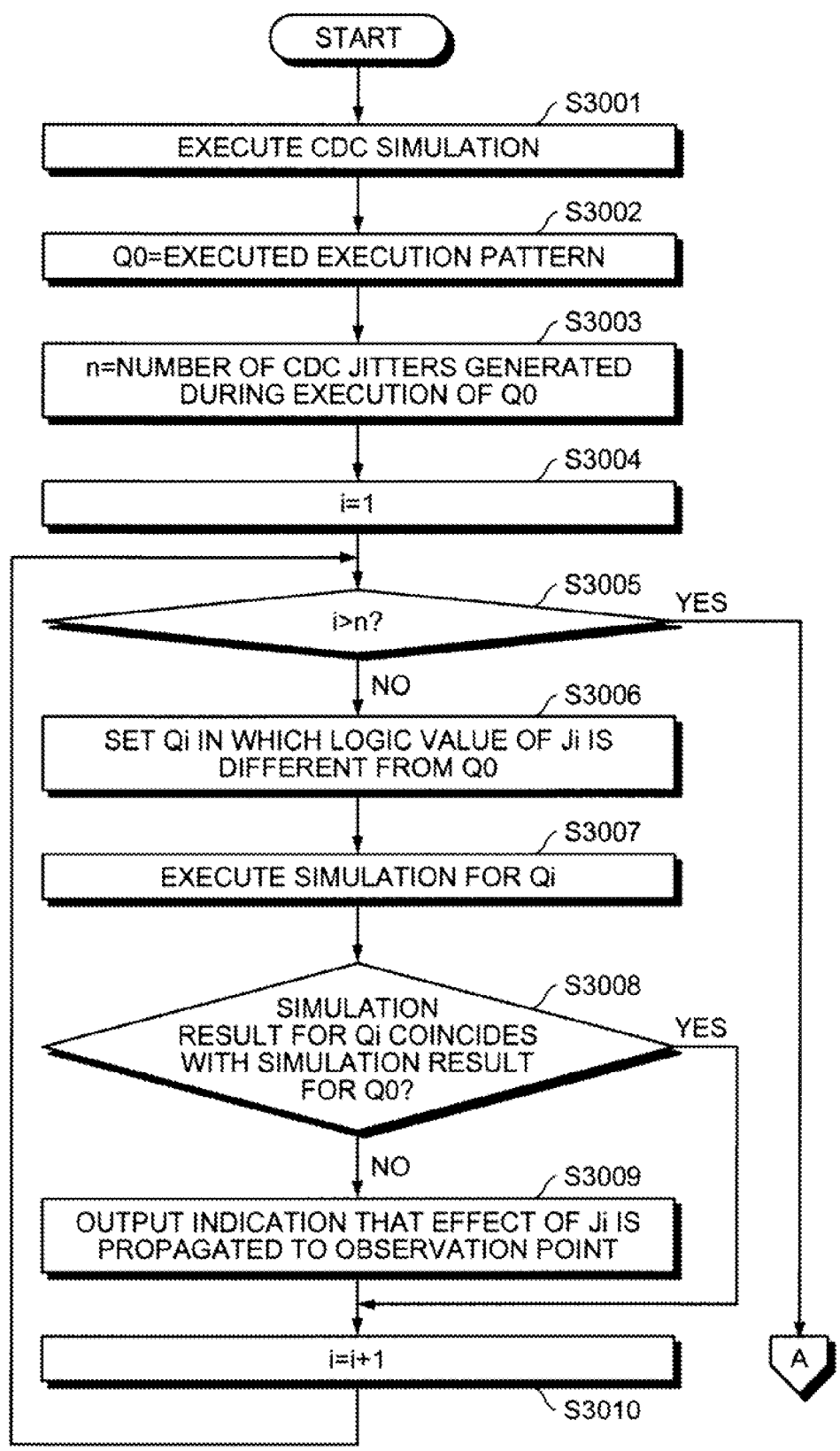
FIGS. 30 and 31 are flowcharts of an example of a verification support process performed by the verification support apparatus according to a third embodiment.
Figure 31:
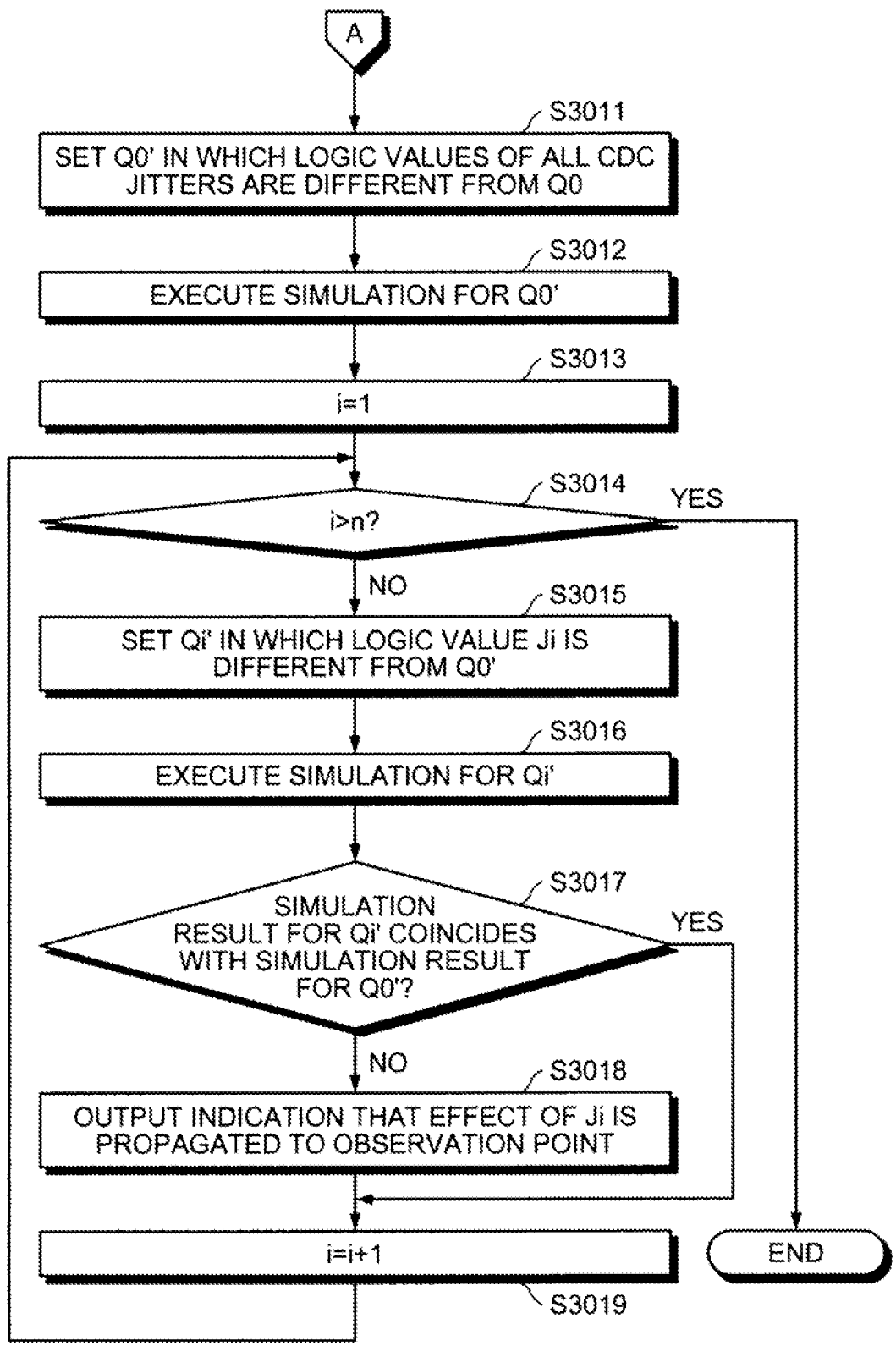

FIGS. 30 and 31 are flowcharts of an example of a verification support process performed by the verification support apparatus according to the third embodiment. The verification support apparatus executes a CDC simulation (step S3001), and sets Q0 to the executed execution pattern (step S3002). The verification support apparatus sets n to the number of CDC jitters generated during the execution of Q0 (step S3003), and sets i to 1 (step S3004).

The verification support apparatus determines whether i exceeds n (step S3005), and if not (step S3005: NO), sets Qi in which the logic value of Ji is different from Q0 (step S3006), and executes a simulation for Qi (step S3007). The verification support apparatus determines whether the simulation result for Qi coincides with the simulation result for Q0 (step S3008).

If the verification support apparatus determines that the simulation result for Qi does not coincide with the simulation result for Q0 (step S3008: NO), the verification support apparatus outputs indication that the effect of Ji is propagated to the observation point (step S3009). The form of output includes, for example, display on the display 308, printout at the printer 313, and/or transmission to an external device via the I/F 309. Alternatively, the output may be stored to storage such as the RAM 303, the magnetic disk 305, and the optical disk 307.

The verification support apparatus increments i (step S3010), and the process returns to step S3005. If the verification support apparatus determines that the simulation result for Qi coincides with the simulation result for Q0 (step S3008: YES), the process returns to step S3010. If the verification support apparatus determines i exceeds n (step S3005: YES), the verification support apparatus sets Q0' in which all logic values of CDC jitter are different from Q0 (step S3011). The verification support apparatus executes a simulation for Q0' (step S3012), sets i to 1, and determines whether i exceeds n (step S3014).

If the verification support apparatus determines i does not exceed n (step S3014: NO), the verification support apparatus sets the execution pattern Qi' in which the logic value of the CDC jitter Ji is different from Q0' (step S3015), and executes a simulation for Qi' (step S3016). The verification support apparatus determines whether the simulation result for Qi' coincides with the simulation result for Q0' (step S3017).

If not (step S3017: NO), the verification support apparatus outputs indication that the effect of Ji is propagated to the observation point (step S3018). The verification support apparatus increments i (step S3019), and the process returns to step S3014. If the verification support apparatus determines that the simulation result for Qi' coincides with the simulation result for Q0' (step S3017: YES), the process proceeds to step S3019. If the verification support apparatus determines i exceeds n (step S3014: YES), the sequence of processes ends.

In the fourth embodiment, an example of a simulation is described in which simulation results for execution patterns having only one different bit according to the first to the third embodiments can be obtained without simulating common portions again. For example, in the fourth embodiment, only portions different from a given execution pattern are simulated using the simulation result for the given execution pattern to obtain simulation results for remaining execution patterns, instead of simulating 5 execution patterns having only one different bit independently for 5 times.

Concurrent simulation to avoid recalculation of common portions by concurrently executing simulations of N circuit data that are similar to each other is commonly known, and thus description is omitted. See, for example, E. G. Ulrich and T. Baker "The Concurrent Simulation of Nearly Identical Digital Networks" in Proc. 10th Design Automation Workshop, 1973, pp. 145-150.

Figure 32:
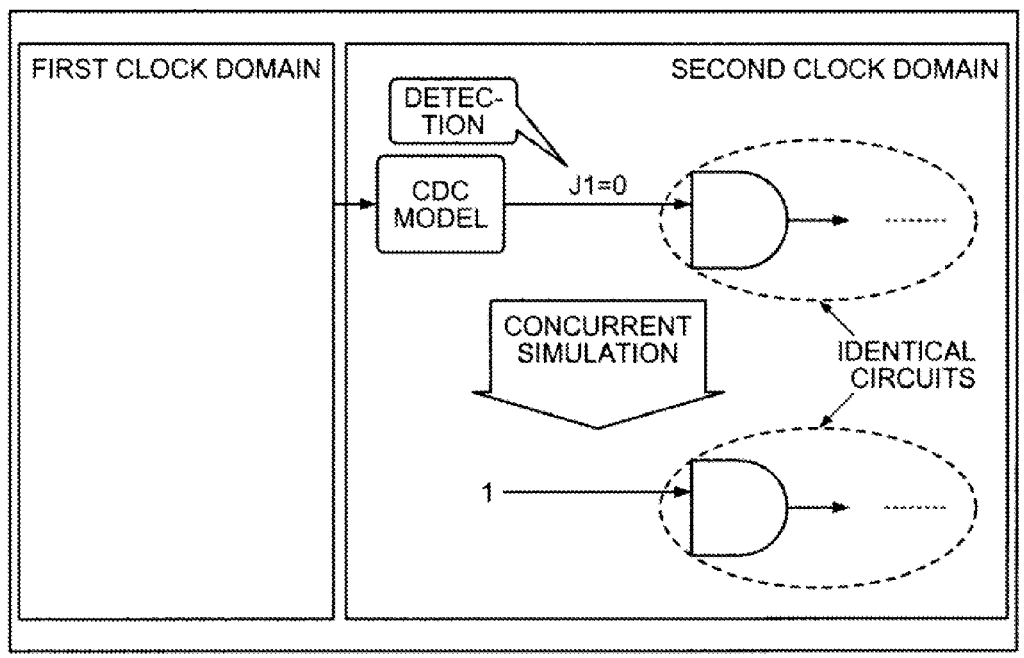
FIG. 32 is a diagram of an example of a fourth embodiment.

FIG. 32 is a diagram of an example of the fourth embodiment. A verifying apparatus detects a CDC jitter is output from a CDC model in a logic simulation using a given input pattern. Upon detecting the CDC jitter, the verifying apparatus provides a logic value different from that of the CDC jitter to circuits downstream of the CDC model and circuits identical thereto to execute a concurrent simulation, and outputs the result of execution after the completion of the execution of the concurrent simulation.

Figure 33:
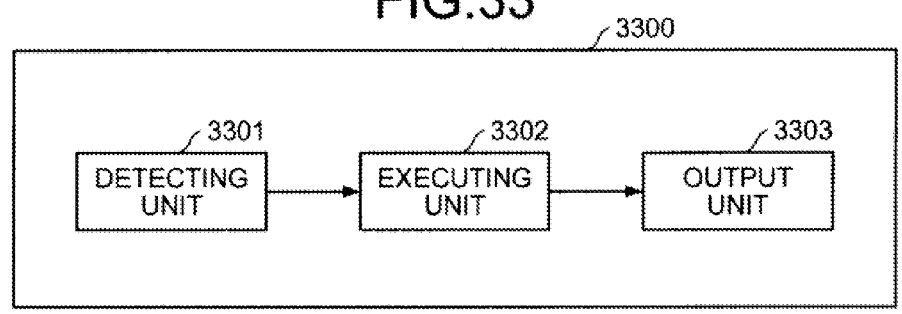
FIG. 33 is a functional block diagram of the verifying apparatus.

FIG. 33 is a functional block diagram of the verifying apparatus. A verifying apparatus 3300 includes a detecting unit 3301, an executing unit 3302, and an output unit 3303. The detecting unit 3301 to the output unit 3303 may be included in, for example, the logic simulator. It is assumed that the detecting unit 3301 to the output unit 3303 are coded in, for example, a program for logic simulation having a function of concurrent simulation. The CPU reads the program for logic simulation stored in the storage such as the ROM 302, the RAM 303, the magnetic disk 305, and the optical disk 307 depicted in FIG. 3, and executes processes coded in the program for logic simulation, thereby executing processes of the detecting unit 3301 to the output unit 3303.

Circuit data of the circuit-under-test include the first clock domain and the second clock domain that receives a signal from the first clock domain asynchronously. In a simulation in which a given input pattern is provided to the circuit data, the detecting unit 3301 detects an output of a CDC jitter from an element that receives the signal in the second clock domain.

The executing unit 3302 executes, if the detecting unit 3301 detects the CDC jitter, a concurrent simulation in which a logic value different from that of the detected CDC jitter is provided to circuits downstream of the element in the circuit-under-test. The output unit 3303 outputs the result of execution by the executing unit 3302.

Figure 34:
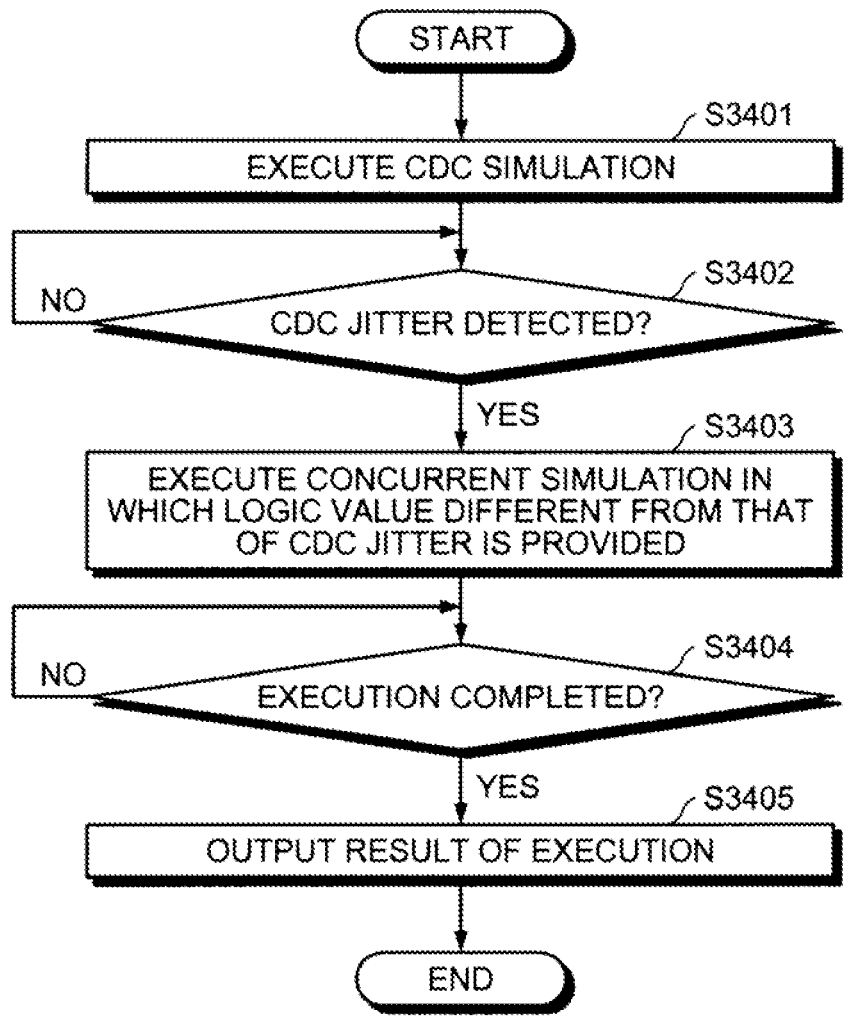
FIG. 34 is a flowchart of an example of a verification process performed by the verifying apparatus.

FIG. 34 is a flowchart of an example of a verification process performed by the verifying apparatus 3300. The verifying apparatus 3300 executes a CDC simulation (step S3401), and determines whether CDC jitter is detected (step S3402). If not (step S3402: NO), the process returns to step S3402. If the verifying apparatus 3300 determines CDC jitter is detected (step S3402: YES), the verifying apparatus 3300 executes a concurrent simulation in which a logic value different from that of the detected CDC jitter is provided (step S3403).

The verifying apparatus 3300 determines whether the execution has been completed (step S3404), and if not (step S3404: NO), the process returns to step S3404. If the verifying apparatus 3300 determines the execution has been completed (step S3404: YES), the verifying apparatus 3300 outputs the result of execution (step S3405), and the sequence of processes ends. The form of output includes, for example, display on the display 308, printout at the printer 313, and/or transmission to an external device via the I/F 309. Alternatively, the result of execution may be stored to storage such as the RAM 303, the magnetic disk 305, and the optical disk 307.

A detailed example of the concurrent simulation is described using P0 to P4 for the input pattern 1 used in the first embodiment. In the fourth embodiment, same components as those of the first to the third embodiments are assigned the same signs, and description is omitted. Here, the simulation result for P0 is taken as a reference, and only models where the result is different from P0 are changed, thereby calculating simulation results from P1 to P4 concurrently. The difference between P0 and P1 is the logic value of J1 that is the value of A at the first clock. The difference between P0 and P2 is the logic value of J2 that is the value of B at the first clock. The difference between P0 and P3 is the logic value of J3 that is the value of A at the third clock. The difference between P0 and P4 is the logic value of J4 that is the value of B at the third clock.

The verifying apparatus 3300 copies circuit data, and causes elements (hereinafter, "reference models") included in each of the copied circuit data to operate at each rise of the clock based on the simulation result for P0. Each time a CDC jitter is generated, elements (CDC effect models) to which logic values different from those of the CDC jitters of the reference model are added. The difference between the reference model and the CDC effect model is taken as a simulation result for a case where the logic value of an arbitrary CDC jitter is different from P0.

Figure 35:
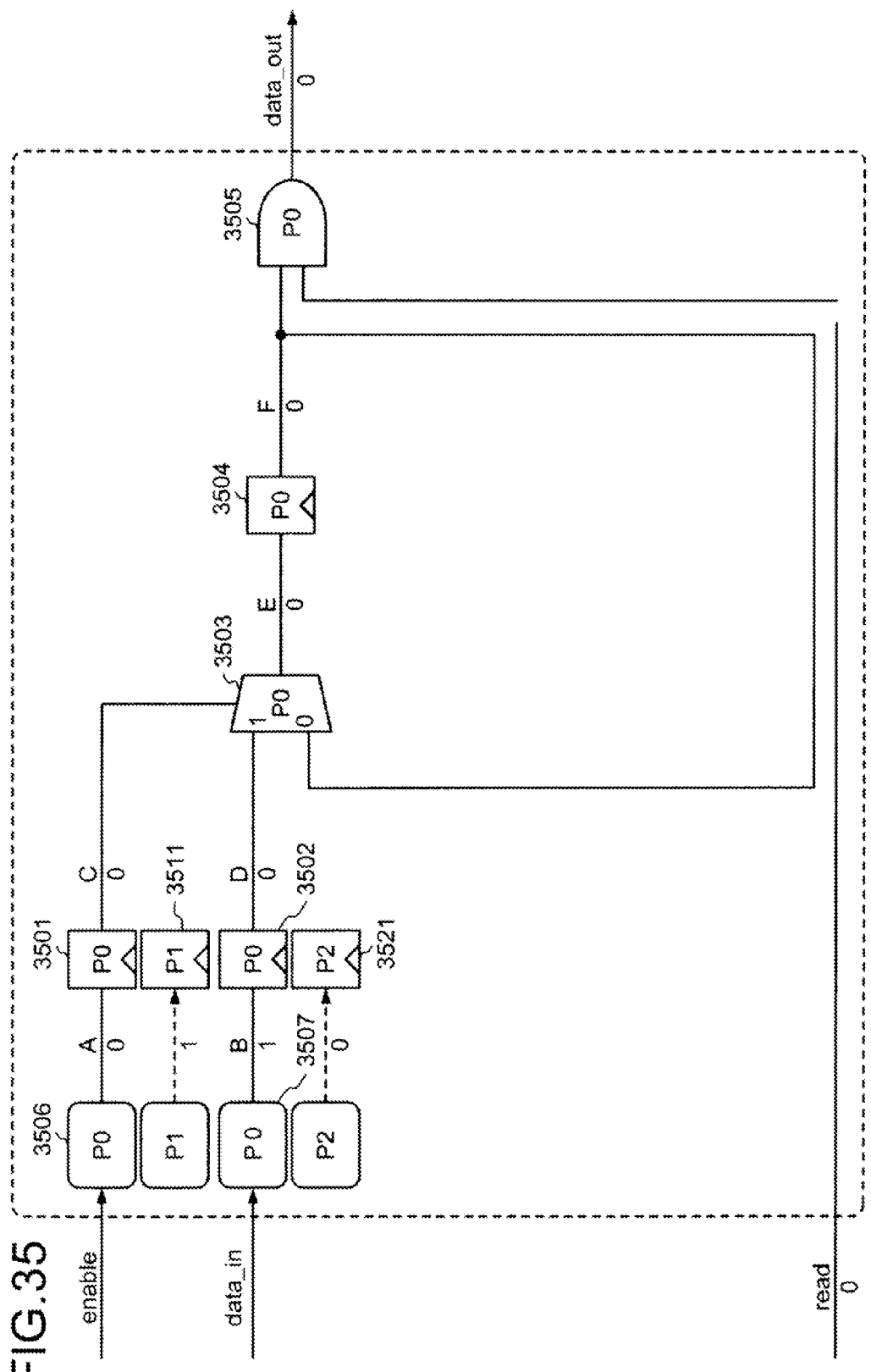
FIG. 35 is a diagram of an example of a process at a first clock according to the fourth embodiment.

FIG. 35 is a diagram of an example of a process at the first clock according to the fourth embodiment. Models marked as P0 in the figure are the reference models. CLK2 (not depicted) is input to each FF as the clock. Upon detecting the rise of the first clock, the verifying apparatus 3300 updates values of all FFs that operate according to the rise of the first clock, thereby causing the value of C output from the FF 3501 to be 0, the value of D output from the FF 3502 to be 0, and the value of F output from the FF 3504 to be 0.

The verifying apparatus 3300 adds CDC effect models for CDC jitter. For example, the verifying apparatus 3300 copies circuit data for components from a CDC model 3506 to a next FF 3501 as CDC effect models for J1. Here, an FF 3511 having the data input J1=1 is inserted as the CDC effect model for J1. The CDC effect models for J1 in FIG. 35 are marked as P1 since the execution pattern in which the logic value of J1 is different from P0 is P1.

The verifying apparatus 3300 copies circuit data between a CDC model 3507 and a next FF as CDC effect models for J2. For example, an FF 3521 having the data input J2=0 is inserted as the CDC effect model for J2. The CDC effect models for J2 in FIG. 35 are marked as P2 since the execution pattern in which the logic value of J2 is different from P0 is P2. CDC effect models for J3 and J4 are not added since J3 and J4 are not generated at the first clock.

The verifying apparatus 3300 updates signal values of combination circuits, thereby causing E output from a selection circuit 3503 to be 0, and data_out output from an AND circuit 3505 to be 0.

The verifying apparatus 3300 deletes, from among elements of each CDC effect model (elements marked as P1 or P2), an element having values identical to those of a corresponding element of the reference models (elements marked as P0). Here, none of the CDC effect models is deleted since none of the CDC effect models has identical values as the reference model.

The verifying apparatus 3300 outputs the difference between the outputs of the CDC effect models and the reference models. The form of output includes, for example, display on the display 308, printout at the printer 313, and/or transmission to an external device via the I/F 309. Alternatively, the difference may be stored to storage such as the RAM 303, the magnetic disk 305, and the optical disk 307.

Figure 36:
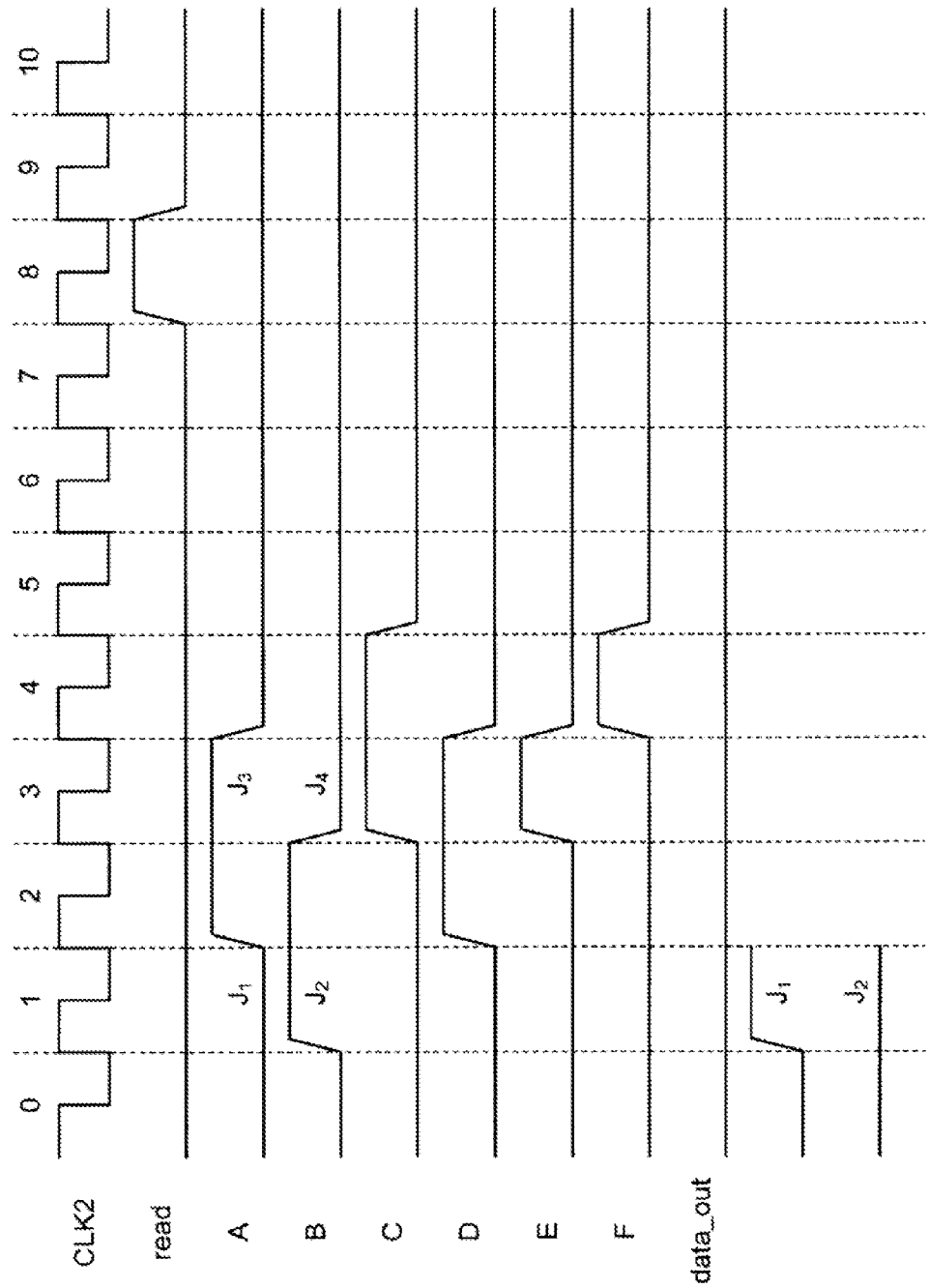
FIG. 36 is an example of output results at the first clock.

FIG. 36 is an example of output results at the first clock. The value output from the FF 3511 is 0 at the 0th clock similar to the value of C output from the FF 3501, and 1 at the first clock. The value output from the FF 3521 is 0 at the 0th clock similar to the value of D output from the FF 3502, and 0 at the first clock.

Figure 37:
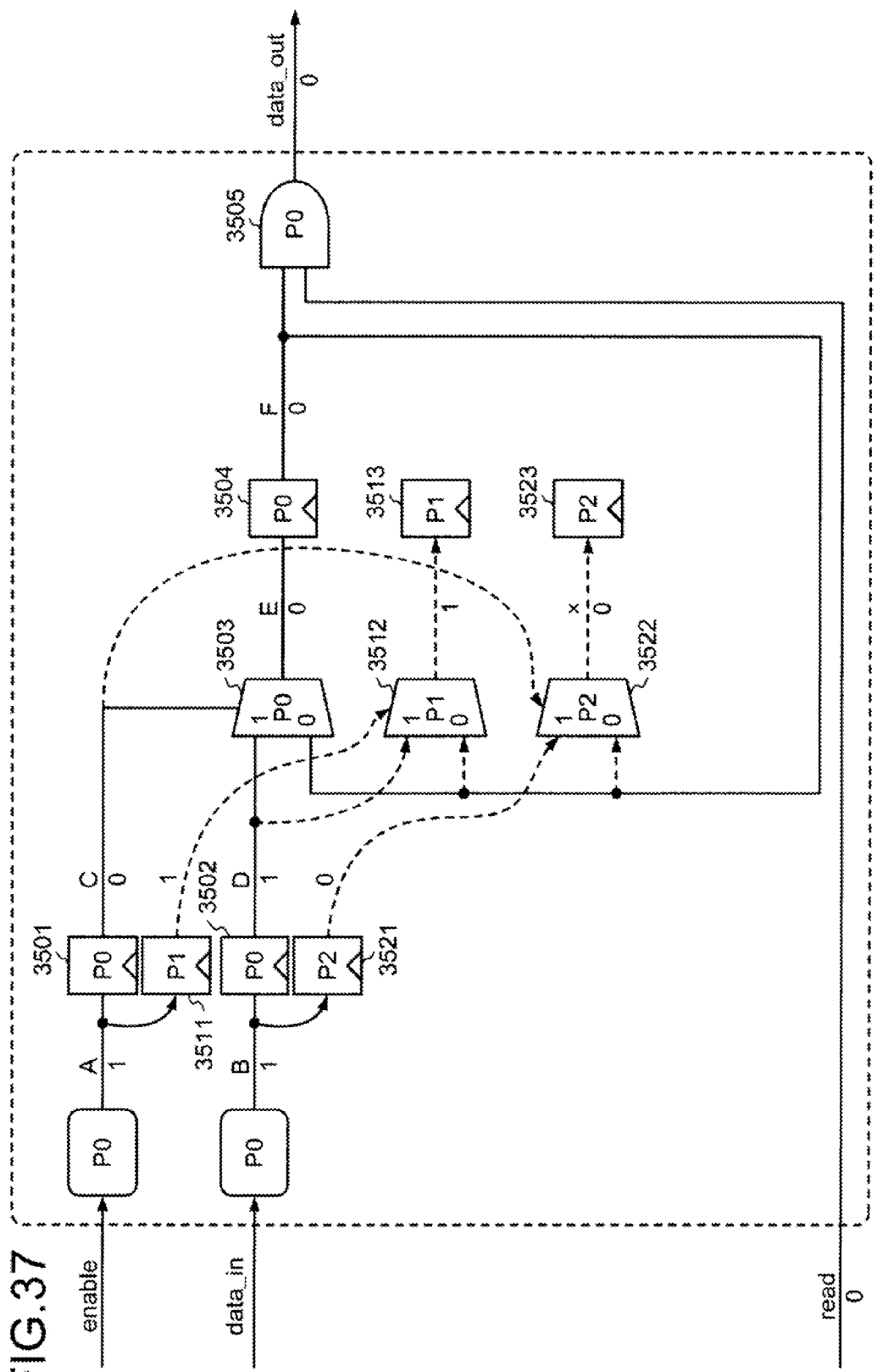
FIG. 37 is a diagram of an example of a process at a second clock according to the fourth embodiment.

FIG. 37 is a diagram of an example of a process at the second clock according to the fourth embodiment. Upon detecting the rise of the second clock, the verifying apparatus 3300 updates the values output from all FFs that operation upon the rise of the second clock, thereby causing the value of C output from the FF 3501 to be 0, the value of D output from the FF 3502 to be 1, and the value of F output from the FF 3504 to be 0. Among the CDC effect models for J1 (elements marked as P1), the value output from the FF 3511 becomes 1. Among the CDC effect models for J2 (elements marked as P2), the value output from the FF 3521 becomes 0.

The verifying apparatus 3300 adds CDC effect models for the CDC jitter J1. For example, the verifying apparatus 3300 copies circuit data between the FF 3501 corresponding to the FF 3511 and the next FF 3504, and provides the output of the FF 3511 to the copied circuits. Thus, a selection circuit 3512 and an FF 3513 are added.

The verifying apparatus 3300 adds CDC effect models for the CDC jitter J2. For example, the verifying apparatus 3300 copies circuit data between the FF 3502 corresponding to the FF 3521 and the next FF 3504, and provides the output of the FF 3521 to the copied circuits. Thus, a selection circuit 3522 and an FF 3523 are added.

The verifying apparatus 3300 updates signal values of the combination circuits, thereby causing E output from the selection circuit 3503 to be 0, and data_out output from the AND circuit 3505 to be 0. Among the CDC effect models for the CDC jitter J1, the value output from the selection circuit 3512 becomes 1. Among the CDC effect models for the CDC jitter J2, the value output from the selection circuit 3522 becomes 0.

The verifying apparatus 3300 deletes, from among elements of each CDC effect model (elements marked as P1 or P2), an element having values identical to those of a corresponding element of the reference models (elements marked as P0) based on whether the value input to and the value output from an element of the CDC effect models are identical to those of an corresponding element of the reference models. For example, the value output from the selection circuit 3522 is identical to that of the selection circuit 3503 corresponding to the selection circuit 3522. However, the value input from the FF 3521 is different from the value input from the FF 3502 corresponding to the FF 3521. Thus, the selection circuit 3522 is not deleted.

The verifying apparatus 3300 outputs the difference between the outputs of the CDC effect models for J1 and the reference models, and the difference between the outputs of the CDC effect models for J2 and the reference models.

Figure 38:
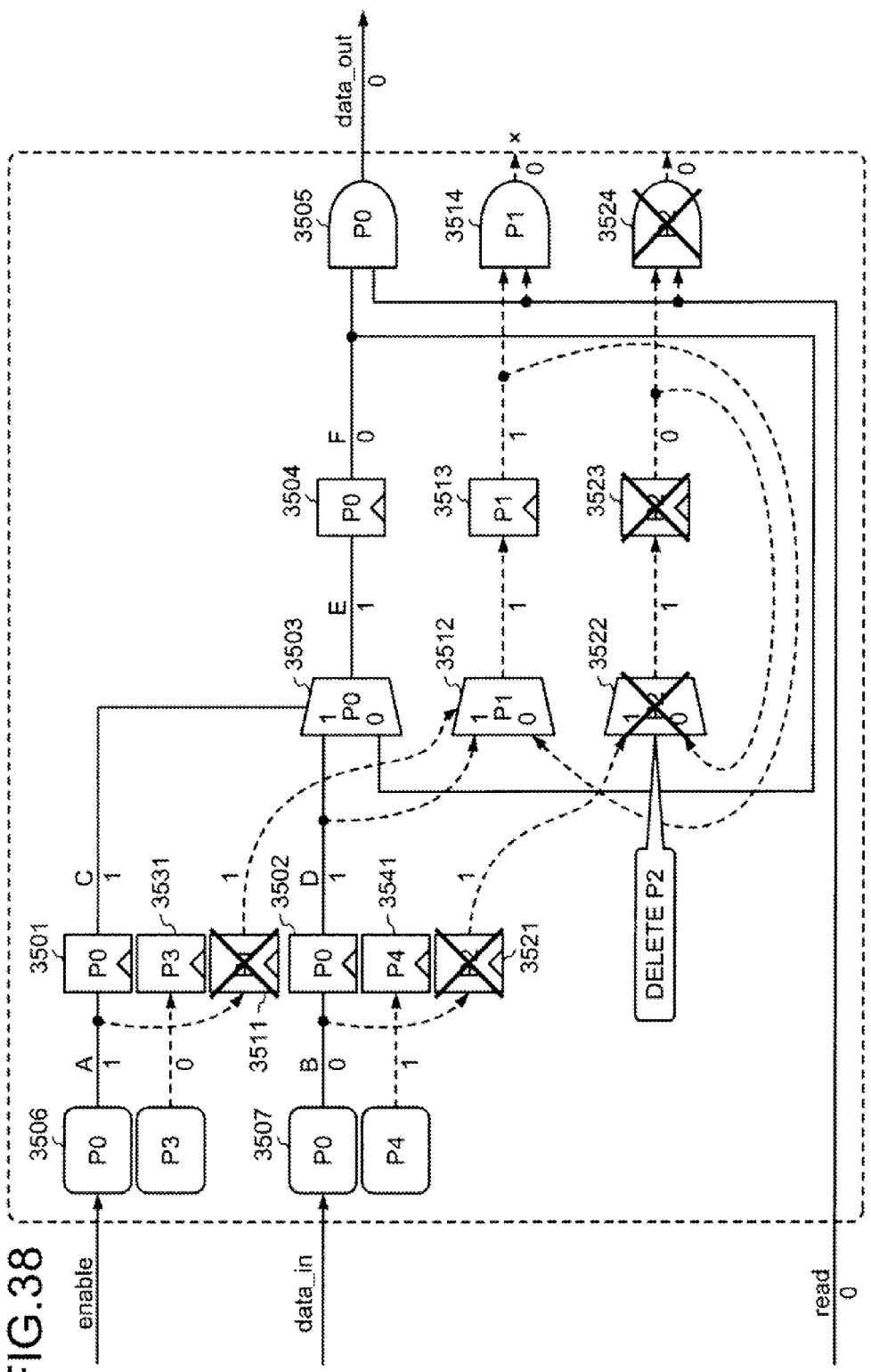
FIG. 38 is a diagram of an example of a process at a third clock according to the fourth embodiment.

FIG. 38 is a diagram of an example of a process at the third clock according to the fourth embodiment. Upon detecting the rise of the third clock, the verifying apparatus 3300 updates the values output from all FFs that operation upon the rise of the third clock, thereby causing the value of C output from the FF 3501 to be 1, the value of D output from the FF 3502 to be 1, and the value of F output from the FF 3504 to be 0. Among the CDC effect models for J1 (elements marked as P1), the value output from the FF 3511 becomes 1 and the value output from the FF 3513 becomes 1. Among the CDC effect models for J2 (elements marked as P2), the value output from the FF 3521 becomes 1 and the value output from the FF 3523 becomes 1.

The verifying apparatus 3300 adds CDC effect models for CDC jitter. For example, the verifying apparatus 3300 copies circuit data between the FF 3504 corresponding to the FF 3513 and the next FF (since there is no next FF in this case, between the FF 3504 and the output terminal) as the CDC effect models for J1, and provides the output of the FF 3513 to the copied circuits. Thus, a selection circuit 3514 to which the output of the FF 3513 is input is added.

The verifying apparatus 3300 copies circuit data between the FF 3504 corresponding to the FF 3523 and the next FF (since there is no next FF in this case, between the FF 3504 and the output terminal) as the CDC effect models for J2, and provides the output of the FF 3523 to the copied circuits. Thus, a selection circuit 3524 to which the output of the FF 3523 is input is added.

The verifying apparatus 3300 copies circuit data between the CDC model 3506 and the next FF 3501 as CDC effect models for J3, and provides a logic value different from the value output from the CDC model 3506 to the copied circuits. Thus, an FF 3531 to which 0 is input is added. The CDC effect models for J3 are marked as P3 since the execution pattern in which the logic value of J3 is different from P0 is P3.

The verifying apparatus 3300 copies circuit data between the CDC model 3507 and the next FF 3502 as CDC effect models for J4, and provides a logic value different from the value output from the CDC model 3507 to the copied circuits. Thus, an FF 3541 to which 1 is input is added. The CDC effect models for J4 are marked as P4 since the execution pattern in which the logic value of J4 is different from P0 is P4.

The verifying apparatus 3300 updates signal values of the combination circuits, thereby causing E output from the selection circuit 3503 to be 1, and data_out output from the AND circuit 3505 to be 0. Among the CDC effect models for the CDC jitter J1, the value output from the selection circuit 3512 becomes 1 and the value output from the AND circuit 3514 becomes 0. Among the CDC effect models for the CDC jitter J2, the value output from the selection circuit 3522 becomes 0 and the value output from the AND circuit 3524 becomes 0.

The verifying apparatus 3300 deletes, from among elements of each CDC effect model (elements marked as any one of P1 to P4), an element having values identical to those of a corresponding element of the reference models (elements marked as P0). Here, all CDC effect models for J2 are deleted (indicated by "X" in the figure) since each element of the CDC effect models for J2 and each element of the reference models have identical values.

Among the CDC effect models for J1, the FF 3511 is deleted since the value input to and the value output from the FF 3511 are identical to those of the FF 3501. The output of the FF 3501 is input to the selection circuit 3512 in place of the output of the FF 3511.

The verifying apparatus 3300 outputs the difference between the outputs of the CDC effect models for J1, J3, J4 and the reference models.

Figure 39:
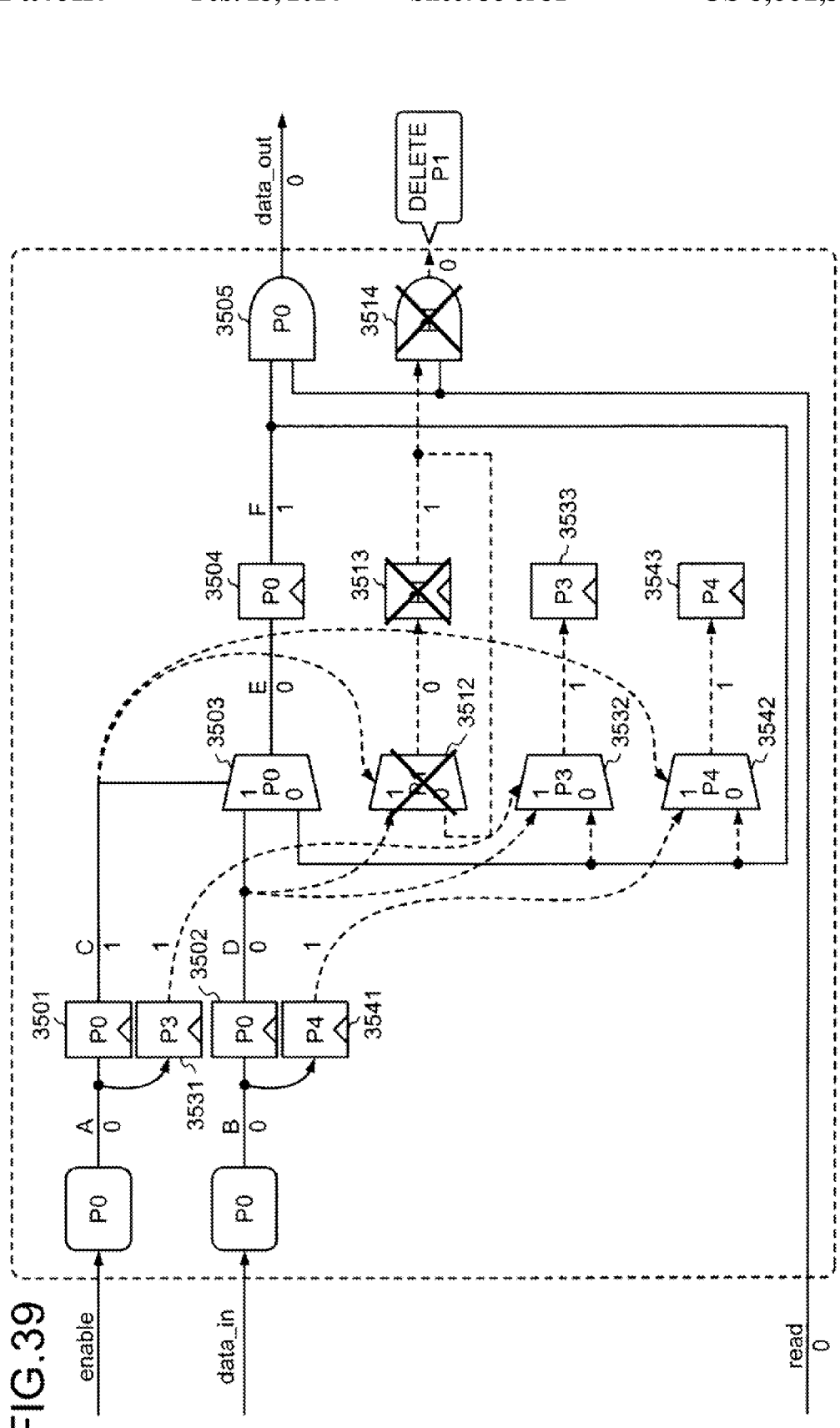
FIG. 39 is a diagram of an example of a process at a fourth clock according to the fourth embodiment.

FIG. 39 is a diagram of an example of a process at the fourth clock according to the fourth embodiment. Upon detecting the rise of the fourth clock, the verifying apparatus 3300 updates the values output from all FFs that operation upon the rise of the fourth clock, thereby causing the value of C output from the FF 3501 to be 1, the value of D output from the FF 3502 to be 0, and the value of F output from the FF 3504 to be 1. Among the CDC effect models for J1 (elements marked as P1), the value output from the FF 3513 becomes 1. Among the CDC effect models for J3 (elements marked as P3), the value output from the FF 3531 becomes 1. Among the CDC effect models for J4 (elements marked as P4), the value output from the FF 3541 becomes 1.

The verifying apparatus 3300 adds CDC effect models for CDC jitter. For example, the verifying apparatus 3300 copies circuit data between the FF 3501 corresponding to the FF 3531 and the next FF 3504 as the CDC effect models for J3, and provides the output of the FF 3531 to the copied circuits. Thus, a selection circuit 3532 and an FF 3533 are added, and the output of the FF 3531 is input to the selection circuit 3532.

The verifying apparatus 3300 copies circuit data between the FF 3502 corresponding to the FF 3541 and the next FF 3504 as the CDC effect models for J4, and provides the output of the FF 3541 to the copied circuits. Thus, a selection circuit 3542 and an FF 3543 are added, and the output of the FF 3541 is input to the selection circuit 3542.

The verifying apparatus 3300 updates signal values of the combination circuits, thereby causing E output from the selection circuit 3503 to be 0, and data_out output from the AND circuit 3505 to be 0. Among the CDC effect models for J1, the value output from the selection circuit 3512 becomes 0 and the value output from the AND circuit 3514 becomes 0. Among the CDC effect models for J3, the value output from the selection circuit 3532 becomes 1. Among the CDC effect models for J4, the value output from the selection circuit 3542 becomes 1.

The verifying apparatus 3300 deletes, from among the CDC effect models for J1, J3, and J4 (elements marked as P1, P3, or P4), a CDC effect model having values identical to the reference model (elements marked as P0). Here, the CDC effect models for J1 are deleted (indicated by "X" in the figure) since the CDC effect models for J1 and the reference models have identical values.

The verifying apparatus 3300 outputs the difference between the outputs of the CDC effect models for J3 and J4 and the reference models.

Figure 40:
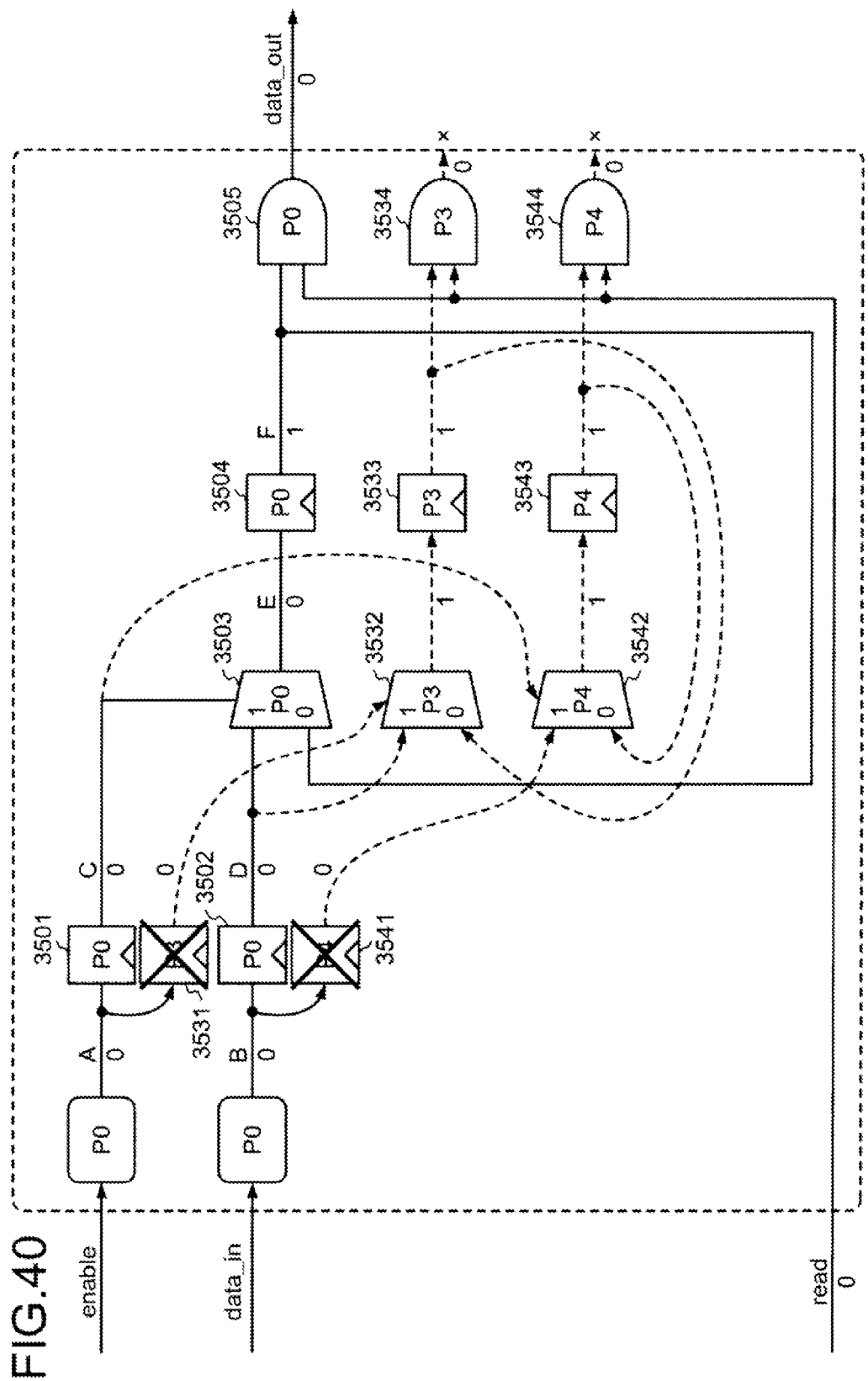
FIG. 40 is a diagram of an example of a process at a fifth clock according to the fourth embodiment.

FIG. 40 is a diagram of an example of a process at the fifth clock according to the fourth embodiment. Upon detecting the rise of the fifth clock, the verifying apparatus 3300 updates the values output from all FFs that operation upon the rise of the fifth clock, thereby causing the value of C output from the FF 3501 to be 0, the value of D output from the FF 3502 to be 0, and the value of F output from the FF 3504 to be 0. Among the CDC effect models for J3 (elements marked as P3), the value output from the FF 3531 becomes 0 and the value output from the FF 3533 becomes 1. Among the CDC effect models for J4 (elements marked as P4), the value output from the FF 3541 becomes 0 and the value output from the FF 3543 becomes 1.

The verifying apparatus 3300 adds CDC effect models for CDC jitter. For example, the verifying apparatus 3300 copies circuit data between the FF 3504 corresponding to the FF 3533 and the next FF (since there is no next FF in this case, between the FF 3504 and the output terminal) as the CDC effect models for J3, and provides the output of the FF 3533 to the copied circuits. Thus, a selection circuit 3534 to which the output of the FF 3533 is input is added.

The verifying apparatus 3300 copies circuit data between the FF 3504 corresponding to the FF 3543 and the next FF (since there is no next FF in this case, between the FF 3504 and the output terminal) as the CDC effect models for J4, and provides the output of the FF 3543 to the copied circuits. Thus, a selection circuit 3544 to which the output of the FF 3543 is input is added.

The verifying apparatus 3300 updates signal values of the combination circuits, thereby causing E output from the selection circuit 3503 to be 0, and data_out output from the AND circuit 3505 to be 0. Among the CDC effect models for J3, the value output from the selection circuit 3532 becomes 1 and the value output from the AND circuit 3534 becomes 0. Among the CDC effect models for J4, the value output from the selection circuit 3542 becomes 1 and the value output from the AND circuit 3544 becomes 0.

The verifying apparatus 3300 deletes, from among each CDC effect model for J3 or J4 (elements marked as P3 or P4), a CDC effect model having values identical to the reference model (elements marked as P0). The FF 3531 is deleted since the value input to and the value output from the FF 3531 are identical to those of the FF 3501. The output of the FF 3501 is input to the selection circuit 3532 in place of the output of the FF 3531. The FF 3541 is deleted since the value input to and the value output from the FF 3541 are identical to those of the FF 3502. The output of the FF 3502 is input to the selection circuit 3542 in place of the output of the FF 3541.

The verifying apparatus 3300 outputs the difference between the outputs of the CDC effect models for J3 and J4 and the reference models.

Figure 41:
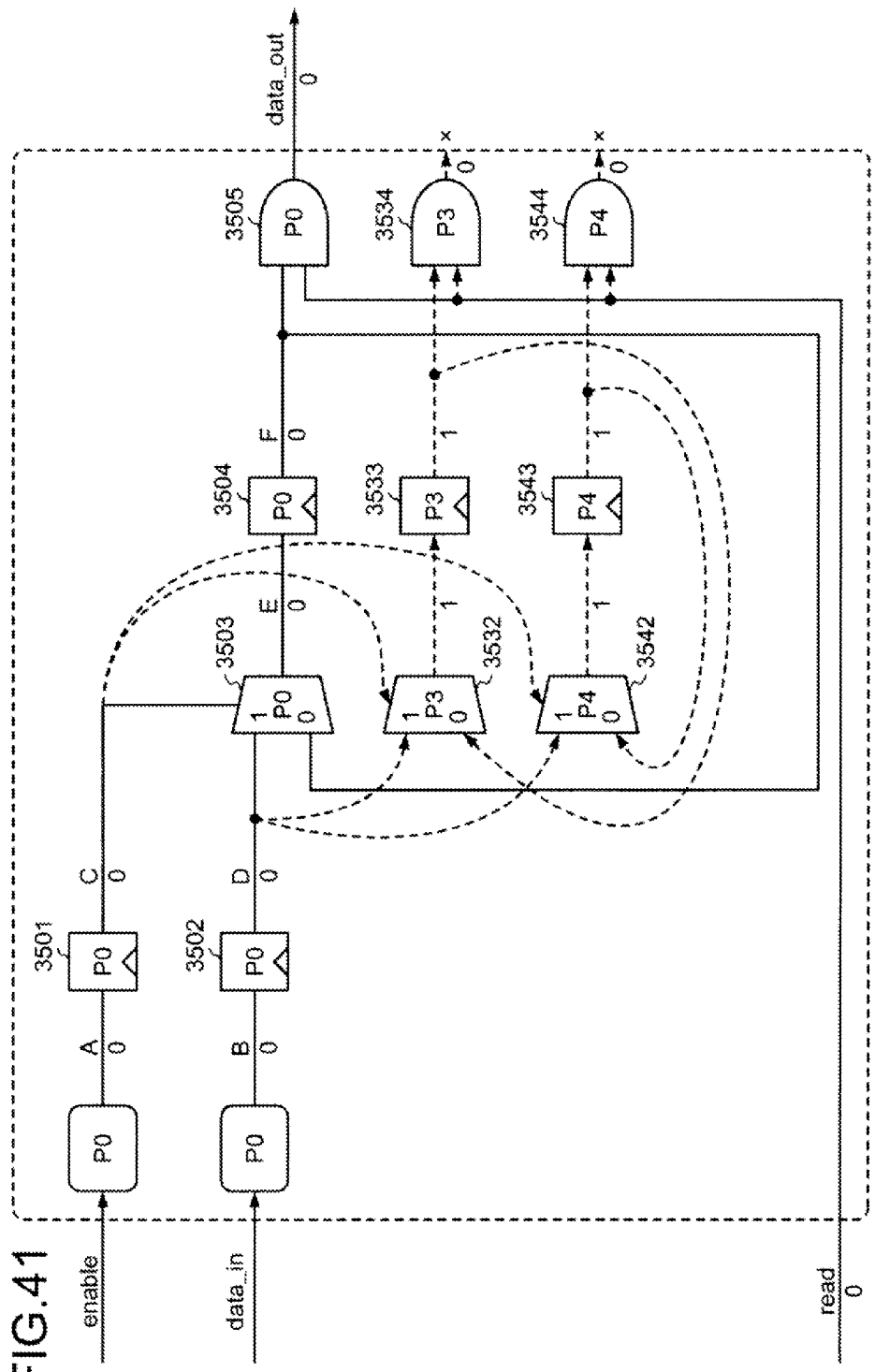
FIG. 41 is a diagram of an example of processes at a sixth clock and a seventh clock according to the fourth embodiment.

FIG. 41 is a diagram of an example of processes at the sixth clock and the seventh clock according to the fourth embodiment. The FF 3531 and the FF 3541 are deleted in FIG. 41. The output of each element of the reference models and the CDC effect models at the sixth clock and the seventh clock are identical to those at the fifth clock, and thus description is omitted.

Figure 42:
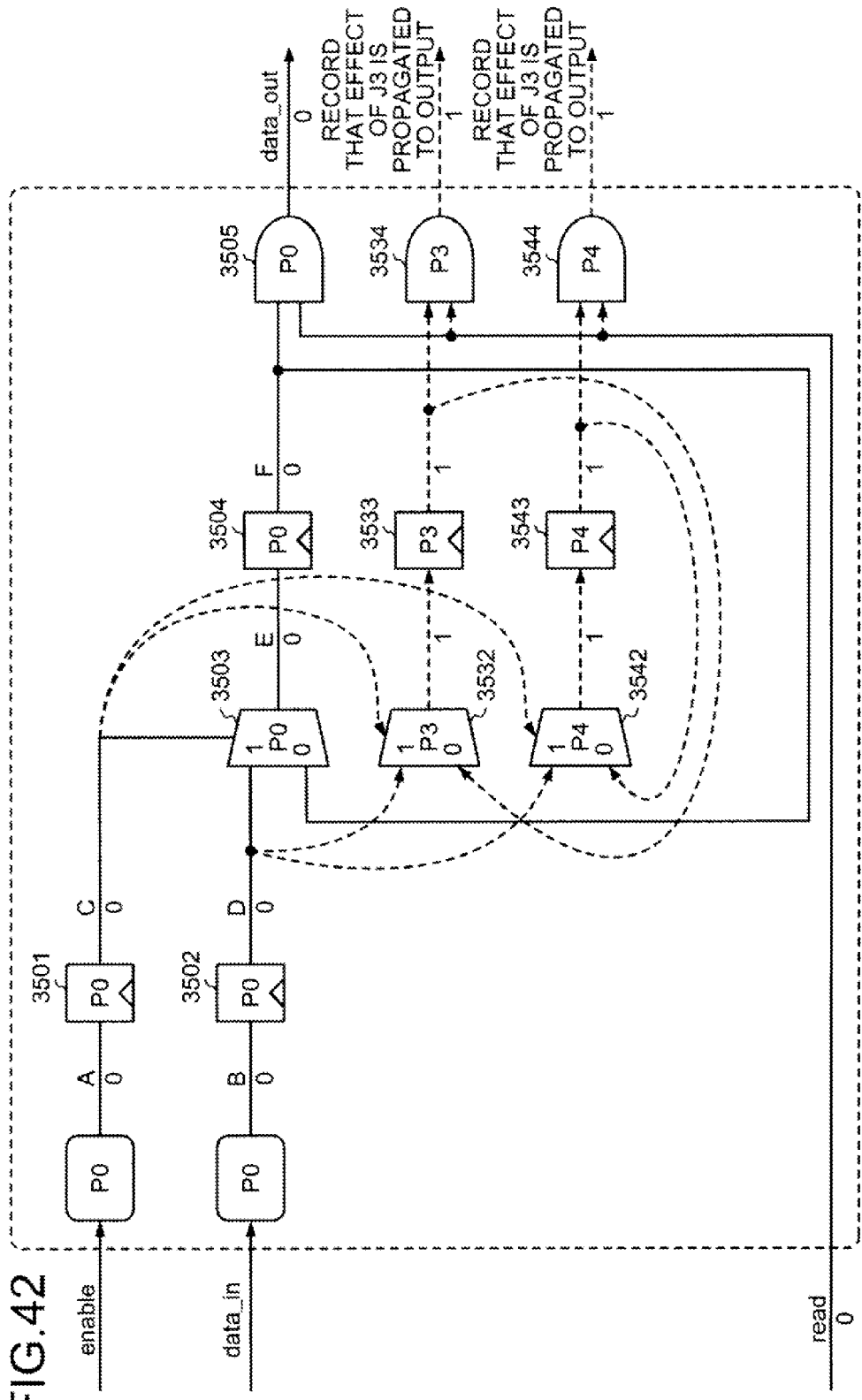
FIG. 42 is a diagram of an example of a process at an eighth clock according to the fourth embodiment.

FIG. 42 is a diagram of an example of a process at the eighth clock according to the fourth embodiment. Upon detecting the rise of the eighth clock, the verifying apparatus 3300 updates the values output from all FFs that operation upon the rise of the eighth clock, thereby causing the value of C output from the FF 3501 to be 0, the value of D output from the FF 3502 to be 0, and the value of F output from the FF 3504 to be 0. Among the CDC effect models for J3 (elements marked as P3), the value output from the FF 3533 becomes 1. Among the CDC effect models for J4 (elements marked as P4), the value output from the FF 3543 becomes 1.

The verifying apparatus 3300 adds CDC effect models for CDC jitter. No element is added here since the CDC effect models for J3 and J4 have been already added up to the output terminal.

The verifying apparatus 3300 updates signal values of the combination circuits, thereby causing E output from the selection circuit 3503 to be 0, and data_out output from the AND circuit 3505 to be 0. Among the CDC effect models for J3, the value output from the selection circuit 3533 becomes 1 and the value output from the AND circuit 3534 becomes 1. Among the CDC effect models for J4, the value output from the selection circuit 3543 becomes 1 and the value output from the AND circuit 3544 becomes 1.

The observation point is the output terminal. The values output from the output terminals of the CDC effect models for J3 and J4 are 1, whereas the value output from the output terminal (data_out) of the reference models is 0. That is, the values at the observation points are different between the reference models and the CDC effect models. Thus, the verifying apparatus 3300 outputs indication that the effect of J3 and J4 are propagated to the output terminal. The form of output includes, for example, display on the display 308, printout at the printer 313, and/or transmission to an external device via the I/F 309. Alternatively, the output may be stored to storage such as the RAM 303, the magnetic disk 305, and the optical disk 307.

The verifying apparatus 3300 outputs the difference between the outputs of the CDC effect models for J3 and J4 and the reference models, and repeats the above processes until the completion of the simulation.

Further, the verifying apparatus 3300 according to the fourth embodiment outputs coverage data and debugging support information.

FIG. 43 is a diagram of an example of the coverage data. Coverage data 4301 describe the site of occurrence and the number of observations. The site of occurrence is the name of a CDC model, and the number of observations is the number of observations at an observation point. Coverage data 4302 describe sites of occurrence, and sites of observation and the number of observations for each site of occurrence. For example, the site of occurrence is the name of a CDC model, the site of observation is an observation point such as an output terminal, and the number of observations is the number of times for which the effect due to CDC jitter output from the CDC model is observed at the site of observation.

Figure 44:
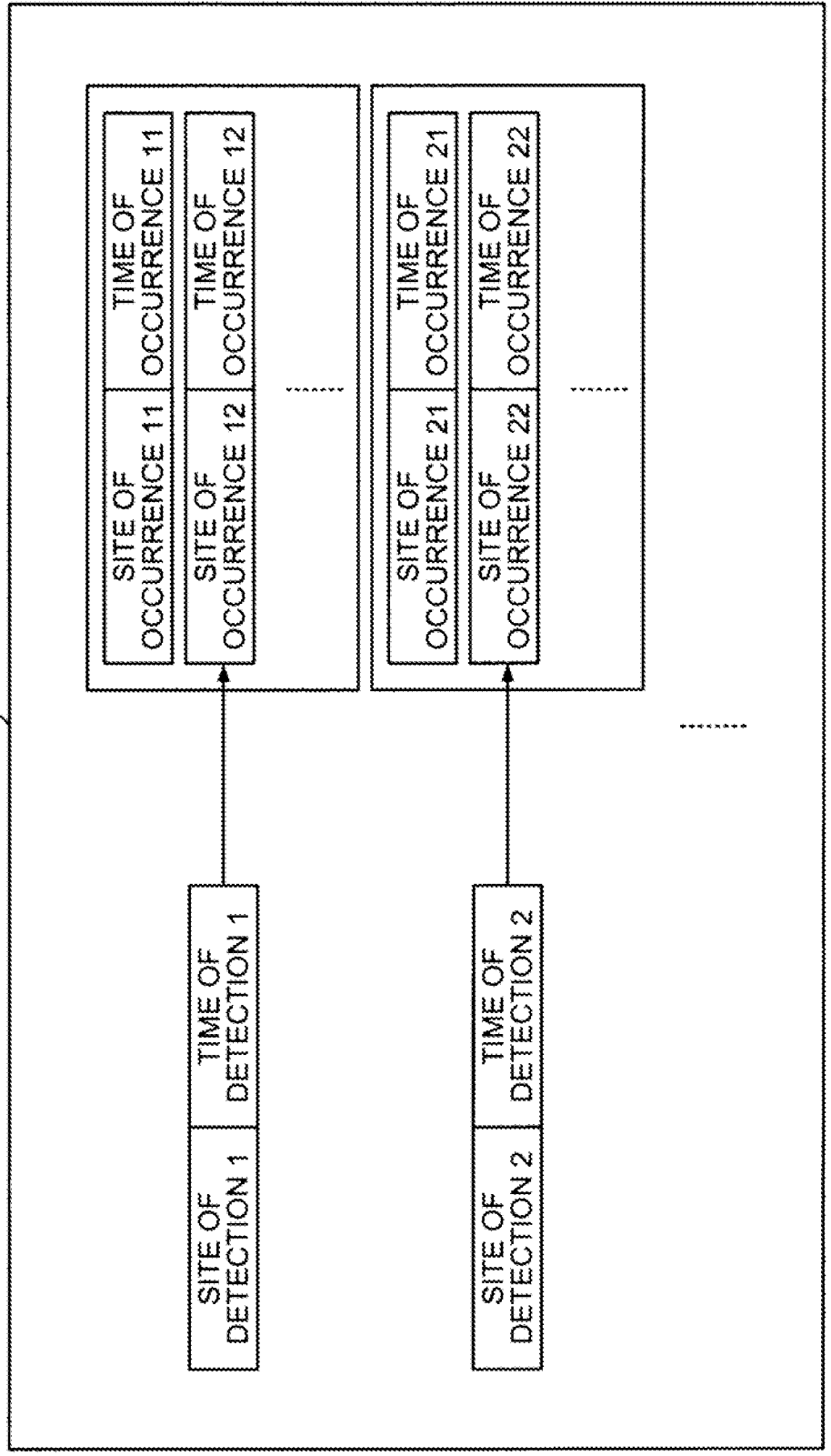
FIG. 44 is a diagram of an example of debugging support information.

FIG. 44 is a diagram of an example of the debugging support information. Debugging support information 4400 describes sites of occurrence and the time of occurrence in association with the site of detection and the time of detection. For example, the site of detection is an observation point such as an output terminal, and the time of detection is the time or the number of clocks from the start of the simulation. The site of occurrence is the name of the CDC jitter, and the time of occurrence is the time or the number of clocks from the start of the simulation at which CDC jitter is generated. In the example of FIGS. 35 to 42, the site of detection is data_out, the time of detection is the eighth clock, the sites of occurrence are J3 and J4, and the time of occurrence is the third clock.

Figure 45:
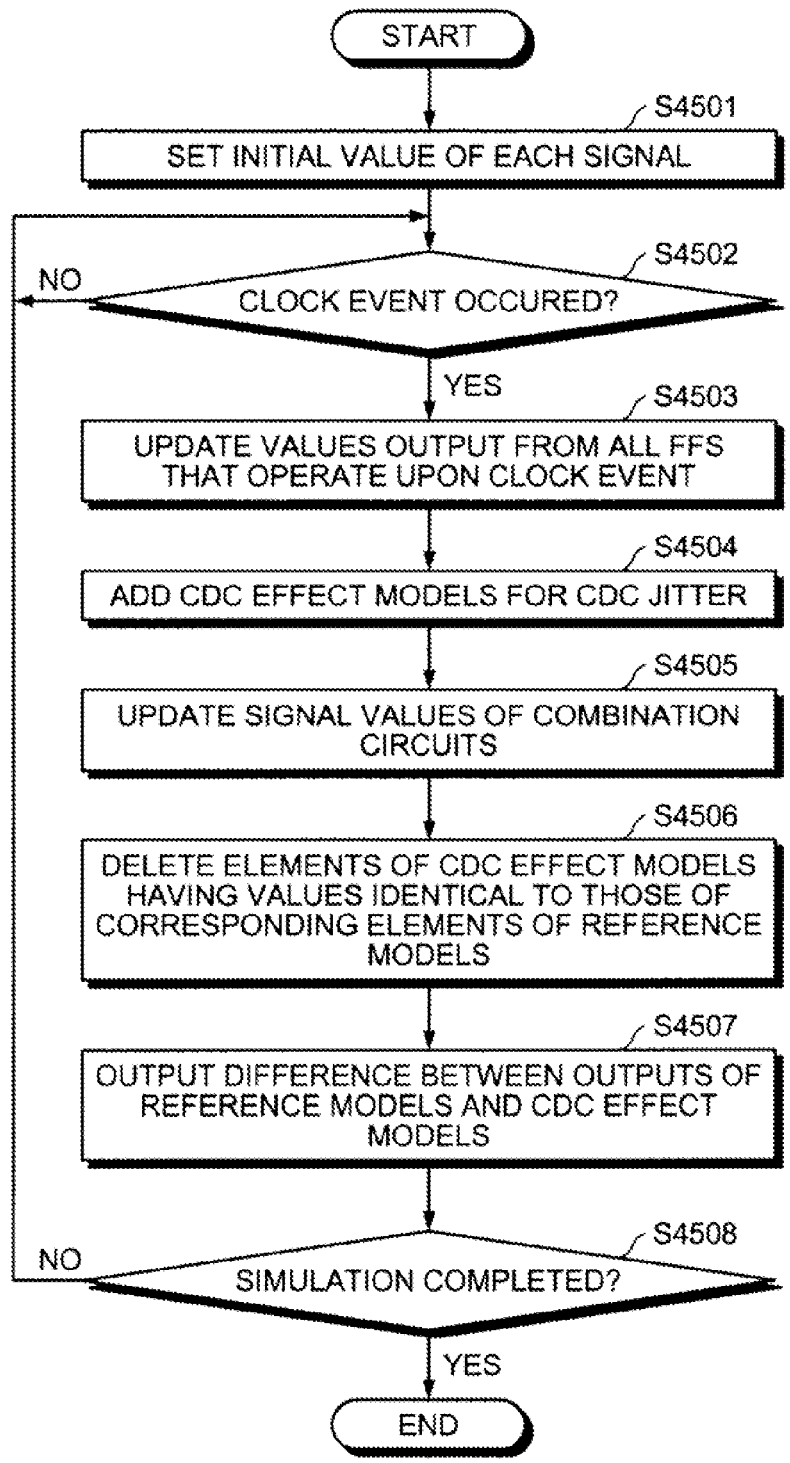
FIG. 45 is a flowchart of another example of the verification process performed by the verifying apparatus.

FIG. 45 is a flowchart of another example of the verification process performed by the verifying apparatus 3300. The verifying apparatus 3300 sets the initial value of each signal (step S4501), and determines whether a clock event occurs (step S4502). The occurrence of a clock event is, for example, a detection of the rise/fall of the clock, if an FF that synchronizes at the rise/fall of the clock is used in the circuit-under-test, respectively.

If the verifying apparatus 3300 determines no clock event has occurred (step S4502: NO), the process returns to step S4502. If the verifying apparatus 3300 determines a clock event has occurred (step S4502: YES), the verifying apparatus 3300 updates the values output from all FFs that operation upon the clock event (step S4503). For example, the value output from an FF becomes 0 if the data input to the FF is 0, and 1 if the data input to the FF is 1.

The verifying apparatus 3300 adds CDC effect models for CDC jitter (step S4504), and updates signal values of the combination circuits (step S4505). The verifying apparatus 3300 deletes elements of the CDC effect models having values identical to those of corresponding elements of the reference models (step S4506). The verifying apparatus 3300 outputs the difference between the outputs of the reference models and the CDC effect models (step S4507), and determines whether the simulation has been completed (step S4508). If not (step S4508: NO), the process returns to step S4502. If the verifying apparatus 3300 determines the simulation has been completed (step S4508: YES), the sequence of processes ends.

Figure 46:
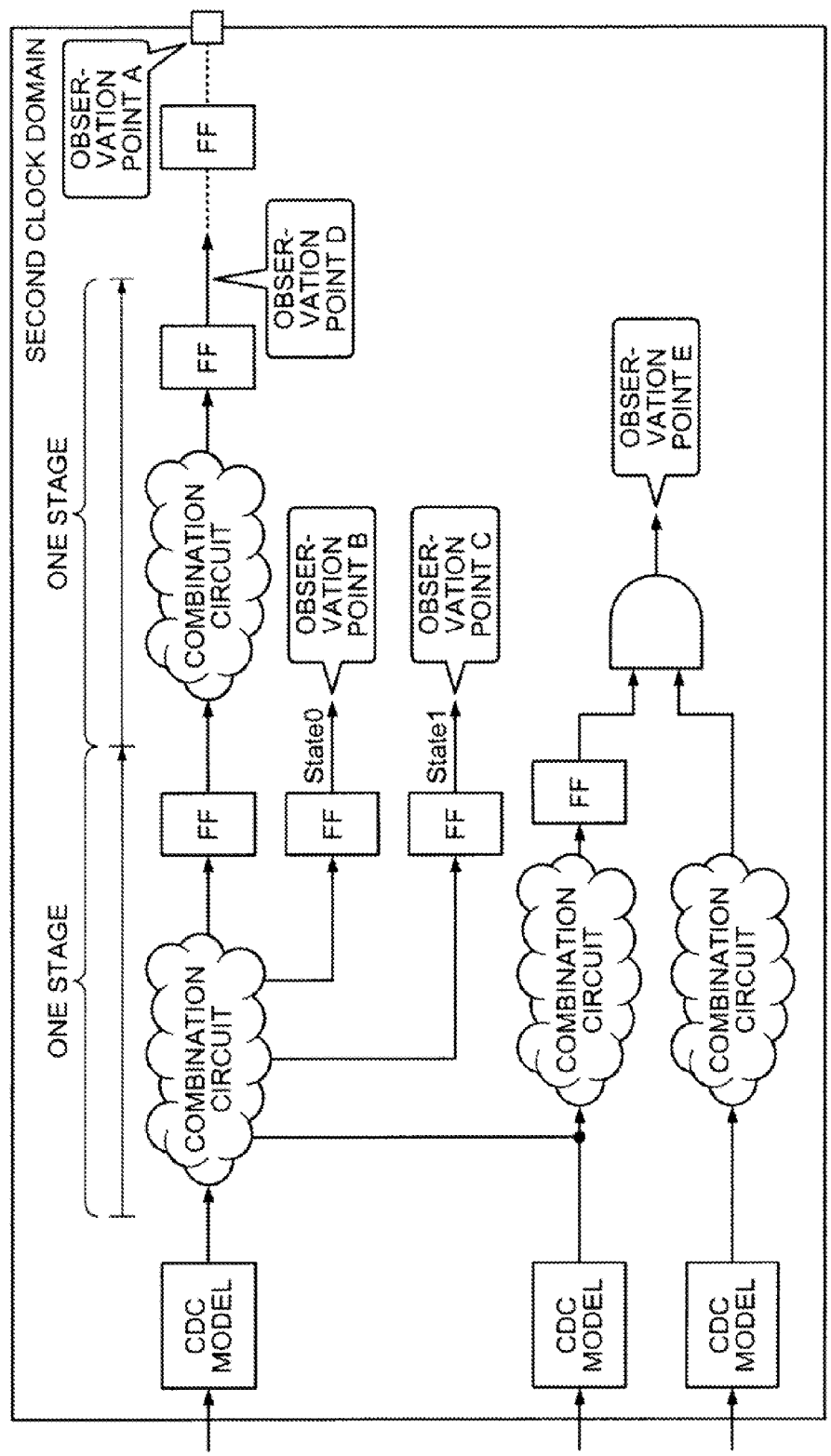
FIG. 46 is a diagram of an example of an observation point.
Figure 47:
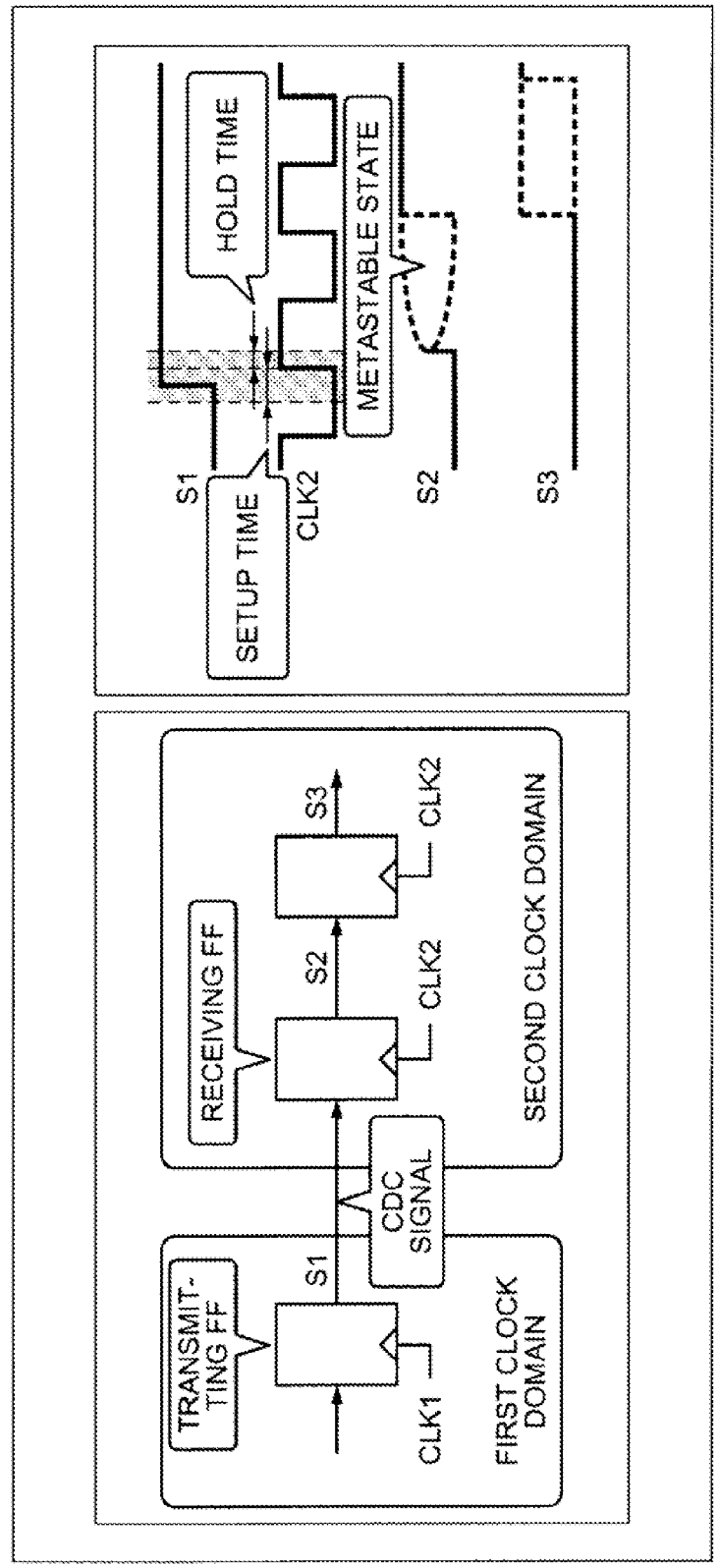
FIG. 47 is a diagram of an example of CDC.
Figure 48:
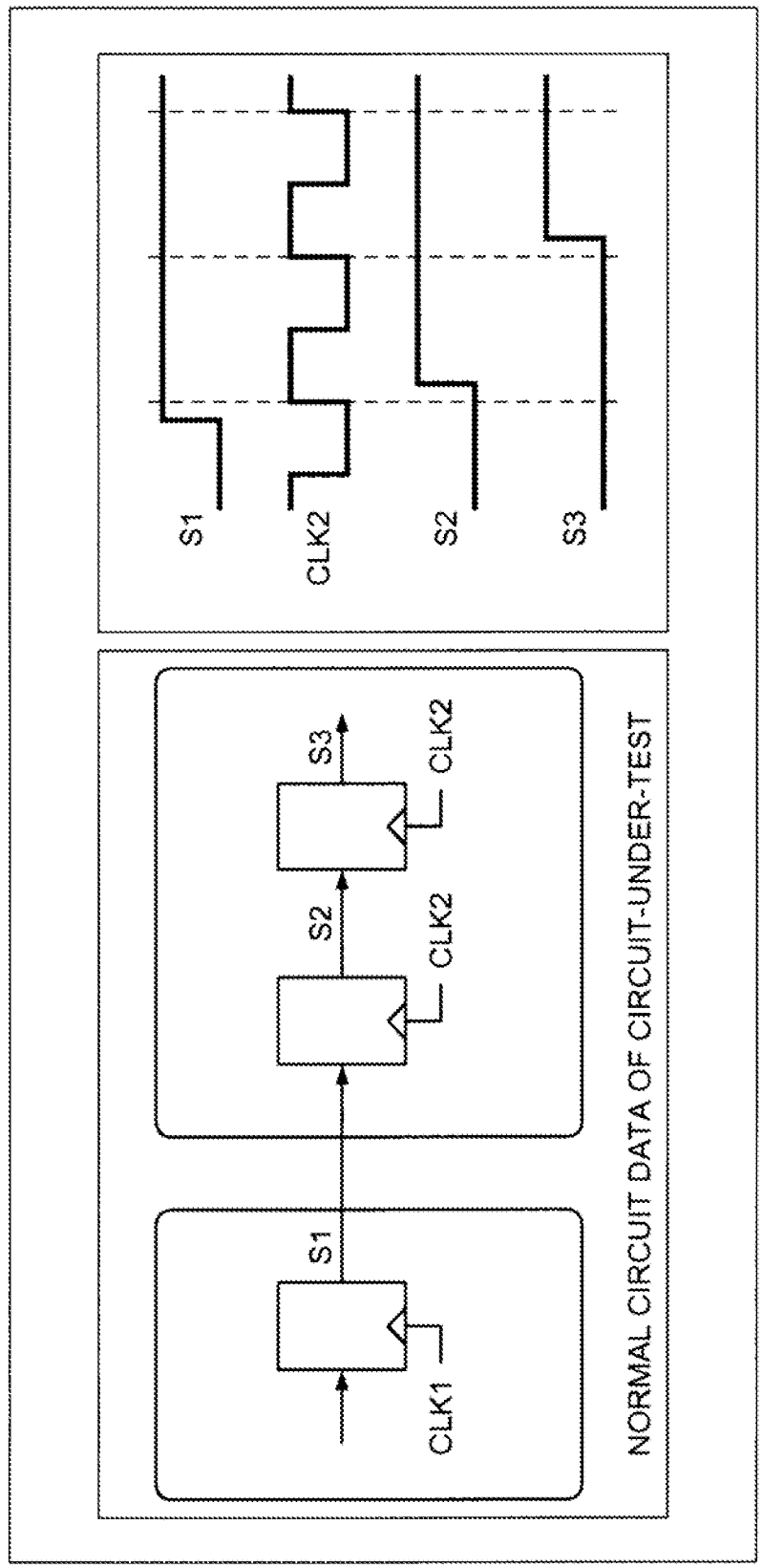
FIG. 48 is a diagram of an example of a result of simulation using a normal FF model.
Figure 49:
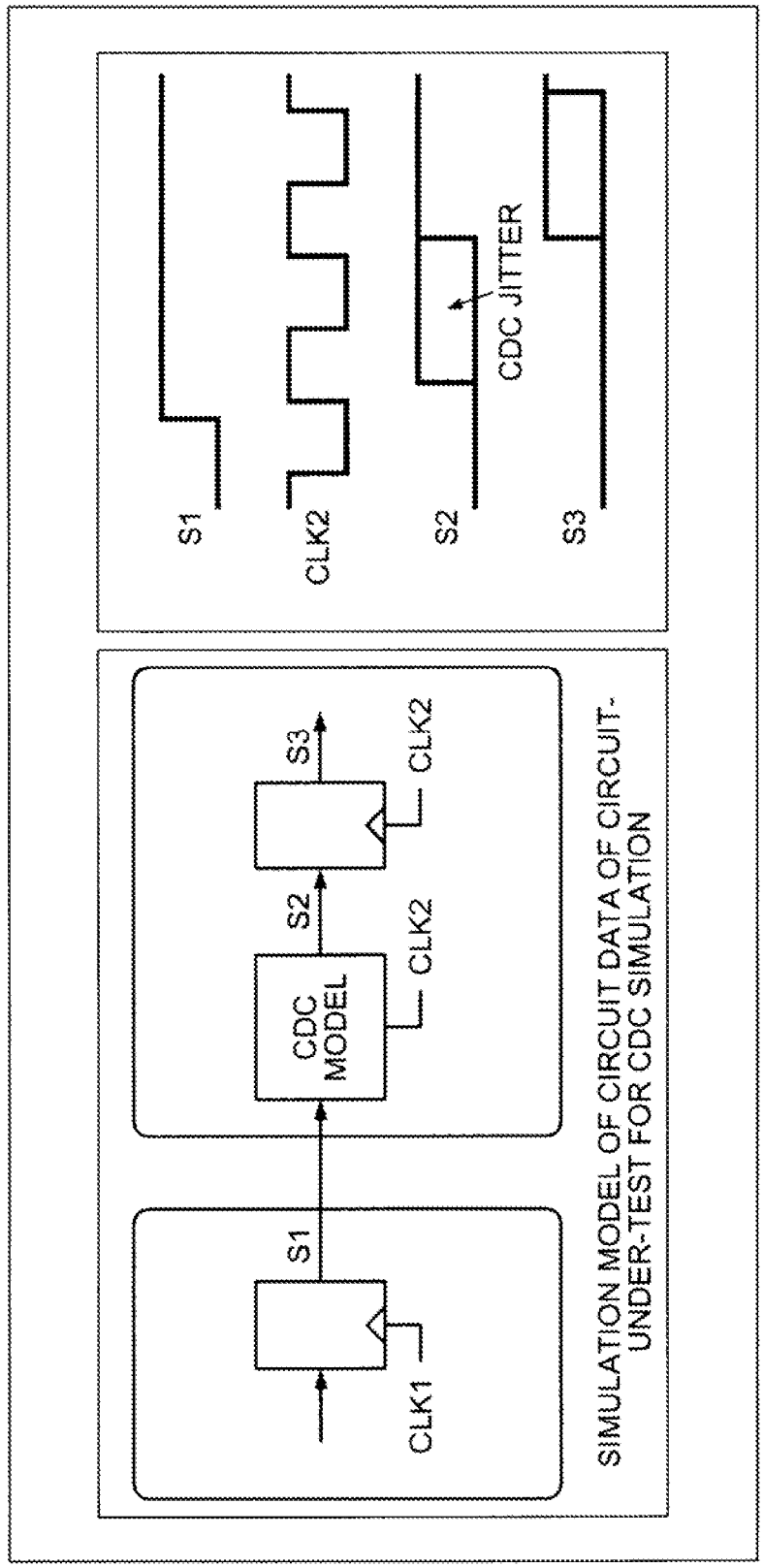
FIG. 49 is a diagram of an example of a result of simulation using a CDC model.
Figure 50:
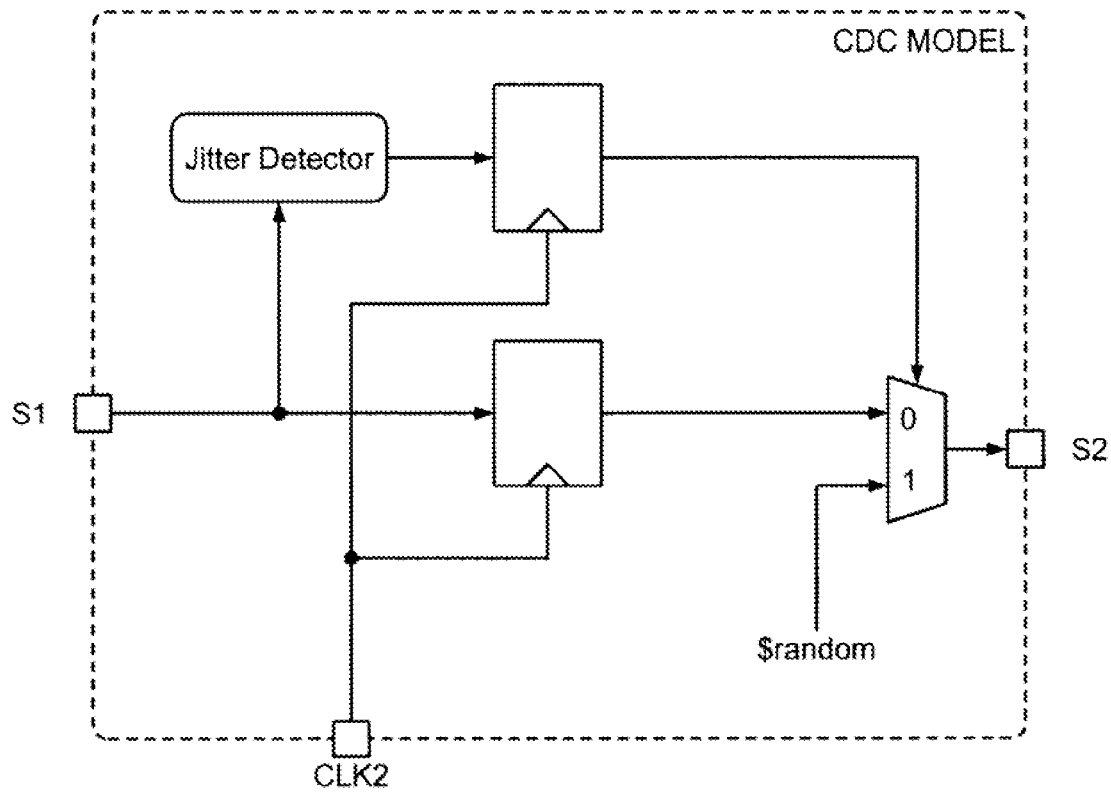
FIG. 50 is a diagram of an example of the CDC model depicted in FIG. 49.
Figure 51:
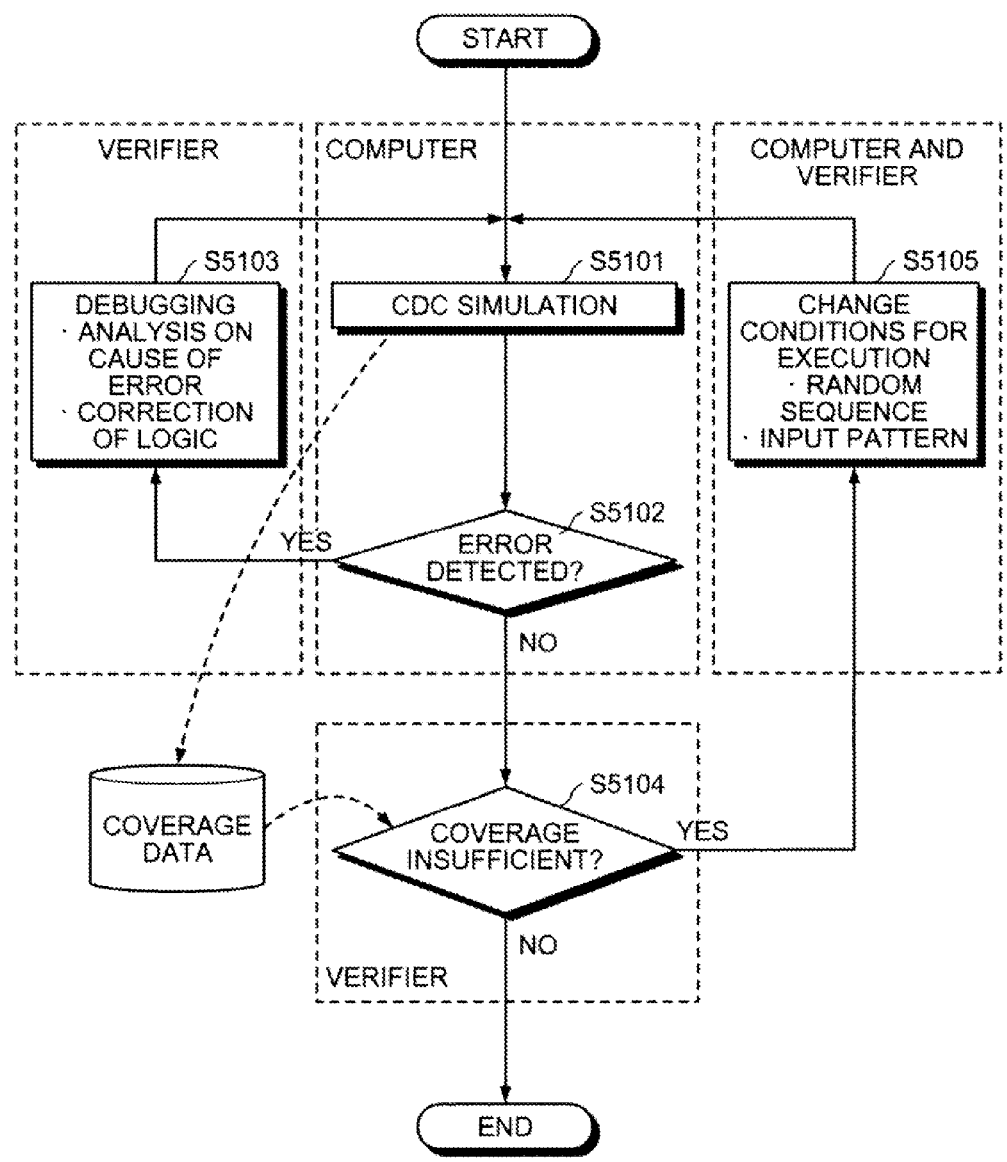
FIG. 51 is a flowchart of CDC verification.

FIG. 46 is a diagram of an example of the observation point. In the first to the fourth embodiments, all observation points are output terminals such as the observation point A. However, the observation point may be other points. For example, the observation points B and C are outputs of FFs indicating the state of the circuit-under-test (State 0 and State 1).

For example, the observation point may be the output of an element downstream of the CDC model. The observation point D is the output of an FF 2 stages downstream of the CDC model, where one stage starts from the output of an FF and ends at a subsequent FF. The observation point may be a point where CDC signals transmitted from the first clock domain to the second clock domain meet. The observation point E is a conjunction of the outputs of 2 CDC models. The observation point may be an assertion where characteristics to be satisfied by the design to be verified are defined.

As described in the first embodiment, according to the verification support apparatus, the verification support program, and the verification support method, a portion of the CDC jitters is set to values different from those indicated by the results of the first simulation, if the first simulation results do not coincide with the expected values. Based on the comparison between the second simulation results at the observation point after the setting and the expected values, it is automatically verified whether the effect of the portion of the CDC jitters is propagated to the observation point, thereby facilitating the identification of the cause of error due to CDC jitter.

The portion of the output values is identified not to be the cause of inconsistency if the result of comparison between the second simulation results at the observation point after the setting and the expected values is identical to the result of comparison between the first simulation results at the observation point and the expected values. Thus, CDC jitter that is not the cause of error can be easily determined.

The portion of the CDC jitters is identified to include the cause of inconsistency if the simulation results at the observation point after the setting are identical to the expected values. Even though there are actually thousands or 10 thousands of CDC jitters, only several CDC jitters are the cause of error. Thus, thousands or 10 thousands of CDC jitters are divided into groups, for each of which it is determined whether to include the cause of inconsistency, thereby reducing the time required for verification.

An arbitrary CDC jitters is set to a value different from that resulting at the first simulation, and if the second simulation results at the observation point after the setting are determined to coincide with the expected values as a result of comparison, the arbitrary CDC jitter is identified to be the cause of inconsistency. Thus, the cause of inconsistency can be correctly identified, and the time required for verification can be reduced.

As described in the second embodiment, according to the verification support apparatus, the verification support program, and the verification support method, a portion of the CDC jitters is set to values different from those indicated by the results of the first simulation. Based on whether the second simulation results at the observation point after the setting coincide with the first simulation results at the observation point, it is determined whether the effect of the portion of the CDC jitters is propagated to the observation point for each input pattern. Thus, the effect of CDC jitter for each input pattern can be easily identified, and whether each CDC jitter is verified for the input pattern can be easily determined.

The effect of the portion of the CDC jitters is identified not to be propagated if the second simulation results at the observation point after the setting are determined to coincide with the first simulation results. Thus, it is easily determined that the portion of the CDC jitters is not verified for a given input pattern.

The portion of the CDC jitters is identified to include CDC jitter whose the effect is propagated, if the second simulation results at the observation point after the setting are determined not to coincide with the first simulation results. Thus, thousands or 10 thousands of CDC jitters are divided into groups for each of which it is determined whether to include CDC jitter whose effect is propagated. Thus, it can be determined which of the CDC jitters can be verified by a given input pattern, and the time required for verification can be reduced.

An arbitrary CDC jitter is set to a logic value different from that resulting at the first simulation. The effect of the arbitrary CDC jitter is identified to be propagated to the observation point, if the second simulation results at the observation point after the setting are determined not to coincide with the first simulation results.

An arbitrary CDC jitter is selected successively. For each of the selected CDC jitters, the logic value thereof is set to a logic value different from that resulting at the first simulation. For each of the selected CDC jitters, the effect of the selected CDC jitter is identified to be propagated to the observation point, if the second simulation results at the observation point after the setting are determined not to coincide with the first simulation results. Thus, whether the effect is propagated can be identified for all CDC jitters.

As described in the third embodiment, according to the verification support apparatus, the verification support program, and the verification support method, an arbitrary CDC jitter is selected successively. For each of the selected CDC jitters, only the CDC jitter(s) selected from among the CDC jitters that are set to logic values different from those indicated by the results of the first simulation, are set to a different logic value. For each of the selected CDC jitters, the effect of the selected output value is identified to be propagated to the observation point, if the second simulation results at the observation point after the setting are determined not to coincide with the first simulation results.

The cause of error in a CDC simulation for a given input pattern is about 2 or 3 among all of the entire CDC jitters. It is not clear which CDC jitter among thousands or 10 thousands of CDC jitters causes the error. By simulating the execution patterns of the third embodiment in addition to those of the second embodiment, combinations of the logic values of 3 CDC jitters can be always verified for any of 3 CDC jitters selected by a verifier. Thus, the time required for verification can be reduced.

Since the observation point is the output terminal of the circuit-under-test as described in the first to the third embodiments, it can be identified whether the effect of CDC jitter is propagated to a point farthest from the CDC point.

The observation point is the output of an element indicating the state of the circuit-under-test. That is, the observation point is the state variable that is an important variable indicating the state of the circuit-under-test. If the effect of CDC jitter is propagated to the state variable, the effect is likely to be propagated to circuits downstream of the state variable, and may be propagated to the output terminal. Thus, the amount of calculation and the time required for verification can be reduced by identifying whether the CDC jitter is the cause of error when the effect of CDC jitter is observed at the state variable.

The observation point is a conjunction where signals asynchronously transmitted from the first clock domain to the second clock domain meet. The conjunction of the signals is a reconvergence point. Many CDC failures are caused by an error in the design of the reconvergence point. Thus, the determination can be made at a circuit close to the CDC model, and the amount of calculation can be reduced.

The observation point is the output of an element downstream of an element. In many cases, the effect of CDC jitter disappears at a circuit close to the CDC model. Thus, by setting the observation point at a circuit within a given number of stages from the CDC model, the determination can be made at a circuit close to the CDC model and the amount of calculation can be reduced.

The observation point is an assertion. Appropriate coverage can be obtained since the assertion can be regarded equivalent to the output terminal. The coverage is likely to be determined at a point closer to each CDC point due to an increased number of points where the coverage is determined. The simulation may be terminated after the coverage determination, thereby reducing the amount of calculation.

As described in the fourth embodiment, according to the verifying apparatus, the verifying program, and the verifying method, when a CDC jitter is detected during a CDC simulation, a logic value different from that of the detected CDC jitter is provided to elements downstream of the element that outputs the CDC jitter. A concurrent simulation is executed in which only the difference from the simulation results of a CDC simulation is simulated, thereby reducing the amount of calculation. The time required for verification can be also reduced since simulation results for different logic values of CDC jitters can be obtained.

The verification support method and the verifying method described in the first to the fourth embodiments may be implemented by executing a prepared program on a computer such as a personal computer and a workstation. The programs are stored on a computer-readable medium such as a hard disk, a flexible disk, a CD-ROM, an MO, and a DVD, read out from the recording medium, and executed by the computer. The program may be distributed through a network such as the Internet. However, the computer-readable medium does not include a transitory medium such as a propagation signal.

According to the verification support apparatus, the verification support program, and the verification support method, the cause of error due to CDC jitter can be easily identified. According to the verifying apparatus, the verifying program, and the verifying method, the time consumed for verification can be reduced by reduction of the number of simulations.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A verification support apparatus comprising:
a detecting unit that detects an inconsistency between a simulation result at an observation point in a circuit-under-test and an expected value, wherein the simulation result is a result of a simulation in which a given input pattern is provided to circuit data of the circuit-under-test that includes a first clock domain and a second clock domain that receives a signal from the first clock domain asynchronously;
a setting unit that sets a portion of output values to logic values different from those of the simulation result when the detecting unit detects the inconsistency, wherein the output values are random values output from elements that receive the signal in the second clock domain;
a comparing unit that compares the expected value and a simulation result at the observation point after the setting by the setting unit; and
an identifying unit that identifies whether the portion of the output values are a cause of the inconsistency, based on a result of comparison by the comparing unit.

2. The verification support apparatus according to claim 1, wherein the identifying unit identifies that the portion of the output values is not the cause of the inconsistency if a result of comparison by the comparing unit between the simulation result at the observation point after the setting and the expected value is identical to a result of comparison between the simulation result at the observation point and the expected value.

3. The verification support apparatus according to claim 1, wherein the identifying unit identifies that the portion of the output values includes the cause of the inconsistency, if the simulation result at the observation point after the setting by the comparing unit is identical to the expected value.

4. The verification support apparatus according to claim 1, wherein the setting unit sets an arbitrary output value among the output values, to a logic value different from that of the simulation result, the comparing unit compares the expected value and the simulation result at the observation point after the setting by the setting unit, and the identifying unit identifies that the arbitrary output value is the cause of the inconsistency, if the comparing unit determines that the simulation result at the observation point after the setting coincides with the expected value.

5. The verification support apparatus according to claim 1, wherein the observation point is an output terminal of the circuit-under-test.

6. The verification support apparatus according to claim 1, wherein the observation point is an output of an element indicating a state of the circuit-under-test.

7. The verification support apparatus according to claim 1, wherein the observation point is a conjunction of signals transmitted from the first clock domain to the second clock domain asynchronously.

8. The verification support apparatus according to claim 1, wherein the observation point is an output of an element downstream of the elements.

9. The verification support apparatus according to claim 1, wherein the observation point is an assertion.

10. A verification support apparatus comprising:

an acquiring unit that acquires a simulation result of a simulation in which a given input pattern is provided to circuit data of a circuit-under-test that includes a first clock domain and a second clock domain that receives a signal from the first clock domain asynchronously;

a setting unit that sets a portion of output values to logic values different from those of the simulation result acquired by the acquiring unit, wherein the output values are random values output from elements that receive the signal in the second clock domain;

a comparing unit that compares a simulation result at an observation point in the circuit-under-test after the setting by the setting unit and a simulation result at the observation point;

an identifying unit that identifies whether an effect of the portion of the output values is propagated to the observation point, based on a result of comparison by the comparing unit; and a selecting unit that selects each of the output values sequentially, wherein the setting unit, each time the selecting unit selects one of the output values, sets only the selected the output value to a logic value different from that of the simulation result, the comparing unit compares a simulation result for output values that are set to logic values different from those of the simulation result and the simulation result after the setting by the setting unit, and the identifying unit identifies that the effect of the selected output value is propagated to the observation point, if the comparing unit determines that the simulation result at the observation point for output values that are set to logic values different from those of the simulation result does not coincide with the simulation result at the observation point after the setting.

11. The verification support apparatus according to claim 10, wherein the identifying unit identifies that the effect of the portion of the output values is not propagated, if the comparing unit determines that the simulation result at the observation point after the setting coincides with the simulation result at the observation point.

12. The verification support apparatus according to claim 10, wherein the identifying unit identifies that the portion of the output values includes an output value having an effect that is propagated to the observation point, if the comparing unit determines that the simulation result at the observation point after the setting does not coincide with the simulation result at the observation point.

13. The verification support apparatus according to claim 10, wherein the setting unit sets an arbitrary output value among the output values, to a logic value different from that of the simulation result, the comparing unit compares the simulation result and the simulation result after the setting by the setting unit, and the identifying unit identifies that the effect of the arbitrary output value is propagated to the observation point, if the comparing unit determines that the simulation result at the observation point after the setting does not coincide with the simulation result at the observation point.

14. The verification support apparatus according to claim 10, wherein the observation point is an output terminal of the circuit-under-test.

15. The verification support apparatus according to claim 10, wherein the observation point is an output of an element indicating a state of the circuit-under-test.

16. The verification support apparatus according to claim 10, wherein the observation point is a conjunction of signals transmitted from the first clock domain to the second clock domain asynchronously.

17. The verification support apparatus according to claim 10, wherein the observation point is an output of an element downstream of the elements.

18. The verification support apparatus according to claim 10, wherein the observation point is an assertion.

19. A computer-readable, non-transitory medium storing therein a verification support program that causes a computer to execute a process comprising:

acquiring a simulation result of a simulation in which a given input pattern is provided to circuit data of a circuit-under-test that includes a first clock domain and a second clock domain that receives a signal from the first clock domain asynchronously;

setting a portion of output values to logic values different from those of the acquired simulation result, wherein the output values are random values output from elements that receive the signal in the second clock domain;

comparing a simulation result at an observation point in the circuit-under-test after the setting and a simulation result at the observation point;

identifying whether an effect of the portion of the output values is propagated to the observation point based on a result of comparison; and selecting each of the output values sequentially, wherein at the setting, each time the selecting unit selects one of the output values, only the selected the output value is set to a logic value different from that of the simulation result, at the comparing, a simulation result for output values that are set to logic values different from those of the simulation result is compared with the simulation result after the setting by the setting unit, and at the identifying, it is identified that the effect of the selected output value is propagated to the observation point, if it is determined at the comparing that the simulation result at the observation point for output values that are set to logic values different from those of the simulation result does not coincide with the simulation result at the observation point after the setting.

20. A verification support method comprising:
acquiring, using a processor, a simulation result of a simulation in which a given input pattern is provided to circuit data of a circuit-under-test that includes a first clock domain and a second clock domain that receives a signal from the first clock domain asynchronously;
setting, using a processor, a portion of output values to logic values different from those of the acquired simulation result, wherein the output values are random values output from elements that receive the signal in the second clock domain;
comparing, using a processor, a simulation result at an observation point in the circuit-under-test after the setting and a simulation result at the observation point; and
identifying, using a processor, whether an effect of the portion of the output values is propagated to the observation point based on a result of comparison
selecting each of the output values sequentially,
wherein
at the setting, each time the selecting unit selects one of the output values, only the selected the output value is set to a logic value different from that of the simulation result,
at the comparing, a simulation result for output values that are set to logic values different from those of the simulation result is compared with the simulation result after the setting by the setting unit, and
at the identifying, it is identified that the effect of the selected output value is propagated to the observation point, if it is determined at the comparing that the simulation result at the observation point for output values that are set to logic values different from those of the simulation result does not coincide with the simulation result at the observation point after the setting.

\* \* \* \* \*